United States Patent
Chen et al.

(10) Patent No.: US 12,394,696 B2
(45) Date of Patent: Aug. 19, 2025

(54) PACKAGE STRUCTURE INCLUDING AN ARRAY OF COPPER PILLARS AND METHODS OF FORMING THE SAME

(71) Applicant: Taiwan Semiconductor Manufacturing Company Limited, Hsinchu (TW)

(72) Inventors: Wei-Yu Chen, Hsinchu (TW); Collin Jordon Fleshman, Hsinchu (TW); Chien-Hsun Lee, Chu-tung Town (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 552 days.

(21) Appl. No.: 17/737,298

(22) Filed: May 5, 2022

(65) Prior Publication Data

US 2023/0307330 A1 Sep. 28, 2023

Related U.S. Application Data

(60) Provisional application No. 63/322,873, filed on Mar. 23, 2022.

(51) Int. Cl.
| | |
|---|---|
| *H01L 23/48* | (2006.01) |
| *H01L 21/48* | (2006.01) |
| *H01L 23/00* | (2006.01) |
| *H01L 23/31* | (2006.01) |
| *H01L 23/498* | (2006.01) |

(Continued)

(52) U.S. Cl.
CPC .... *H01L 23/49811* (2013.01); *H01L 21/4853* (2013.01); *H01L 23/3107* (2013.01); *H01L 23/49833* (2013.01); *H01L 23/49838* (2013.01); *H01L 23/5385* (2013.01); *H01L 24/16* (2013.01); *H01L 24/96* (2013.01); *H01L 25/18* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 9,006,030 B1* | 4/2015 | Kwon | H01L 23/3128 438/126 |
| 11,387,177 B2* | 7/2022 | Chien | H01L 21/565 |

(Continued)

FOREIGN PATENT DOCUMENTS

TW 202249227 A 12/2022

OTHER PUBLICATIONS

Taiwan Patent and Trademark Office; Jianq Chyun Intellectual Property Office; TW application No. 112100863; Office Action dated Dec. 14, 2023; 12 pages.

*Primary Examiner* — Nicholas J Tobergte
(74) *Attorney, Agent, or Firm* — The Marbury Law Group, PLLC

(57) ABSTRACT

An in-process structure including an interposer is provided. The interposer includes first interposer bonding pads. An array of copper pillar structures is bonded to the first interposer bonding pads using interposer-side solder material portions. A packaging substrate is attached to the array of copper pillar structures by bonding the array of copper pillar structures to substrate bonding pads located on the packaging substrate using substrate-side solder material portions.

20 Claims, 54 Drawing Sheets

(51) Int. Cl.
*H01L 23/538* (2006.01)
*H01L 25/18* (2023.01)

(56) References Cited

U.S. PATENT DOCUMENTS

| | | | |
|---|---|---|---|
| 2009/0072385 A1* | 3/2009 | Alley | H01L 24/17 |
| | | | 257/713 |
| 2010/0078789 A1* | 4/2010 | Choi | H01L 21/6835 |
| | | | 257/E21.511 |
| 2013/0082364 A1* | 4/2013 | Wang | H01L 25/0655 |
| | | | 257/659 |
| 2014/0167234 A1* | 6/2014 | Hurwitz | H01L 23/49827 |
| | | | 257/668 |
| 2015/0137342 A1* | 5/2015 | Sutardja | H01L 23/49822 |
| | | | 257/692 |
| 2016/0126161 A1* | 5/2016 | Fang | H01L 23/5386 |
| | | | 257/741 |
| 2016/0336292 A1* | 11/2016 | Tian | H01L 24/75 |
| 2019/0393145 A1* | 12/2019 | Pietambaram | H01L 24/80 |
| 2020/0035590 A1* | 1/2020 | Tsai | H01L 23/3128 |
| 2020/0212006 A1* | 7/2020 | Chang | H01L 25/50 |
| 2020/0395281 A1* | 12/2020 | Chien | H01L 23/49822 |
| 2022/0059437 A1 | 2/2022 | Kim et al. | |

* cited by examiner

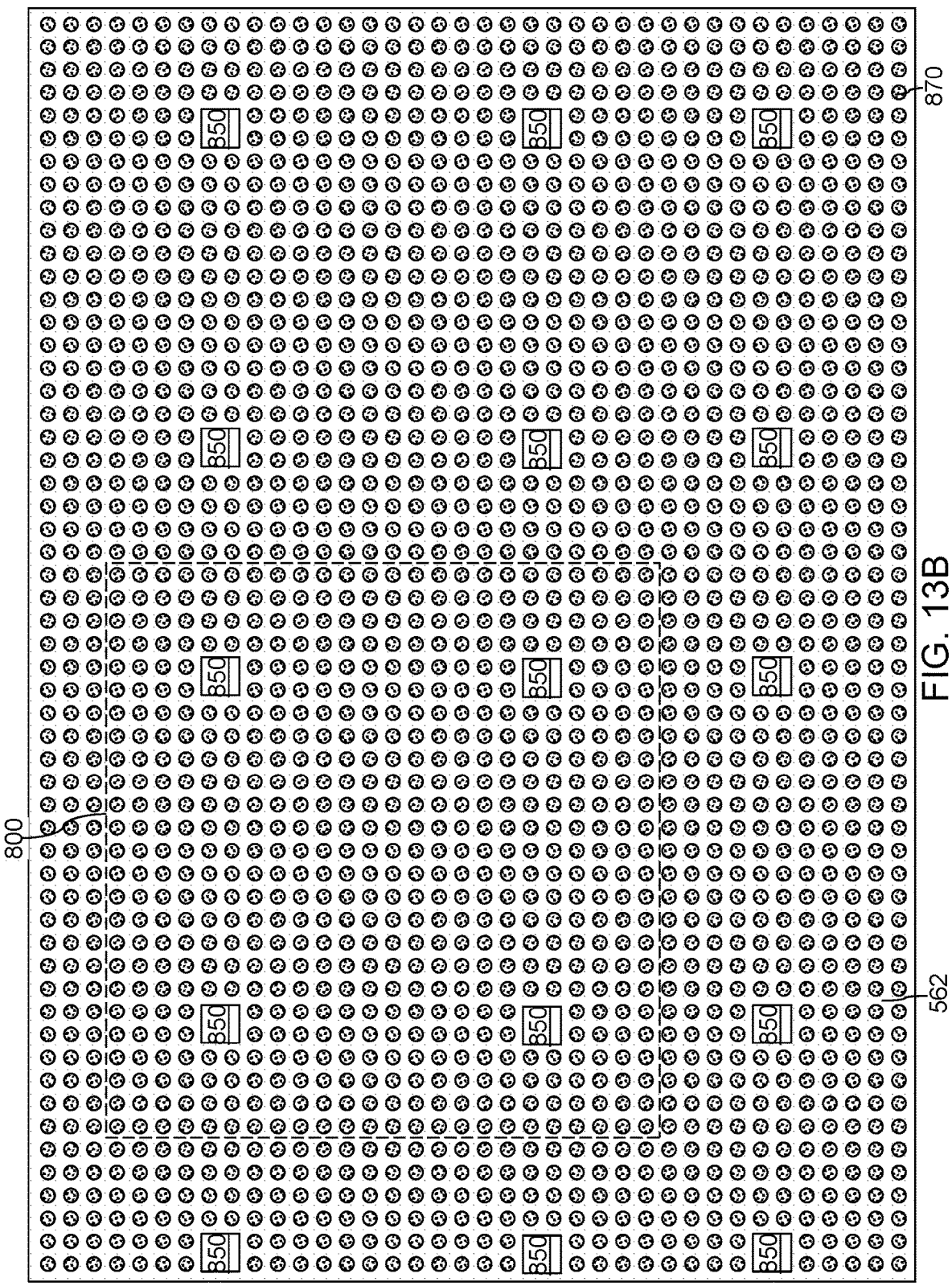

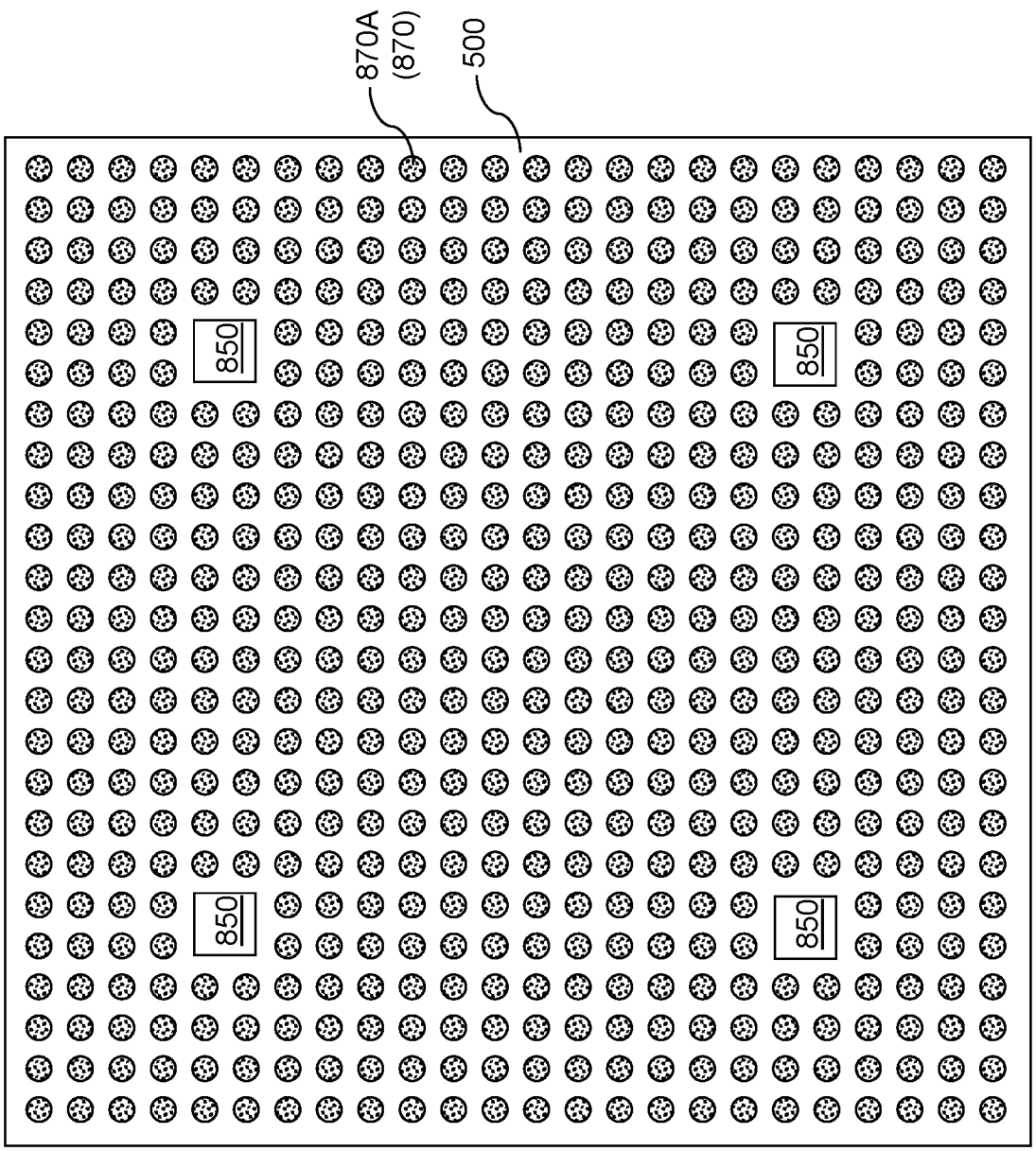

PACKAGE STRUCTURE INCLUDING AN ARRAY OF COPPER PILLARS AND METHODS OF FORMING THE SAME

RELATED APPLICATIONS

This application claims the benefit of priority from U.S. Provisional Patent Application No. 63/322,873 entitled "New scheme for multi-component embedment in CoWoS-LSC and -SCS" filed on Mar. 23, 2022, the entire contents of which are incorporated herein by reference for all purposes.

BACKGROUND

The height of surface mount dies that are bonded to a side of an interposer facing a packaging substrate is limited by the vertical dimensions of solder material portions in related package structures. Thus, thinning of such surface mount dies may be desired to provide mounting on the side of the interposer facing the packaging substrate. The process yield may be depressed, and the manufacturing cost may go up due to the limitation on the height of such surface mount dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13B is a top-down view of the first exemplary structure of FIG. 13A.

FIG. 14B is a top-down view of the unit area of the first exemplary structure of FIG. 14A.

DETAILED DESCRIPTION

Figure 1:
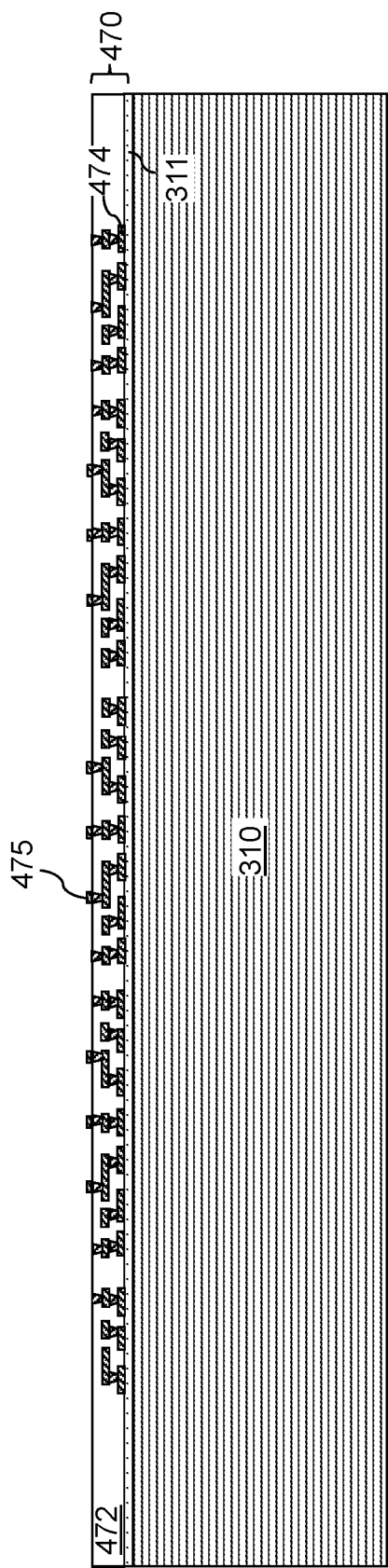
FIG. 1 is a vertical cross-sectional view of a first exemplary structure after formation of die-side redistribution structures over a first carrier substrate according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor devices, and particularly to a package structure using an array of copper pillar structures between an interposer and a packaging substrate. One end of each copper pillar structure may be bonded to interposer bonding pads on the interposer through interposer-side solder material portions, and another end of each copper pillar structure may be bonded to substrate bonding pads on the packaging substrate through substrate-side solder material portions. Use of the copper pillar structures increases a vertical spacing between the interposer and the packaging substrate, and provides attachment of thick surface mount dies within the gap between the interposer and the packaging substrate. The thickness of the surface mount dies may be greater than the size of solder balls used related structures to bond an interposer to a packaging substrate. Various embodiment structures and methods disclosed herein provide attachment of thick surface mount dies on the backside of an interposer within a gap between the interposer and a packaging substrate. Various aspects of embodiments of the present disclosure are now described with reference to accompanying figures.

Referring to FIG. 1, a first exemplary structure according to an embodiment of the present disclosure is illustrated. The first exemplary structure includes a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

A two-dimensional array of die-side redistribution structures 470 may be formed over the first carrier substrate 310. Specifically, a die-side redistribution structure 470 may be formed within each unit area of repetition, which corresponds to the area of an interposer to be individually diced. Semiconductor dies may be subsequently attached to the die-side redistribution structures 470, and thus, the redistribution structures formed at this processing step are referred to as die-side redistribution structures 470. While FIG. 1 illustrates a region within a unit area, repetition of the structure illustrated in FIG. 1 in two horizontal directions during manufacturing is understood.

Each die-side redistribution structure 470 may include die-side redistribution dielectric layers 472, die-side redistribution wiring interconnects 474, and microbump structures 475 (i.e., bump structures to be used to contact local silicon interconnect bridges from the die side). The die-side redistribution dielectric layers 472 include a respective dielectric polymer material such as polyimide (PI), benzocyclobutene (BCB), or polybenzobisoxazole (PBO). Each die-side redistribution dielectric layer 472 may be formed by spin coating and drying of the respective dielectric polymer material. The thickness of each die-side redistribution dielectric layer 472 may be in a range from 2 microns to 40 microns, such as from 4 microns to 20 microns. Each die-side redistribution dielectric layer 472 may be patterned, for example, by applying and patterning a respective photoresist layer thereabove, and by transferring the pattern in the photoresist layer into the die-side redistribution dielectric layer 472 using an etch process such as an anisotropic etch process. The photoresist layer may be subsequently removed, for example, by ashing.

Each of the die-side redistribution wiring interconnects 474 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 474 may include copper, nickel, or copper and nickel. The thickness of the metallic fill material that is deposited for each die-side redistribution wiring interconnect 474 may be in a range from 2 microns to 40 microns, such as from 4 microns to 10 microns, although lesser or greater thicknesses may also be used. The total number of levels of wiring in each die-side redistribution structure 470 (i.e., the levels of the die-side redistribution wiring interconnects 474) may be in a range from 1 to 10.

The microbump structures 475 are bump structures that may be subsequently used to electrically connect local silicon interconnect bridges to be subsequently bonded to a respective one of the die-side redistribution structures 470. The metallic fill material for the microbump structures 475 may include copper. The microbump structures 475 may have horizontal cross-sectional shapes of rectangles, rounded rectangles, or circles. Other horizontal cross-sectional shapes may be within the contemplated scope of disclosure. Typically, the microbump structures 475 may be configured for microbump bonding (i.e., C2 bonding), and may have a thickness in a range from 30 microns to 100 microns, although lesser or greater thicknesses may also be used. In one embodiment, the microbump structures 475 may be formed as an array of microbumps (such as copper pillars) having a lateral dimension in a range from 10 microns to 25 microns, and having a pitch in a range from 20 microns to 50 microns.

Figure 2:
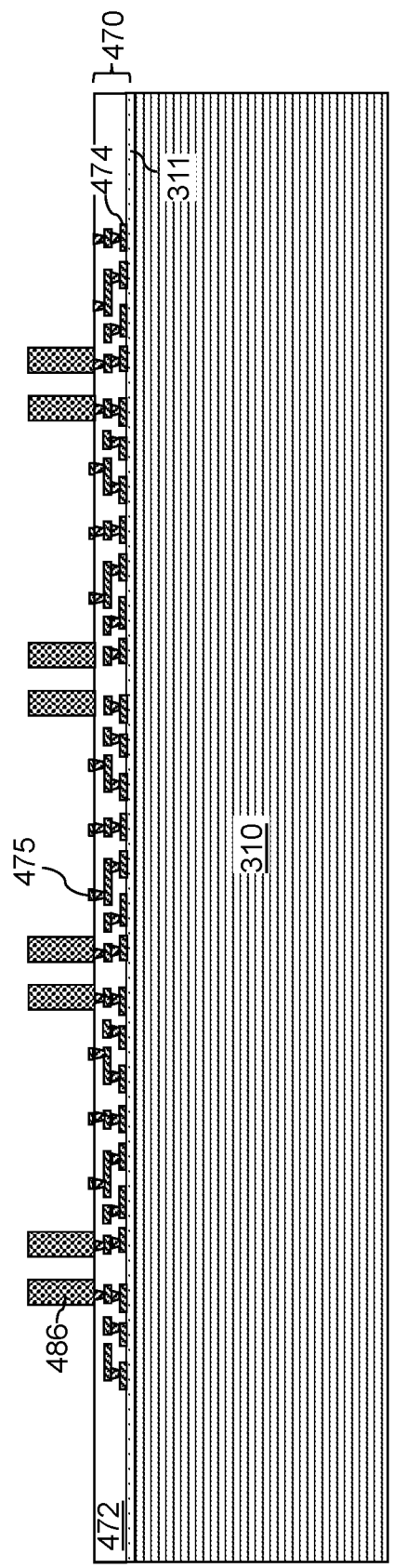
FIG. 2 is a vertical cross-sectional view of the first exemplary structure after formation of through-integrated-fan-out-via structures (TIV structures) according to the first embodiment of the present disclosure.

Referring to FIG. 2, a sacrificial matrix material layer (not shown) may be applied over the die-side redistribution structures 470, and cylindrical cavities may be formed through the sacrificial matrix material layer. The sacrificial matrix material layer may comprise a polymer material such as polyimide. The pattern of the cylindrical cavities may be arranged around regions in which the local silicon interconnect (LSI) bridges are to be subsequently placed. As such, the cylindrical cavities may be formed around regions including a respective array of microbump structures 475. Generally, the pattern of the cylindrical cavities may be a periodic pattern that is arranged as a two-dimensional periodic array such as a rectangular array. Each unit pattern within the periodic pattern may have the same area as the area of an interposer to be manufactured. In other words, a two-dimensional array of interposers may be formed by performing subsequent processing patterns. As such, a unit area that corresponds to the area of a single interposer includes a unit pattern for the cylindrical cavities.

At least one conductive material such as at least one metallic material (such as W, Mo, Ta, Ti, WN, TaN, TiN, etc.) may be deposited in the cylindrical cavities, and excess portions of the at least one conductive material may be removed from above the horizontal plane including the top surface of the sacrificial matrix material layer. Remaining portions of the at least one conductive material comprise through-integrated-fan-out-via structures 486, which are also referred to through-InFO-via structures 486 or TIV structures 486. The sacrificial matrix material layer may be subsequently removed, for example, by dissolving in a solvent or by ashing. A plurality of local silicon interconnect bridges (LSI bridges) can be subsequently boned to the die-side redistribution structures 470.

Figure 3:
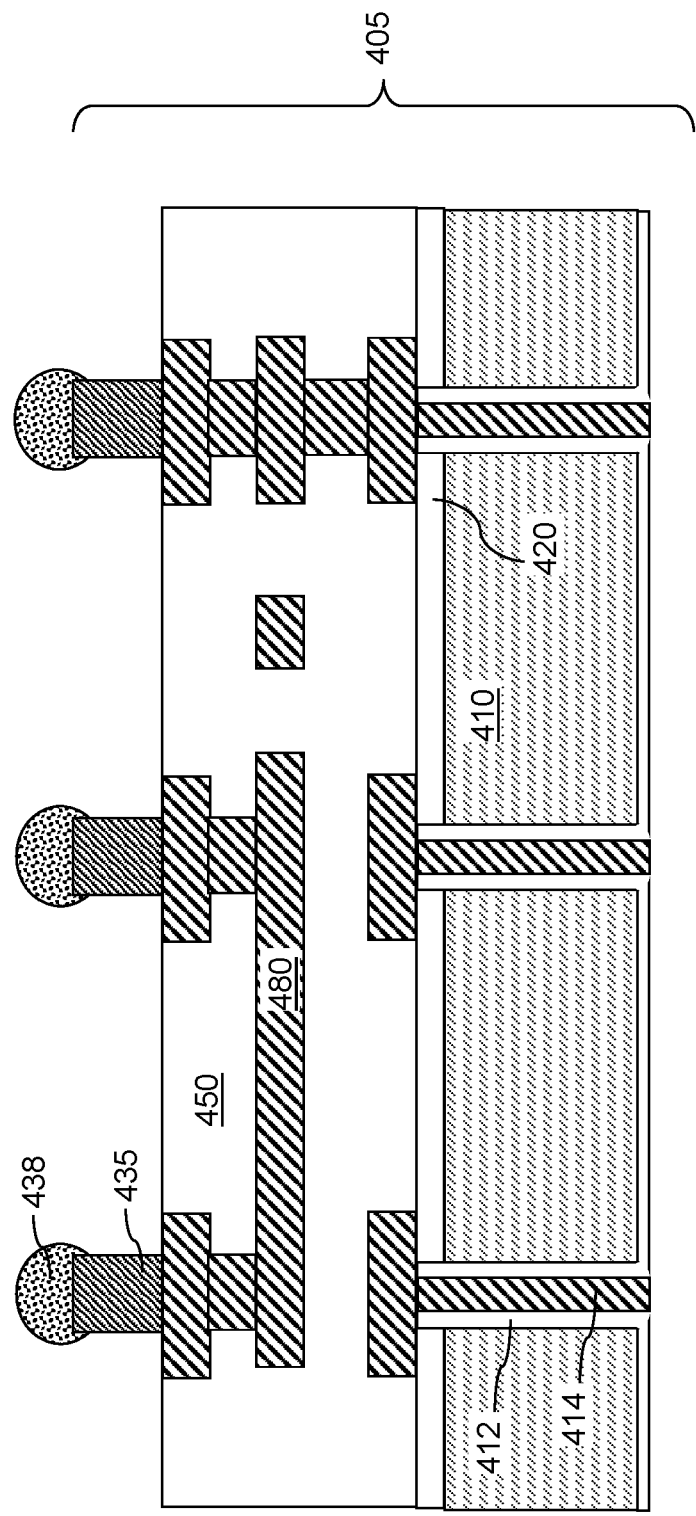
FIG. 3 is a vertical cross-sectional view of an exemplary local silicon interconnect (LSI) bridge that may be subsequently integrated into the first exemplary structure.

Referring to FIG. 3, an example of a local silicon interconnect bridge (LSI bridge) 405 is illustrated. The LSI bridge 405 includes a silicon substrate 410 (as thinned and diced during manufacturing of the local silicon interconnect bridge 405), through-substrate openings that vertically extend through the silicon substrate 410, a dielectric liner 412 that provides electrical isolation for through-silicon via structures 414, backside dielectric material layer 420, and metal interconnect structures 480 embedded in dielectric material layers 450 and electrically connected to the through-silicon via structures 414 and/or electrically connected thereamongst. LSI microbump structures 435 configurated for C2 bonding may be provided on the topmost metal interconnect structures 480. Optionally, a subset of the metal interconnect structures 480 may provide electrical connection among between a subset of the LSI mircobump structures 435. Solder material portions 438 may be applied to the LSI microbump structures 435 in preparation for a subsequent bonding process.

Figure 4:
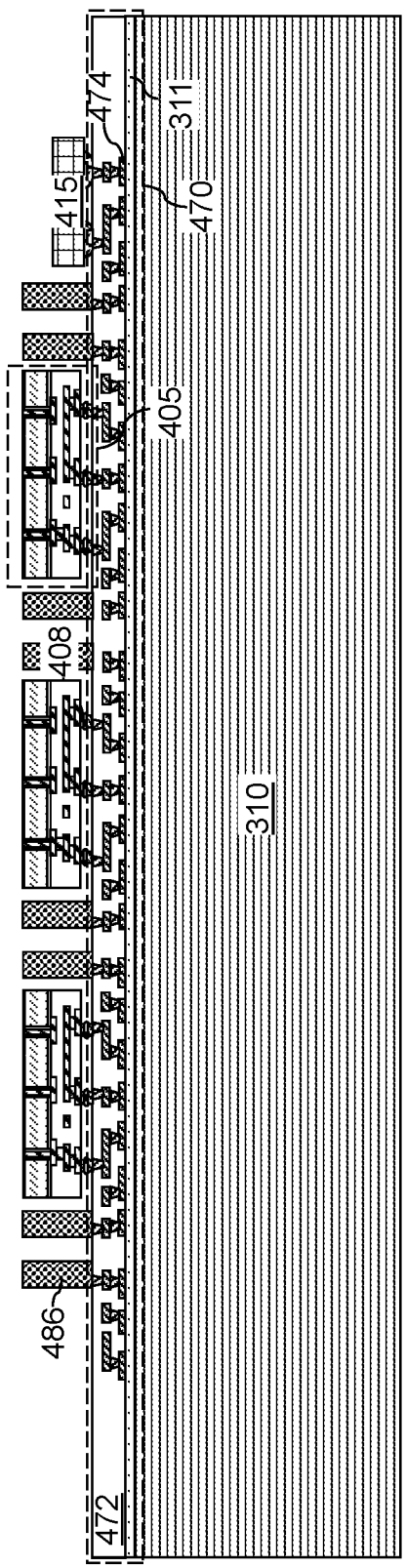
FIG. 4 is a vertical cross-sectional view of the first exemplary structure after attaching LSI bridges to the die-side redistribution structures according to the first embodiment of the present disclosure.

Referring to FIG. 4, the local silicon interconnect bridges (LSI bridges) 405 may be placed in vacant areas that are not occupied by the through-integrated-fan-out-via structures 486. Generally, any type of LSI bridges 405 known in the art may be used. The microbump structures 435 on the LSI bridges 405 may be bonded to the microbump structures 475 on the die-side redistribution structures 470 employing arrays of solder material portions. Each bonded combination of a microbump structure 435 on an LSI bridge 405, a microbump structure 475 on a die-side redistribution structure 470, and a solder material portion is herein referred to as a microbump bonding structure 408. Generally, the LSI bridges 405 are bonded to the die-side redistribution structures 470 employing arrays of microbump bonding structures 408. Optionally, underfill material portions (not illustrated) may be applied around each array of microbump bonding structures 408.

In some embodiments, at least one semiconductor die 415, such as an integrated passive device die or a surface mount die, may be bonded to each of the die-side redistribution structures 470.

Figure 5:
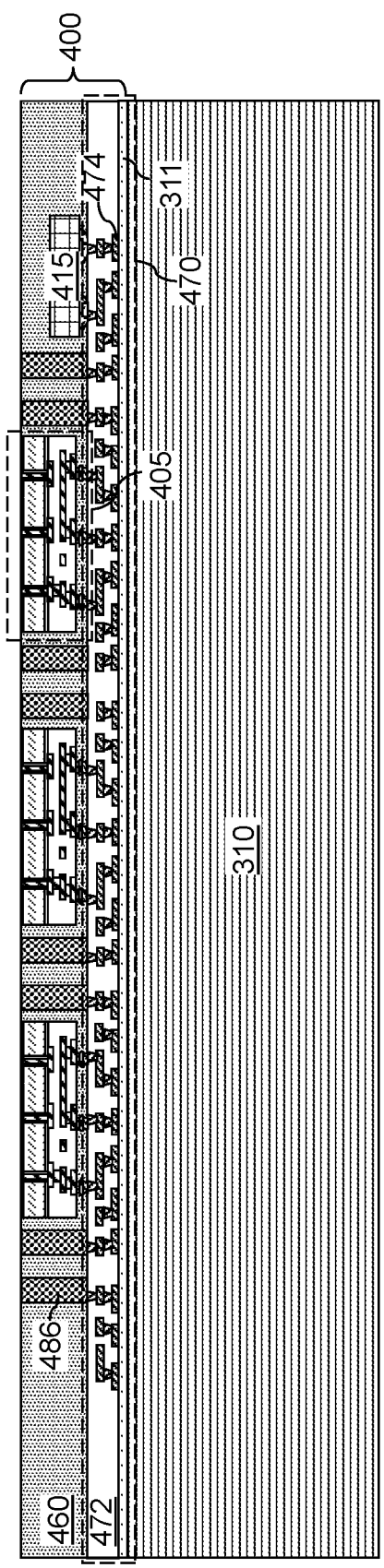
FIG. 5 is a vertical cross-sectional view of the first exemplary structure after formation of molding compound interposer frames according to the first embodiment of the present disclosure.

Referring to FIG. 5, an encapsulant, such as a molding compound (MC) may be applied to the gaps between the bridge dies 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a first MC matrix or an interposer-level MC matrix. In embodiments in which underfill material portions are used to laterally surround the array of microbump bonding structures 408, such underfill material portions may be be incorporated into the first MC matrix. The first MC matrix laterally encloses each of the bridge dies 405 and the TIV structures 486. The first MC matrix may be a continuous material layer that extends across the entirety of the area of the reconstituted wafer overlying the first carrier wafer 310. As such, the first MC matrix may include a plurality of molding compound (MC) interposer frames 460 that are laterally adjoined to one another. Each MC interposer frame 460 corresponds to a portion of the first MC matrix located within a unit area, i.e., an area of a single interposer to be subsequently formed. Each MC interposer frame 460 may be located within a respective unit area, and laterally surrounds a respective set of at least one bridge die 405 and a respective array of TIV structures 486. Excess portions of the first MC matrix may be removed from above the horizontal plane including the top surfaces of the bridge die 405 and the TIV structures 486 by a planarization process, which may use chemical mechanical planarization (CMP). Surfaces of the through-silicon via structures 414 may be physically exposed after the planarization process.

A reconstituted wafer is formed over the first carrier wafer 310. Each portion of the reconstituted wafer located within a unit area constitutes an interposer, which is herein referred to as a local-silicon-interconnect-containing interposer 400, or an LSI-containing interposer 400. Each LSI-containing interposer 400 comprises a set of at least one LSI bridge 405, a set of TIV structures 486, an MC interposer frame 460 (which is a portion of the first MC matrix), and a die-side redistribution structure 470.

Figure 6:
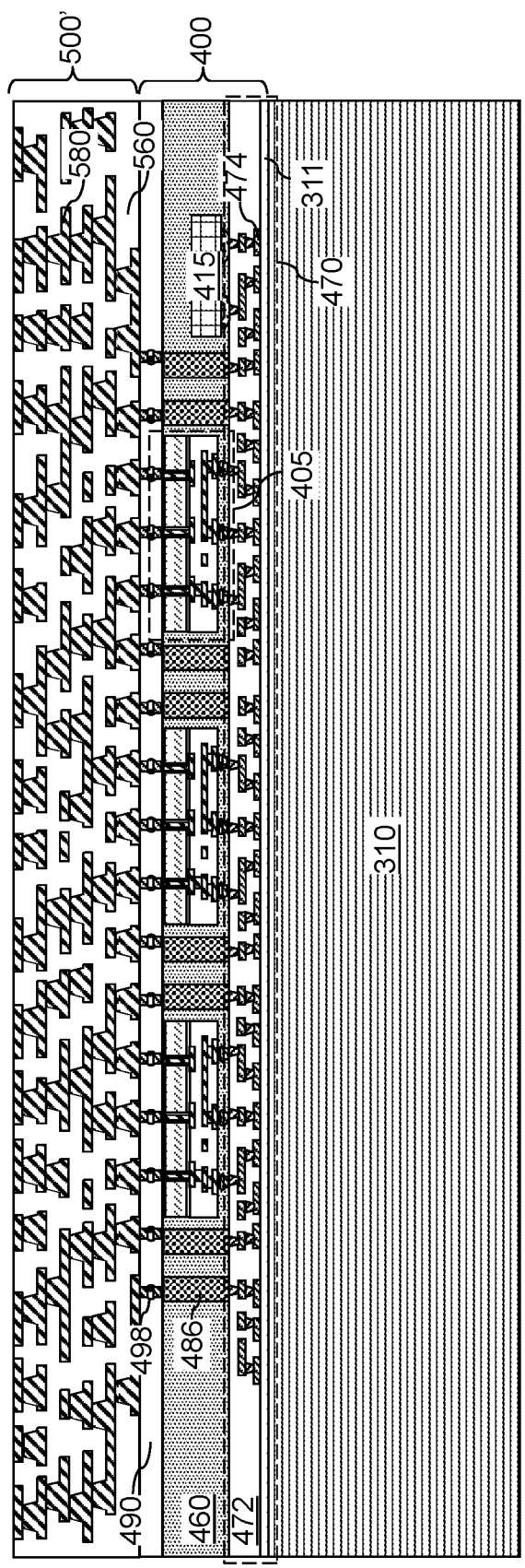
FIG. 6 is vertical cross-sectional view of the first exemplary structure after attaching additional redistribution structures according to the first embodiment of the present disclosure.

Referring to FIG. 6, an in-process package-side redistribution structure 500' may be formed on the two-dimensional array of LSI-containing interposers 400. As used herein, an "in-process" element refers to an element that is modified in a subsequent processing step, for example, by patterning, by change of material composition, and/or by addition or subtraction of a material portion. In embodiments in which the in-process package-side redistribution structure 500', additional structures may be added in subsequent processing steps.

A two-dimensional array of in-process package-side redistribution structures 500' may be transferred from another reconstituted wafer, and may be bonded to the two-dimensional array of LSI-containing interposers 400. In one embodiment, microbump structures may be formed on the top surface of each of the LSI-containing interposers 400. For example, a copper seed layer may be deposited by physical vapor deposition, a sacrificial matrix layer including openings may be formed over the copper seed layer, copper portions may be electroplated in the openings in the sacrificial matrix layer on the physically exposed surfaces of the copper seed layer, the sacrificial matrix layer can be removed, and then physically exposed portions of the copper seed layer can be removed. The remaining portions of the copper material constitute microbump structures that are formed on the two-dimensional array of LSI-containing interposers 400. The microbump structures may be formed on physically exposed end surfaces of the through-silicon via structures 414 and the TIV structures 486. Mating microbump structures can be formed on the side of the in-process package-side redistribution structures 500' using similar methods.

The array of the LSI-containing interposers 400 and the array of in-process package-side redistribution structures 500' may be subsequently boned employing an array of solder material portions. Each bonded combination of a microbump structure on an LSI-containing interposer 400, a microbump structure on an in-process package-side redistribution structure 500', and a solder material portion is herein referred to as an inter-interposer microbump bonding structure 498. Generally, the LSI-containing interposers 400 are bonded to the in-process package-side redistribution structures 500' employing arrays of inter-interposer microbump bonding structure 498. An underfill material layer 490 may be formed around each array of inter-interposer microbump bonding structure 498.

An in-process package-side redistribution structure 500' may be formed within each unit area, which is the area a repetition unit that may be repeated in a two-dimensional array as discussed above. The in-process package-side redistribution structure 500' may include first package-side redistribution dielectric layers 560 and first package-side redistribution wiring interconnects 580. The first package-side redistribution dielectric layers 560 may include any dielectric material that may be used for the die-side redistribution dielectric layers 472. The first package-side redistribution wiring interconnects 580 may include any material that may be used for the die-side redistribution wiring interconnects 474.

In an alternative embodiment, the in-process package-side redistribution structure 500' may be formed by repetition of a sequence of processing steps that includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level. In this embodiment, the set of processing steps used to form the die-side redistribution dielectric layers 472 and the die-side redistribution wiring interconnects 474 may be used mutatis mutandis, for example, with suitable changes in the pattern of material portions, material compositions, and/or material thicknesses.

Figure 7:
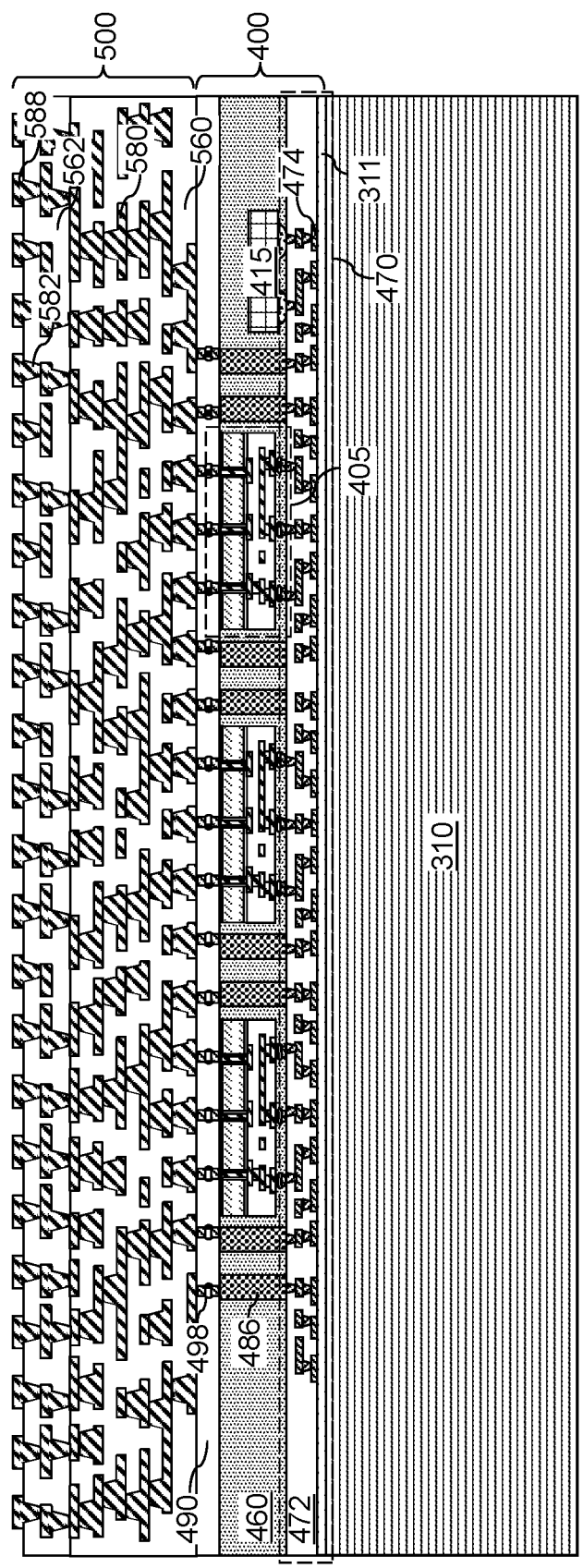
FIG. 7 is vertical cross-sectional view of the first exemplary structure after formation of a composite interposer including a stack of an LSI-containing interposer and an organic interposer according to the first embodiment of the present disclosure.

Referring to FIG. 7, at least one additional package-side redistribution dielectric layer (which is herein referred to as at least one second package-side redistribution dielectric layer 562) and additional package-side redistribution wiring interconnects (which are herein referred to as second package-side redistribution wiring interconnects 582) may be formed over the in-process package-side redistribution structure 500'. The at least one second package-side redistribution dielectric layer 562 and the second package-side redistribution wiring interconnects 582 may be formed by performing a sequence of processing steps at least once. The sequence of processing steps includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level.

The first package-side redistribution dielectric layer 560 and the at least one second package-side redistribution dielectric layer 562 are collectively referred to as package-side redistribution dielectric layers (560, 562). The first package-side redistribution wiring interconnects 580 and the second package-side redistribution wiring interconnects 582 are collectively referred to as package-side redistribution wiring interconnects (580, 582). Interposer-side bonding pads 588 may be formed at the topmost level of the package-side redistribution dielectric layers (560, 562). In one embodiment, the interposer bonding pads 588 may be formed as a two-dimensional array of interposer bonding pads 588, which may be a periodic array such as a rectangular array or a hexagonal array. Generally, the pitches of the two-dimensional array of interposer bonding pads 588 along horizontal directions may be in a range from 20 microns to 100 microns, although lesser and greater pitches may also be used. For example, the pitches of the two-dimensional array of interposer bonding pads 588 may be in a range from 20 microns to 60 microns, although lesser and greater pitches may also be used.

The reconstituted wafer after the processing steps of FIG. 6 comprises the package-side redistribution dielectric layers (560, 562), the package-side redistribution wiring interconnects (580, 582), the interposer bonding pads 588, and a two-dimensional array of LSI-containing interposers 400. Each LSI-containing interposer 400 is located within a respective unit area, which is the area of a unit of repetition within the reconstituted wafer. Each portion of the set of materials including the package-side redistribution dielectric layers (560, 562), the package-side redistribution wiring interconnects (580, 582), and the interposer bonding pads 588 located within a unit area constitutes an organic interposer 500. Each contiguous vertical stack of an LSI-containing interposer 400 and an organic interposer 500 constitutes a composite interposer (400, 500). Thus, the reconstituted wafer may include a two-dimensional array of composite interposers (400, 500).

Figure 8:
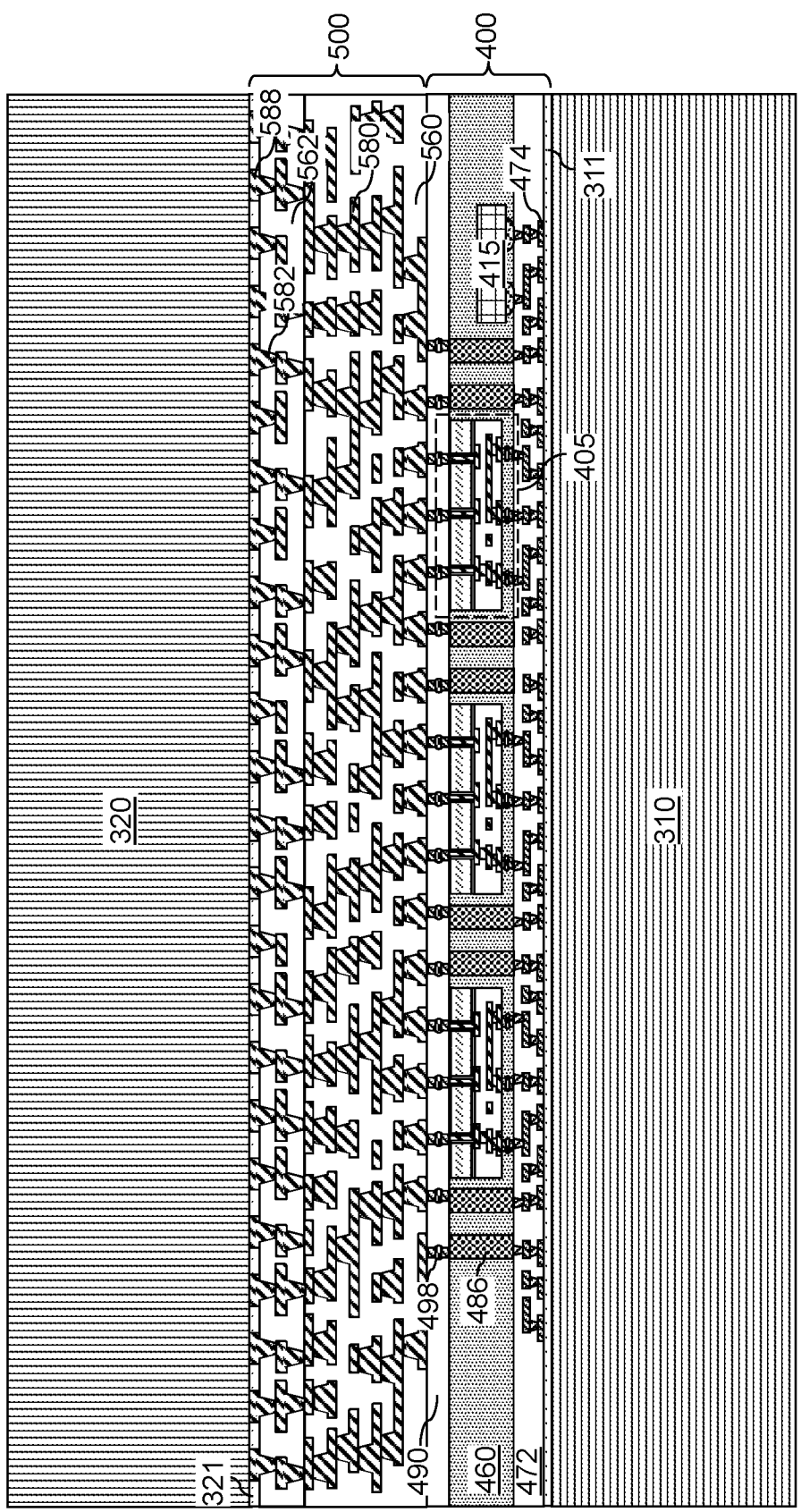
FIG. 8 is a vertical cross-sectional view of the first exemplary structure after attachment of a second carrier wafer to the composite interposer according to the first embodiment of the present disclosure.

Referring to FIG. 8, a second adhesive layer 321 may be applied over the package-side redistribution dielectric layers (560, 562). The second adhesive layer 321 may comprise a light-to-heat conversion (LTHC) layer or a thermally decomposing adhesive material layer depending on the removal mechanism to be subsequently used. A second carrier wafer 320 may be attached to the die-side redistribution structure 470 through the second adhesive layer 321. The second carrier wafer 320 may comprise any material that may be used for the first carrier wafer 310, and generally may have about the same thickness range as the first carrier wafer 310.

Figure 9:
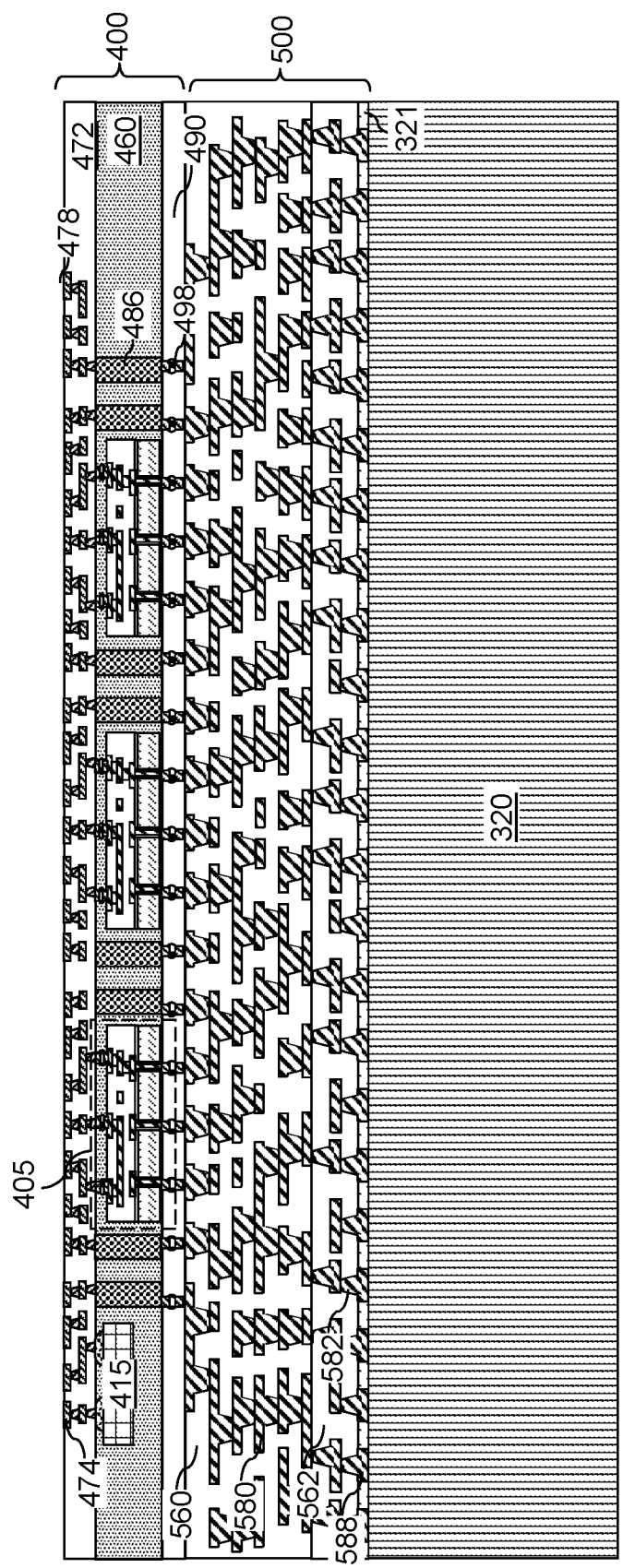
FIG. 9 is a vertical cross-sectional view of the first exemplary structure after detaching the first carrier wafer according to the first embodiment of the present disclosure.

Referring to FIG. 9, the first carrier wafer 310 may be detached from the reconstituted wafer. In some embodiments, the first carrier wafer 310 and the first adhesive layer 311 may be removed by backside grinding. Optionally, at least one selective etch process (such as a wet etch process or a reactive ion etch process) may be employed in conjunction with the backside grinding process to minimize collateral removal of surface portions of the composite interposers (400, 500). Alternatively or additionally, in embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311.

On-interposer bump structures 478 may be formed on the top surface of the composite interposers (400, 500). The on-interposer bump structures 478 are bump structures that may be subsequently used to attach semiconductor dies. The metallic fill material for the on-interposer bump structures 478 may include copper. The on-interposer bump structures 478 may have horizontal cross-sectional shapes of rectangles, rounded rectangles, or circles. Other horizontal cross-sectional shapes may be within the contemplated scope of disclosure. Typically, the on-interposer bump structures 478 may be configured for microbump bonding (i.e., C2 bonding), and may have a thickness in a range from 30 microns to 100 microns, although lesser or greater thicknesses may also be used. In such an embodiment, the on-interposer bump structures 478 may be formed as an array of microbumps (such as copper pillars) having a lateral dimension in a range from 10 microns to 25 microns, and having a pitch in a range from 20 microns to 50 microns. Generally, the pitches of the on-interposer bump structures 478 may be smaller than the pitches of the two-dimensional array of interposer bonding pads 588 by a factor in a range from 1.2 to 10, such as from 2 to 5.

Figure 10:
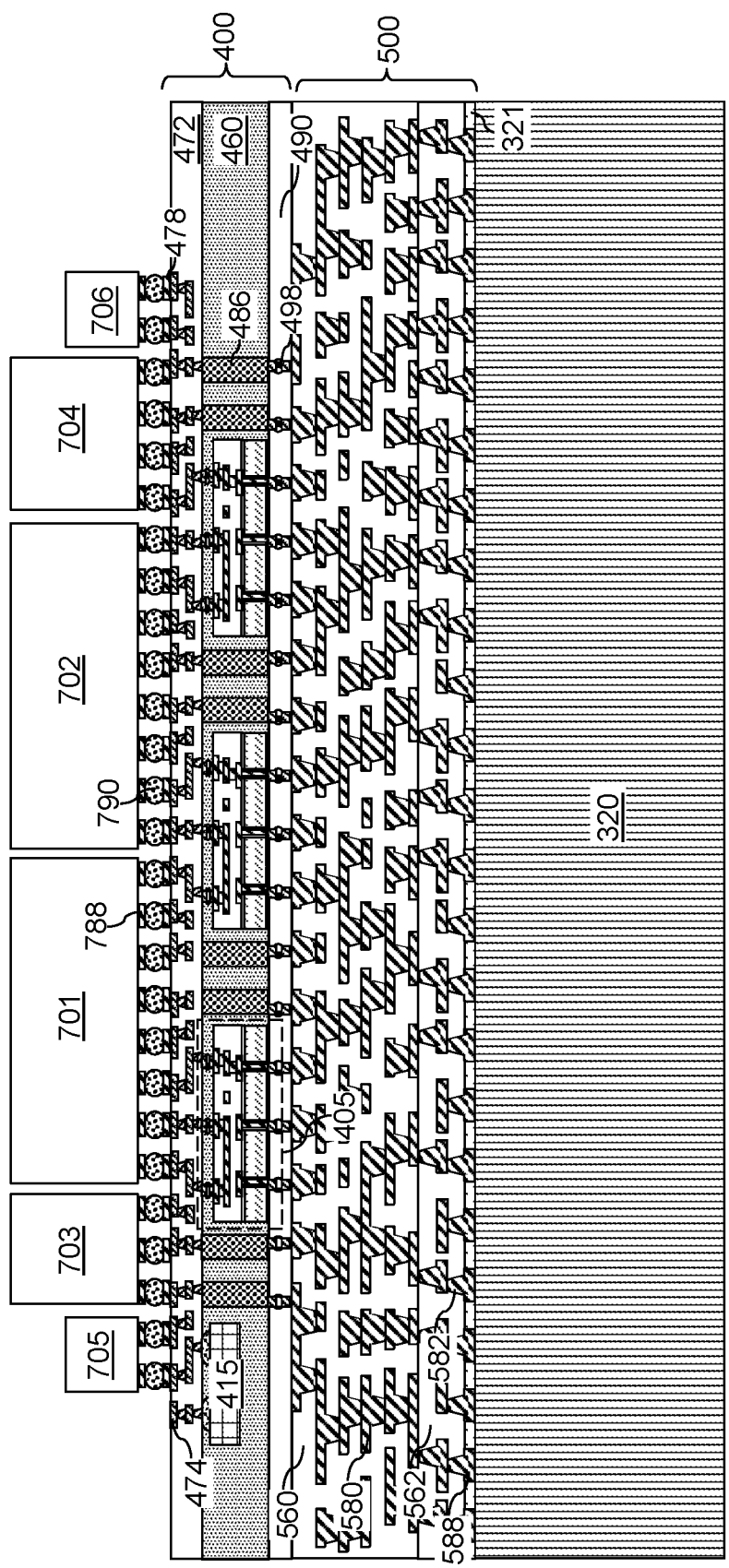
FIG. 10 is a vertical cross-sectional view of the first exemplary structure after attaching semiconductor dies to the composite interposer according to the first embodiment of the present disclosure.

Referring to FIG. 10, a set of at least one semiconductor die (701, 702, 703, 704, 705, 706) may be bonded to each composite interposer (400, 500). In one embodiment, the composite interposers (400, 500) may be arranged as a two-dimensional periodic array within the reconstituted wafer in the exemplary structure, and multiple sets of at least one semiconductor die (701, 702, 703, 704, 705, 706) may be bonded to the composite interposers (400, 500) as a two-dimensional periodic rectangular array of sets of the at least one semiconductor die (701, 702, 703, 704, 705, 706). Each set of at least one semiconductor die (701, 702, 703, 704, 705, 706) includes at least one semiconductor die. Each set of at least one semiconductor die (701, 702, 703, 704, 705, 706) may include any set of at least one semiconductor die known in the art. In one embodiment, each set of at least one semiconductor die (701, 702, 703, 704, 705, 706) may comprise a plurality of semiconductor dies (701, 702, 703, 704, 705, 706). For example, each set of at least one semiconductor die (701, 702, 703, 704, 705, 706) may include at least one system-on-chip (SoC) die (701, 702) and/or at least one memory die (703, 704). Optionally, each set of at least one semiconductor die (701, 702, 703, 704, 705, 706) may include at least one surface mount die (705, 706) known in the art. Each SoC die (701, 702) may comprise an application processor die, a central processing unit die, or a graphic processing unit die. In one embodiment, the at least one memory die (703, 704) may comprise a high bandwidth memory (HBM) die that includes a vertical stack of static random access memory dies. In one embodiment, the at least one semiconductor die (701, 702, 703, 704, 705, 706) may include at least one system-on-chip (SoC) die (701, 702) and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 702, 703, 704, 705, 706) may comprise a respective array of on-die bump structures 788. Solder material portions may be applied to the on-die bump structures 788 of the semiconductor dies (701, 702, 703, 704, 705, 706), or may be applied to the on-interposer bump structures 478. The solder material portions are herein referred to as die-interposer-bonding (DIB) solder material portions 790, or as first solder material portions. Each of the semiconductor dies (701, 702, 703, 704, 705, 706) may be positioned in a face-down position such that on-die bump structures 788 face the on-interposer bump structures 478. Placement of the semiconductor dies (701, 702, 703, 704, 705, 706) may be performed using a pick and place apparatus such that each of the on-die bump structures 788 may face a respective one of the on-interposer bump structures 478. Each set of at least one semiconductor die (701, 702, 703, 704, 705, 706) may be placed within a respective unit area. A DIB solder material portion 790 is attached to one of the on-die bump structure 788 and the on-interposer bump structure 478 for each facing pair of an on-die bump structure 788 and an on-interposer bump structure 478.

Generally, a composite interposer (400, 500) may be provided, which includes interposer bump structure 478 thereupon. At least one semiconductor die (701, 702, 703, 704, 705, 706) may be provided, each of which includes a respective set of on-die bump structures 788. The at least one semiconductor die (701, 702, 703, 704, 705, 706) may be bonded to the composite interposer (400, 500) using the DIB solder material portions 790 that are bonded to a respective on-interposer bump structure 478 and to a respective on-die bump structure 788. Each set of at least one semiconductor die (701, 702, 703, 704, 705, 706) may be attached to a respective composite interposer (400, 500) through a respective set of DIB solder material portions 790.

In one embodiment, the on-die bump structures 788 and the on-interposer bump structures 478 may be configured for microbump bonding (i.e., C2 bonding). In this embodiment, each of the on-die bump structures 788 and the on-interposer bump structures 478 may be configured as copper pillar structures having a diameter in a range from 10 microns to 30 microns, and may have a respective height in a range from 5 microns to 100 microns. The pitch of the microbumps in the direction of periodicity may be in a range from 20 microns to 60 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined on-interposer bump structure 478.

Figure 11:
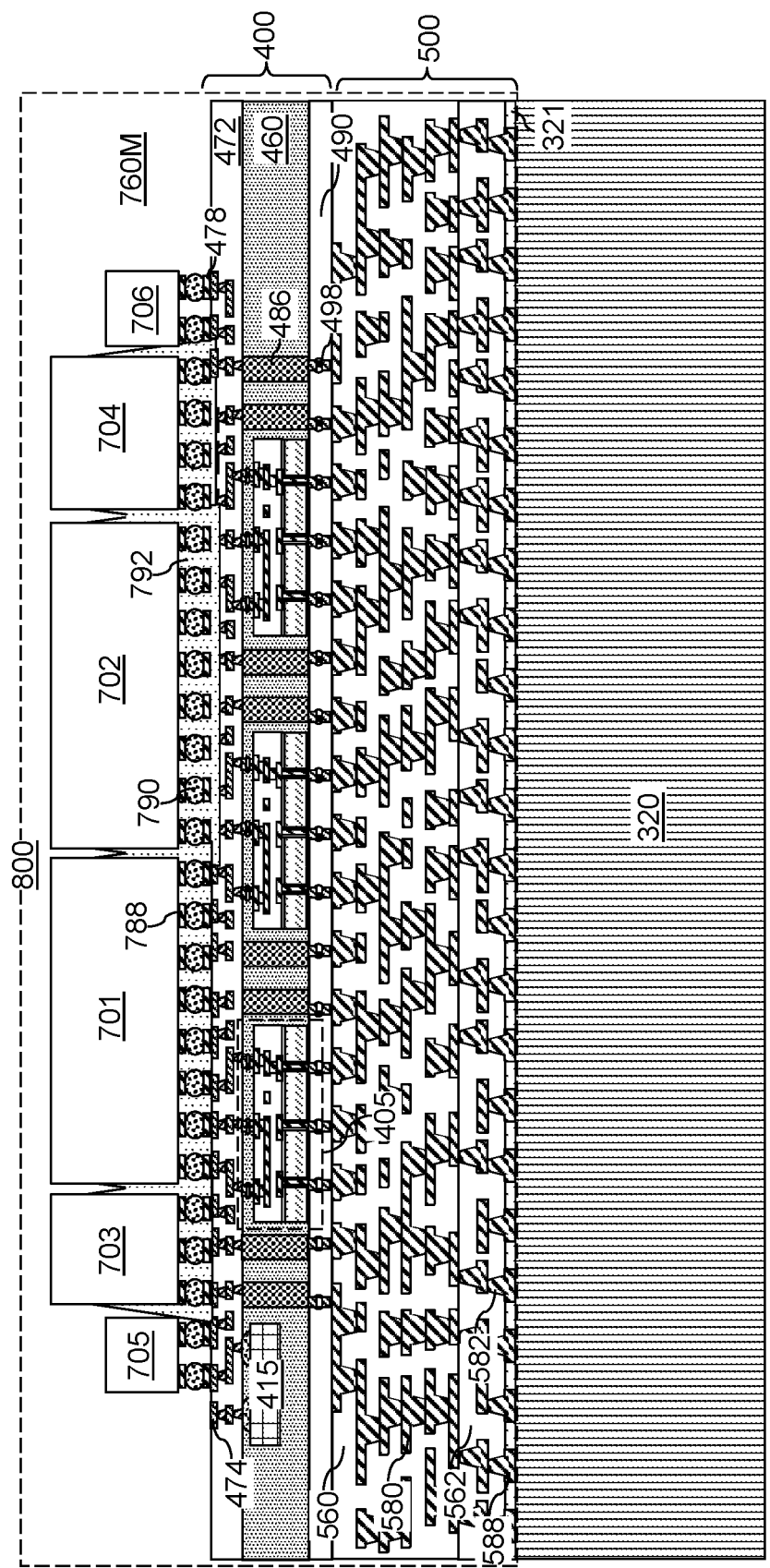
FIG. 11 is a vertical cross-sectional view of the first exemplary structure after formation of a molding compound layer according to the first embodiment of the present disclosure.

Referring to FIG. 11, a die-side underfill material may be applied into each gap between the composite interposers (400, 500) and sets of at least one semiconductor die (701, 702, 703, 704, 705, 706) that are bonded to the composite interposers (400, 500). The die-side underfill material may comprise any underfill material known in the art. A die-side underfill material portion 792 may be formed within each unit area between a composite interposer (400, 500) and an overlying set of at least one semiconductor die (701, 702, 703, 704, 705, 706). The die-side underfill material portions 792 may be formed by injecting the die-side underfill material around a respective array of DIB solder material portions 790 in a respective unit area. Any known underfill material application method may be used, which may be, for example, the capillary underfill method, the molded underfill method, or the printed underfill method.

Within each unit area, a die-side underfill material portion 792 may laterally surround, and contact, a respective set of the DIB solder material portions 790 within the unit area. The die-side underfill material portion 792 may be formed around, and contact, the DIB solder material portions 790, the on-interposer bump structures 478, and the on-die bump structures 788 in the unit area. Generally, at least one semiconductor die (701, 702, 703, 704, 705, 706) comprising a respective set of on-die bump structures 788 is attached to the on-interposer bump structures 478 through a respective set of DIB solder material portions 790 within each unit area. Within each unit area, a die-side underfill material portion 792 laterally surrounds the on-interposer bump structures 478 and the on-die bump structures 788 of the at least one semiconductor die (701, 702, 703, 704, 705, 706).

A molding compound (MC) may be applied to the gaps between assemblies of a respective set of semiconductor dies (701, 702, 703, 704, 705, 706) and a respective die-side underfill material portion 792. The MC may include any material that may be used for the MC interposer frames 460 discussed above. The MC may include epoxy resin, hardener, silica (as a filler material), and other additives. The MC may be cured at a curing temperature to form an MC matrix, which is herein referred to as a die-level MC matrix 760M or as a second MC matrix. The die-level MC matrix 760M laterally surrounds and embeds each assembly of a set of semiconductor dies (701, 702, 703, 704, 705, 706) and a die-side underfill material portion 792. The die-level MC matrix 760M includes a plurality of molding compound (MC) die frames that may be laterally adjoined to one another. Each MC die frame is a portion of the die-level MC matrix 760M that is located within a respective unit area. Thus, each MC die frame laterally surrounds, and embeds, a respective a set of semiconductor dies (701, 702, 703, 704, 705, 706) and a respective die-side underfill material portion 792. Young's modulus of pure epoxy is about 3.35 GPa, and Young's modulus of the MC may be higher than Young's modulus of pure epoxy due to additives therein. Thus, Young's modulus of the die-level MC matrix 760M may be greater than 3.5 GPa.

Portions of the die-level MC matrix 760M that overlies the horizontal plane including the top surfaces of the semiconductor dies (701, 702, 703, 704, 705, 706) may be removed by a planarization process. For example, the portions of the die-level MC matrix 760M that overlies the horizontal plane may be removed using a chemical mechanical planarization (CMP). The reconstituted wafer that overlies the second carrier wafer 320 comprises a combination of the die-level MC matrix 760M, the semiconductor dies (701, 702, 703, 704, 705, 706), the die-side underfill material portions 792, and the two-dimensional array of composite interposers (400, 500). Each portion of the die-level MC matrix 760M located within a unit area constitutes an MC die frame.

Each portion of the reconstituted wafer located within a unit area constitutes a fan-out package 800. Each fan-out package 800 may comprise at least one semiconductor die (701, 702, 703, 704, 705, 706), a composite interposer (400, 500), DIB solder material portions 790, at least one die-side underfill material portion 792, and an MC die frame that is a portion of the die-level MC matrix 760M located within a respective unit area.

Figure 12:
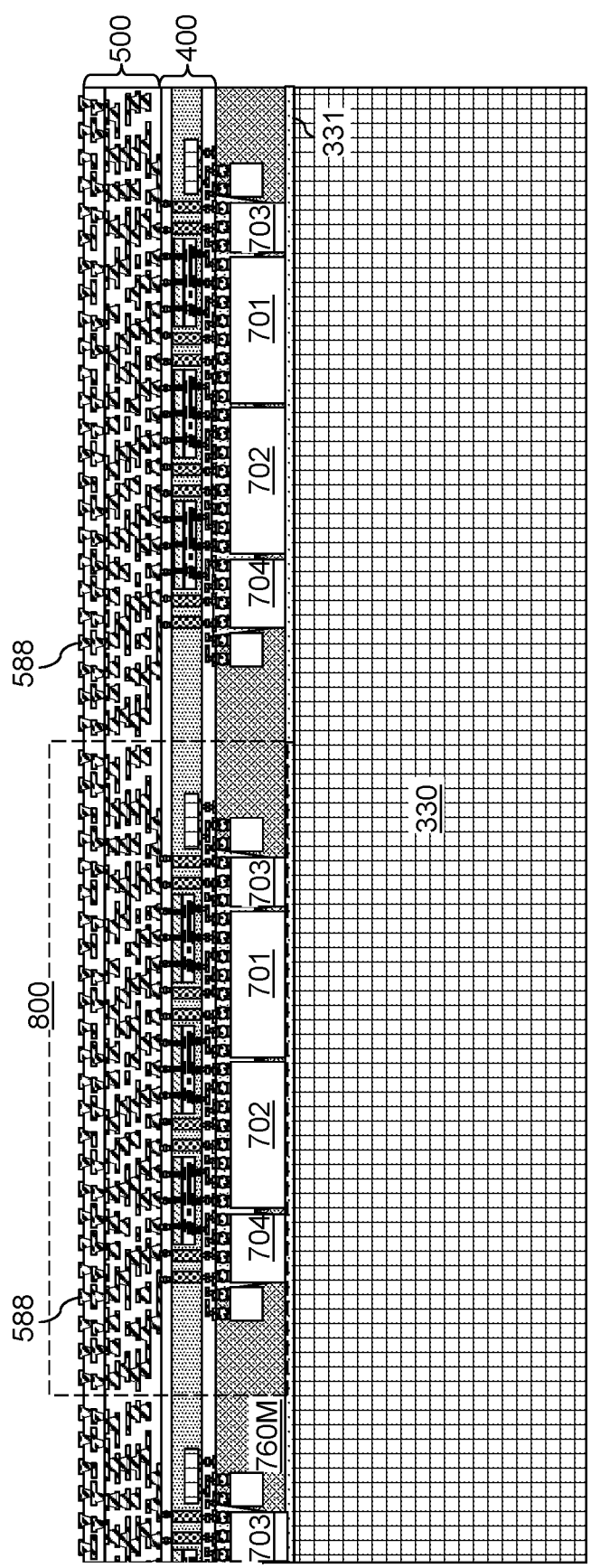
FIG. 12 is a vertical cross-sectional view of the first exemplary structure after attaching a third carrier wafer and detaching the second carrier wafer according to the first embodiment of the present disclosure.
Figure 13A:
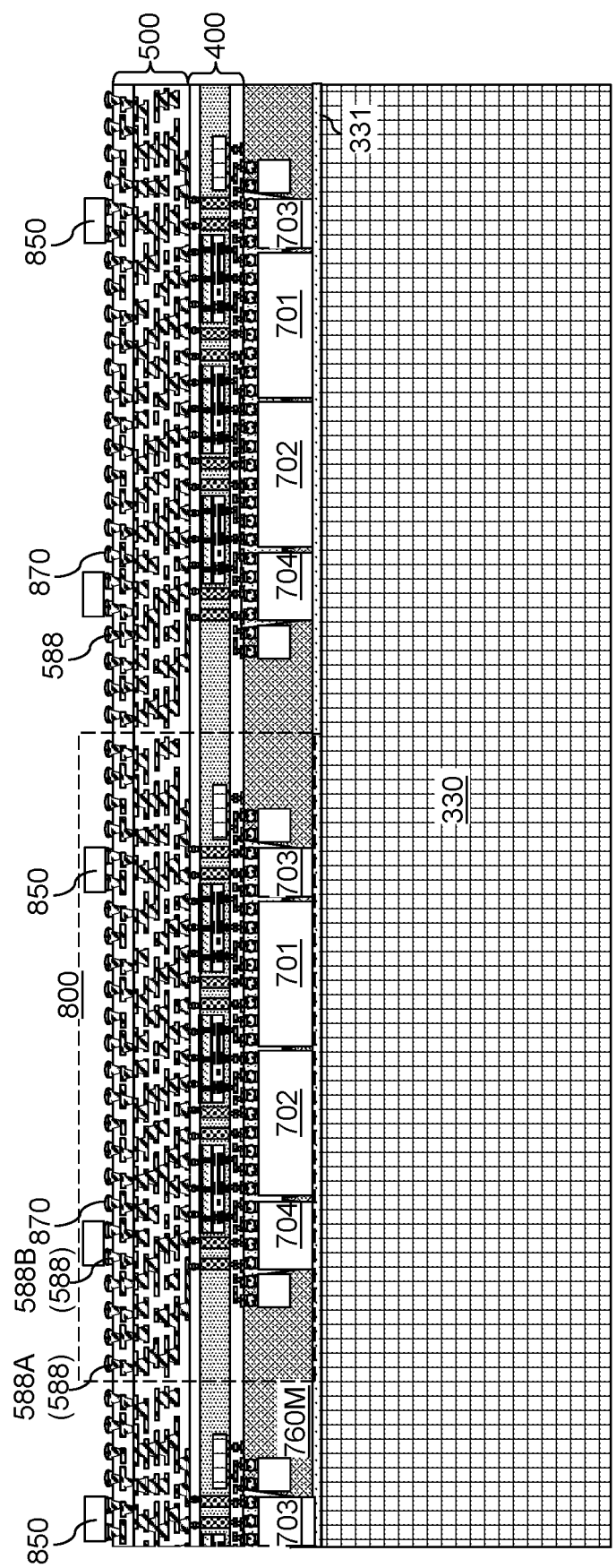
FIG. 13A is a vertical cross-sectional view of the first exemplary structure after attaching interposer-side solder material portions to interposer bonding pads and attaching surface mount dies to a subset of the interposer-side solder material portions according to an embodiment of the present disclosure.

Referring to FIG. 12, a third adhesive layer 331 may be applied on the die-level MC matrix 760M. The third adhesive layer 331 may comprise a light-to-heat conversion (LTHC) layer or a thermally decomposing adhesive material layer depending on the removal mechanism to be subsequently used. A third carrier wafer 330 may be attached to the die-level MC matrix 760M through the third adhesive layer 331. The third carrier wafer 330 may comprise any material that may be used for the first carrier wafer 310, and generally may have about the same thickness range as the first carrier wafer 310.

The second carrier wafer 320 may be detached from the a reconstituted wafer. In an embodiment, the second carrier wafer 320 may include an optically transparent material and the second adhesive layer 321 comprises a light-to-heat conversion material, irradiation through the second carrier wafer 320 may be used to detach the second carrier wafer 320. In embodiments in which the second adhesive layer 321 comprises a thermally decomposable adhesive material, an anneal process or a laser irradiation may be used to detach the second carrier wafer 320. A suitable clean process may be performed to remove residual portions of the second adhesive layer 321. The interposer bonding pads 588 of the composite interposers (400, 500) may be physically exposed.

Referring to FIGS. 13A, 13B, 14A, and 14B, interposer-side solder material portions 870 may be attached to the interposer bonding pads 588. The interposer-side solder material portions 870 include first interposer-side solder material portions 870A that are subsequently used to attach copper pillar structures, and second interposer-side solder material portions 870B that are subsequently used to attach surface mount dies. A first subset of the interposer bonding pads 588 to which the first interposer-side solder material portions 870A are attached is herein referred to as first interposer bonding pads 588A. A second subset of the interposer bonding pads 588 to which the second interposer-side solder material portions 870B are attached is herein referred to as second interposer bonding pads 588B.

In one embodiment, the first interposer-side solder material portions 870A and the second interposer-side solder material portions 870B may be applied to the first interposer bonding pads 588A and to the second interposer bonding pads 588B, respectively, in a same solder material application process. Alternatively, the second interposer-side solder material portions 870B may have a different material composition that provides a higher reflow temperature than the first interposer-side solder material portions 870A. In this embodiment, the second interposer-side solder material portions 870B may be applied using a different process than the first interposer-side solder material portions 870A.

In one embodiment, surface mount dies 850 may be attached to the second interposer bonding pads 588B through the second interposer-side solder material portions 870B. In this embodiment, the second interposer-side solder material portions 870B may be reflowed without reflowing the first interposer-side solder material portions 870A, for example, by locally heating the surface mount dies 850, for example, using a laser beam. In one embodiment, the second interposer-side solder material portions 870B may have a higher reflow temperature than the first interposer-side solder material portions 870A. In this embodiment, the second interposer-side solder material portions 870B may not reflow during a subsequent reflow process used to attach copper pillar structures.

Alternatively, the surface mount dies 850 may be positioned over the second interposer-side solder material portions 870B without performing a reflow process. In this embodiment, reflow of the second interposer-side solder material portions 870B may be performed simultaneously with reflow of the first interposer-side solder material portions 870A at a subsequent processing step after positioning copper pillar structures on the first interposer-side solder material portions 870A.

Generally, at least one surface mount die 850 may be attached to the second interposer bonding pads 588B using second interposer-side solder material portions 870B. The at least one surface mount die 850 may have a thickness that is not greater than sum of the height of the copper pillar structures and the thickness of package-side solder material portions to be subsequently used. In one embodiment, the at least one surface mount die 850 may have a thickness that is not greater than, or is less than, the height of the copper pillar structures to be subsequently used. In one embodiment, the thickness of the at least one surface mount die 850 may be less than 200 microns, and/or less than 100 microns, and/or less than 50 microns. In one embodiment, the thickness of the at least one surface mount die 850 may be greater than 20 microns, and/or greater than 40 microns, and/or greater than 70 microns, and/or greater than 100 microns.

The reconstituted wafer located over the third carrier substrate comprises a two-dimensional array of fan-out packages 800. Generally, an in-process structure including an interposer (400, 500) may be provided. In the illustrated example, the in-process structure may comprise a fan-out package (701, 702, 703, 704, 705, 706, 760, 790, 792, 400, 500) that includes a composite interposer (400, 500) and a plurality of semiconductor dies (701, 702, 703, 704, 705, 706, 760) that are bonded to the composer interposer (400, 500) and laterally surrounded by, and encapsulated by, a molding compound die frame 760. The composite interposer (400, 500) may include first interposer bonding pads 588A and second interposer bonding pads 588B. At least one surface mount die 850 may be bonded to the second interposer bonding pads 588B. Each of at least one surface mount die 850 is bonded to a respective set of the second interposer bonding pads 588 located on the composite interposer (400, 500) through a respective array of second interposer-side solder material portions 870B.

Figure 15A:
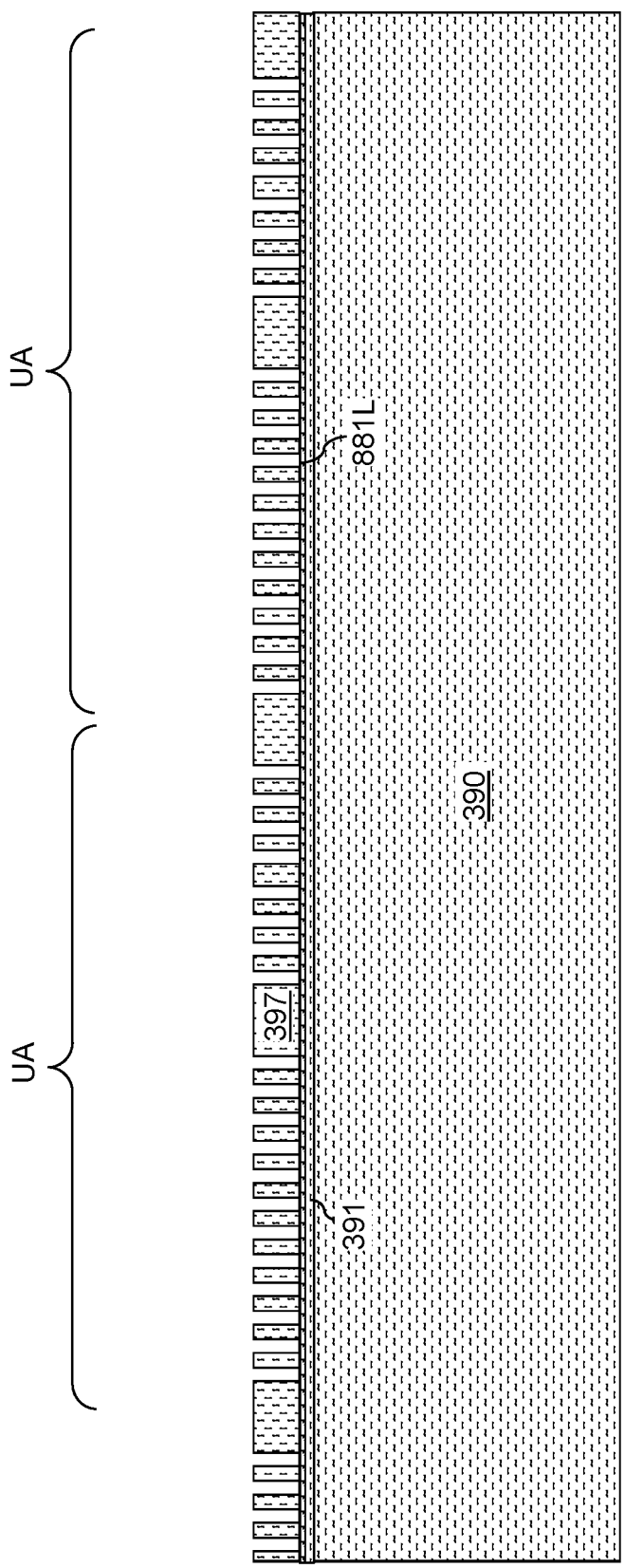
FIGS. 15A-15C are sequential vertical cross-sectional views of a transfer wafer during formation of an array of copper pillar structures thereupon.

Referring to FIG. 15A, a transfer wafer 390 is illustrated, which is a carrier wafer on which copper pillar structures are subsequently formed. The transfer wafer 390 may comprise any material that may be used for the first carrier substrate 310 described above, and may have about the same thickness range as the first carrier substrate 310. An adhesive layer 391 may be on a top surface of the transfer wafer 390. The adhesive layer 391 may comprise any material that may be used for the first adhesive layer 311 described above.

A copper seed layer 881L may be deposited on the top surface of the adhesive layer 311, for example, by physical vapor deposition. The thickness of the copper seed layer 881L may be in a range from 5 nm to 300 nm, such as from 10 nm to 150 nm, although lesser and greater thicknesses may also be used. A sacrificial matrix material such as a polymer material (e.g., polyimide) may be deposited over the copper seed layer 881L, and may be patterned to form a patterned sacrificial matrix layer 397. The thickness of the sacrificial matrix layer 397 may be in a range from 20 microns to 300 microns, such as from 40 microns to 150 microns, although lesser and greater thicknesses may also be used. The sacrificial matrix material may comprise a viscous material that may be hardened upon curing (such as epoxy). In this embodiment, the sacrificial matrix material may be patterned prior to curing, and may be subsequently cured. The sacrificial matrix material may be patterned using any patterning method known in the art. In one embodiment, the sacrificial matrix material may be patterned, for example, by stamping.

According to an aspect of the present disclosure, the sacrificial matrix material may be patterned to provide arrays of cylindrical cavities that are arranged in a mirror image pattern of the pattern of the first interposer bonding pads 588A. The lateral dimensions (such as a diameter) of the cylindrical cavities may be about the same as, greater than, or less than, the lateral dimensions of the first interposer bonding pads 588A. In an illustrative example, an array of interposer bonding pads 588 in each composite interposer (400, 500) in the reconstituted wafer illustrated in FIGS. 13A, 13B, 14A, and 14B may have pitches along horizontal directions that are in a range from 20 microns to 100 microns, such as from 30 microns to 60 microns, and the pitches of the cylindrical cavities in the sacrificial matrix layer 397 may be the same as the pitches of the interposer bonding pads 588. Via cavities may be omitted at locations that correspond to mirror image locations of the second interposer bonding pads 588B, and the via cavities may be formed only at locations that correspond to mirror image locations of the first interposer bonding pads 588A. In one embodiment, each of the via cavities may have a respective uniform horizontal cross-sectional shape that is invariant under translation along the vertical direction. The horizontal cross-sectional shape of each via cavity may be circular, elliptical, polygonal, or of a modified polygonal shape having rounded corners. Each of the via cavities may have a lateral dimension (such as a diameter) in a range from 10 microns to 60 microns, such as from 15 microns to 40 microns, although lesser and greater lateral dimensional may also be used.

Figure 15B:
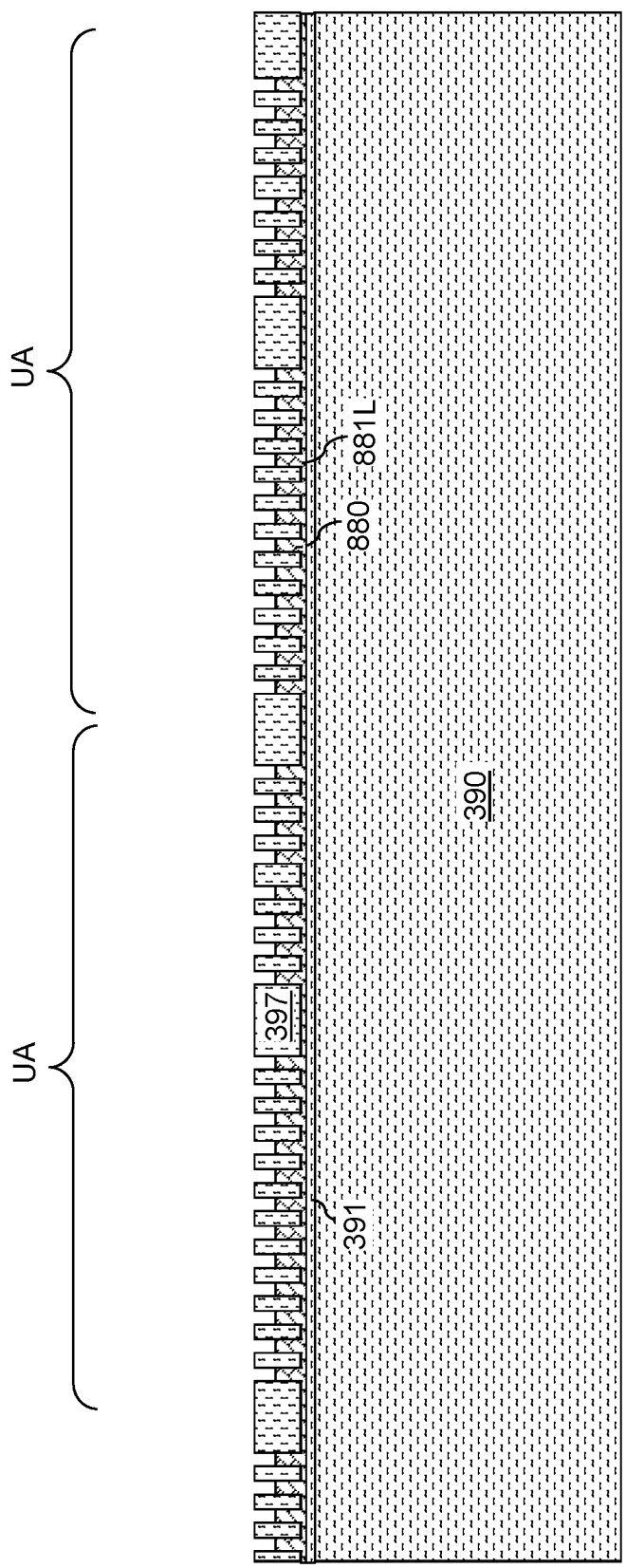

Referring to FIG. 15B, copper may be grown from the physically exposed surfaces of the copper seed layer 881L within each of the via cavities in the sacrificial matrix layer 397, for example, by electroplating. The copper seed layer 881L may be used as an electrode for the electroplating process, and copper may grow from the physically exposed surfaces of the copper seed layer 881L at the bottom of the via cavities during the electroplating process to form copper pillar structures 880. Each of the copper pillar structures 880 may be formed within the volume of a respective one of the via cavities. The height of the top surface of each copper pillar structure 880, as measured from the bottom surface of the copper seed layer 881L, may be in a range from 20 microns to 200 microns, such as from 40 microns to 100 microns, although lesser and greater heights may also be used.

Figure 15C:
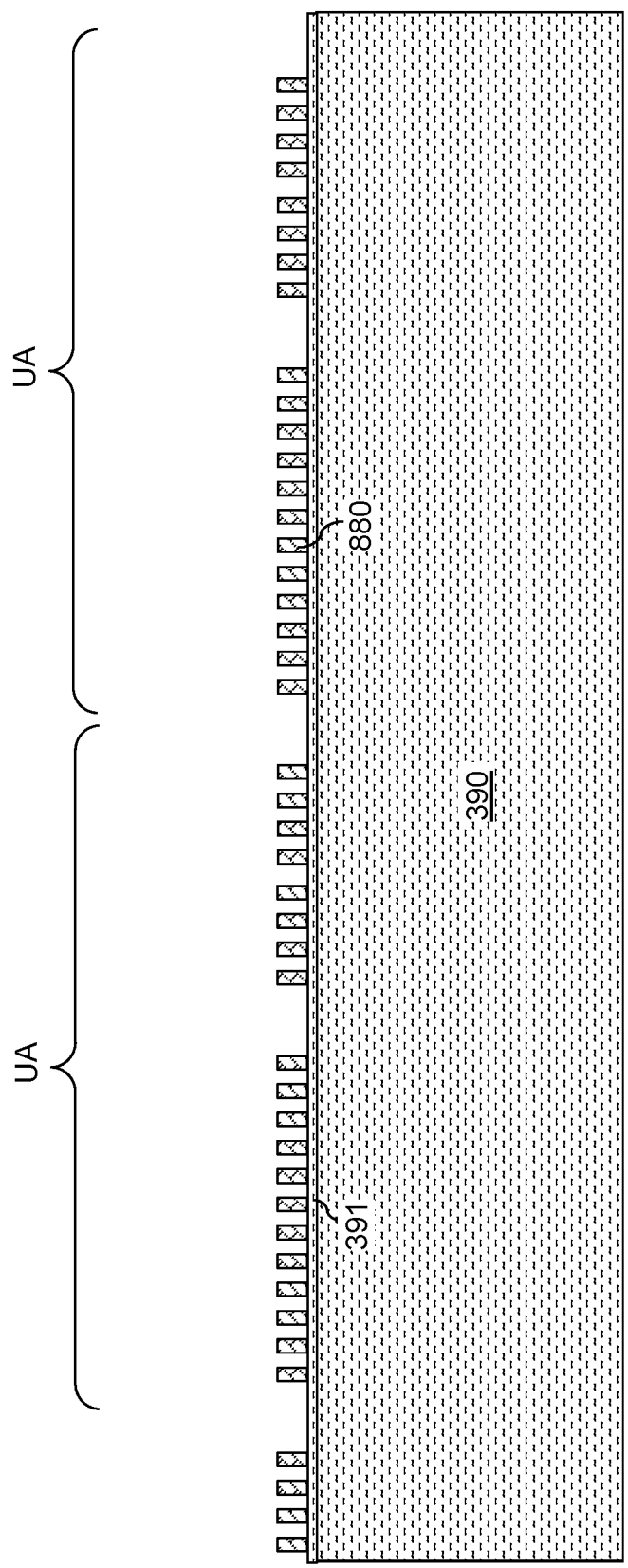
Figure 15D:
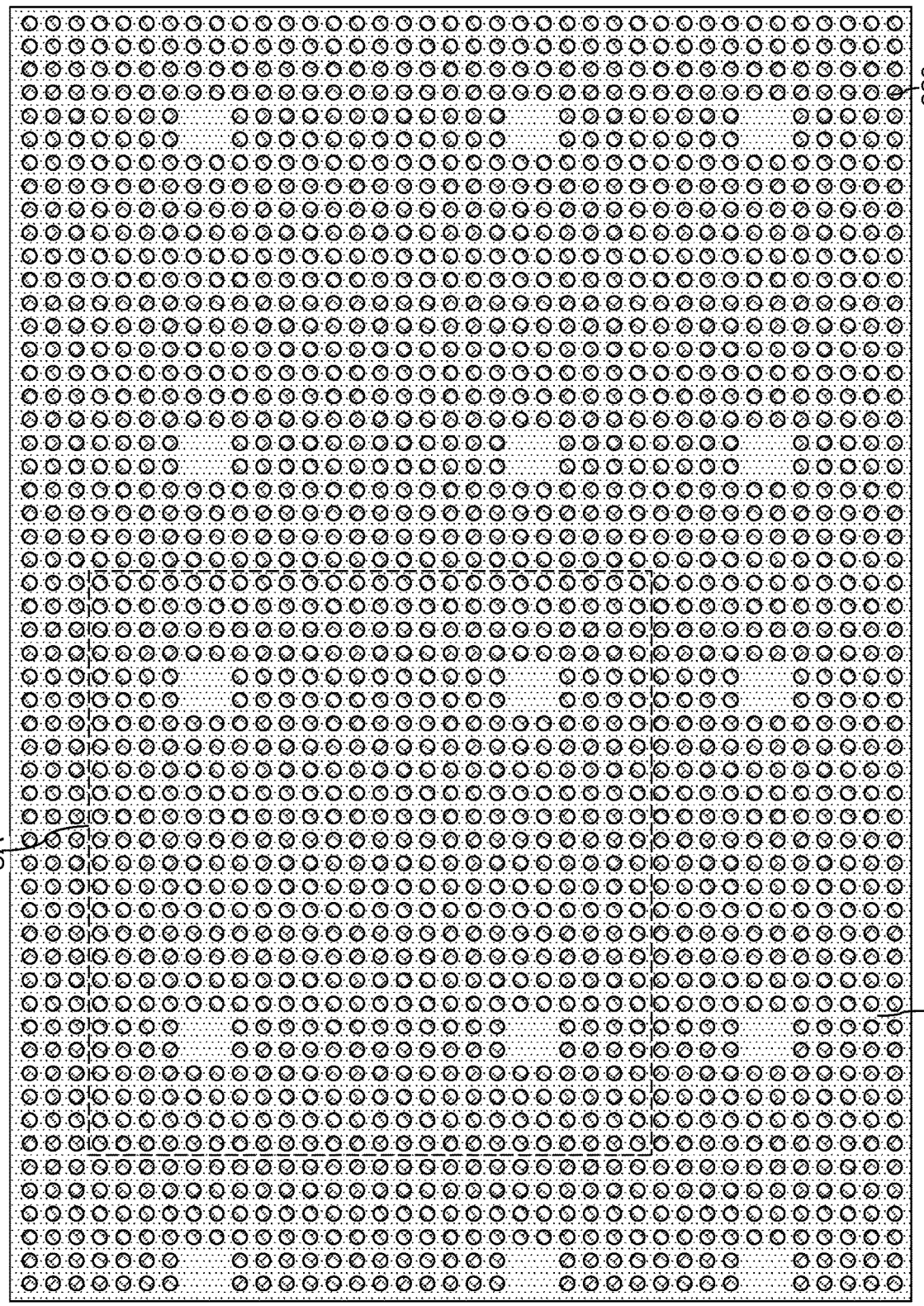
FIG. 15D is a top-down view of the transfer wafer with the array of copper pillar structures at the processing steps of FIG. 15C.

Referring to FIGS. 15C and 15D, the sacrificial matrix layer 397 may be removed selective to copper. Removal of the sacrificial matrix layer 397 may be performed by dissolving the material of the sacrificial matrix layer 397 in a solvent, or by performing an ashing process that removes the sacrificial material layer 397. A controlled etch back process is subsequently performed to remove unmasked portions of the copper seed layer 881L, i.e., to remove the portions of the copper seed layer 881L that are not masked by the copper pillar structures 880. An anisotropic etch process or an isotropic etch process may be used for the controlled etch back process. Remaining portions of the copper seed layer 881L may be incorporated into a respective one of the copper pillar structures 880.

The copper pillar structures 880 on the transfer wafer 390 may be arranged as a two-dimensional periodic array in which a unit pattern within a unit area UA is repeated along two horizontal directions. The unit area UA on the transfer wafer 390 may be of the same size as a unit area of repetition in the reconstituted wafer illustrated in FIGS. 13A, 13B, 14A, and 14B. Within each unit area, the pattern of the copper pillar structures 880 may be a mirror image pattern of the pattern of the first interposer bonding pads 588A on a composite interposer (400, 500) selected from the two-dimensional array of composite interposers (400, 500) that is present within the reconstituted wafer illustrated in FIGS. 13A, 13B, 14A, and 14B. The copper pillar structure 880 may have a height in a range from 20 microns to 200 microns, such as from 40 microns to 100 microns, although lesser and greater heights may also be used. The copper pillar structures 880 are not present in areas that correspond to the areas in which the second interposer bonding pads 588B and/or the surface mount dies 850 are present on the composite interposers (400, 500).

While an exemplary method for providing an array of copper pillar structures 880 on a transfer wafer 390 is described herein, alternative methods may also be used to provide an array of copper pillar structures 880 on a transfer substrate. As such, the present disclosure is not limited by any specific method of providing an array copper pillar structures 880 on a transfer substrate. Non-limiting examples of alternative method include casting the array of copper pillar structures 880 and using alternative electroplating methods to form the array of copper pillar structures 880. In some embodiment, the copper pillar structures 880 may be formed on pre-solder material portions (such as solder paste portions) and the pre-solder material portions may be employed in lieu of, or in addition to, the first interposer-side solder material portions 870A. Generally, alternative methods for providing an array of copper pillar structures 880 and/or first interposer-side solder material portions 870A may be used.

Figure 16:
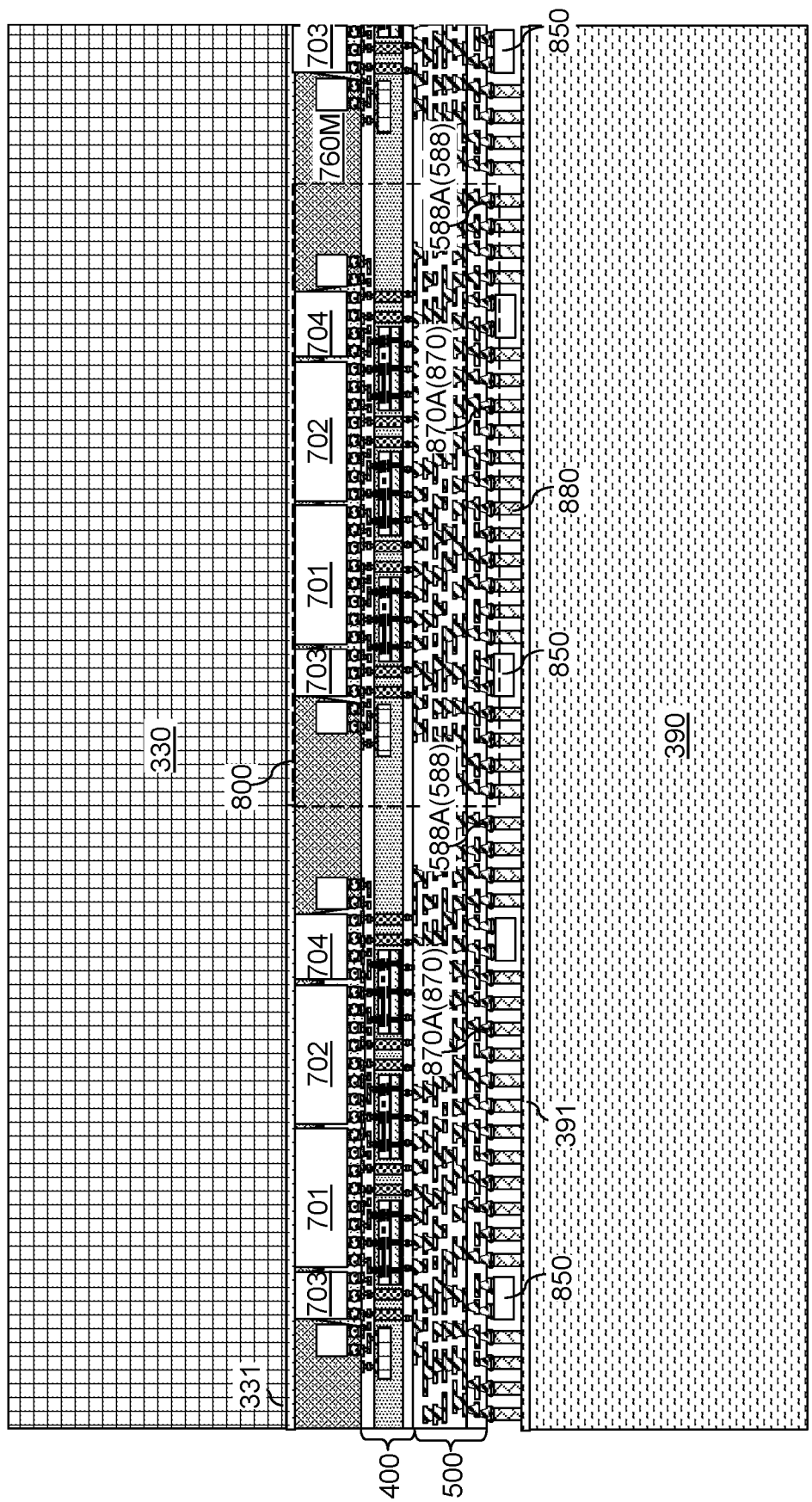
FIG. 16 is a vertical cross-sectional view of the first exemplary structure after bonding copper pillar structures on the transfer substrate to the reconstituted wafer according to the first embodiment of the present disclosure.

Referring to FIG. 16, the reconstituted wafer comprising an array of fan-out packages 800 may be disposed over the assembly of the transfer wafer 390, the adhesive layer 391, and the copper pillar structures 880. The assembly may be aligned to the reconstituted wafer such that each copper pillar structure 880 faces a respective first interposer bonding pad 588A. The assembly and the reconstituted wafer may be brought into contact with each other. The copper pillar structures 880 contact the first interposer-side solder material portions 870A, or is positioned within a reflow distance of the first interposer-side solder material portions 870A. In one embodiment, each second interposer bonding pad 588B may be located within an area of a respective opening within a respective array of copper pillar structures 880.

A reflow process may be performed to reflow the first interposer-side solder material portions 870A. The copper pillar structures 880 may be bonded to a respective one of the first interposer-side solder material portions 870A. Each of the copper pillar structures 880 may have an end surface that is bonded to a respective one of the first interposer-side solder material portions 870A.

Generally, each array of copper pillar structures 880 within a unit area UA may be bonded to a set of first interposer bonding pads 588A within a composite interposer (400, 500) using a respective set of first interposer-side solder material portions 870A. Each of the copper pillar structures 880 may have a respective horizontal cross-sectional shape that is invariant under translation along a vertical direction that is perpendicular to a horizontal surface of the reconstituted wafer on which the interposer bonding pads 588 are located. Each of the copper pillar structures 880 may be bonded to a respective first interposer bonding pad 588A through a first respective interposer-side solder material portion 870A. Each of the copper pillar structures 880 may have a respective interposer-side planar surface that faces a respective composite interposer (400, 500). The interposer-side planar surfaces of the copper pillar structures 880 may be in direct contact with the first interposer solder material portions 870A. In one embodiment, each of the interposer bonding pads 588 may be located on a horizontal surface of the composite interposer (400, 500) that is located in a horizontal plane. In one embodiment, each copper pillar structure 880 within the array of copper pillar structures 880 may have a height that is greater than a maximum thickness of the at least one surface mount die 850.

Figure 17A:
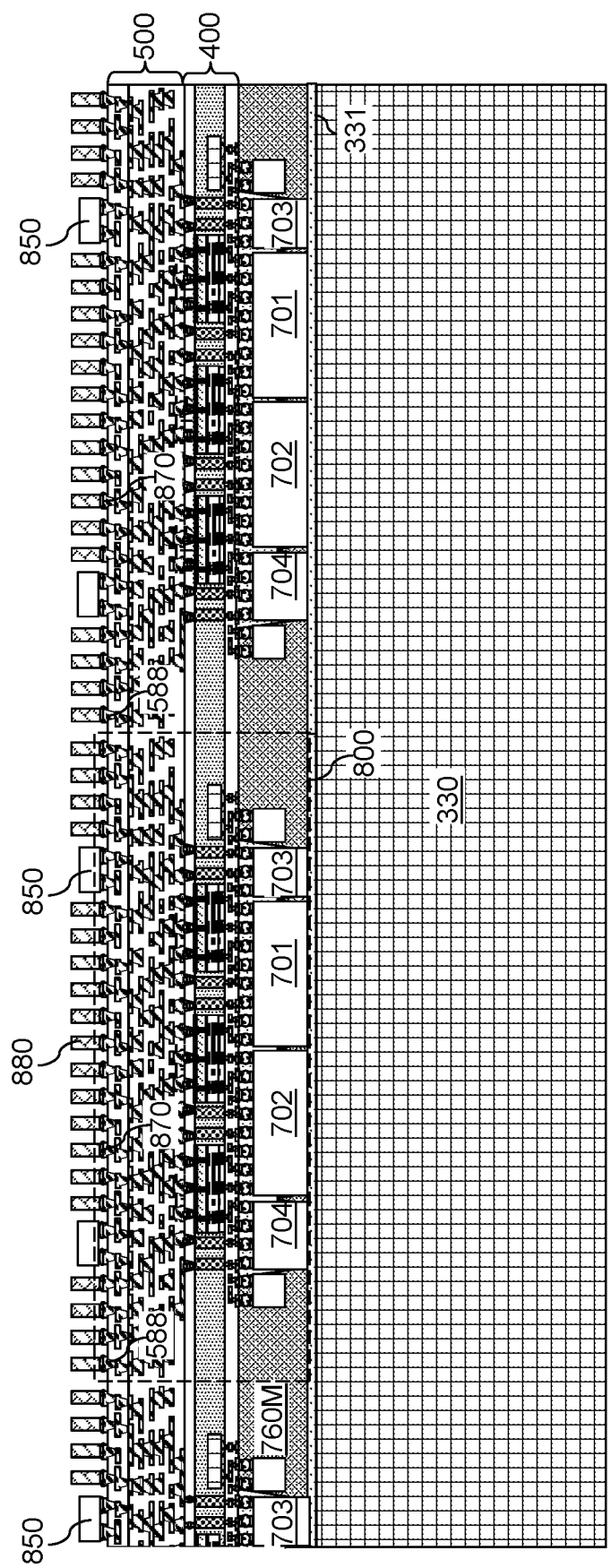
FIG. 17A is a vertical cross-sectional view of the first exemplary structure after removal of the transfer wafer according to the first embodiment of the present disclosure.
Figure 17B:
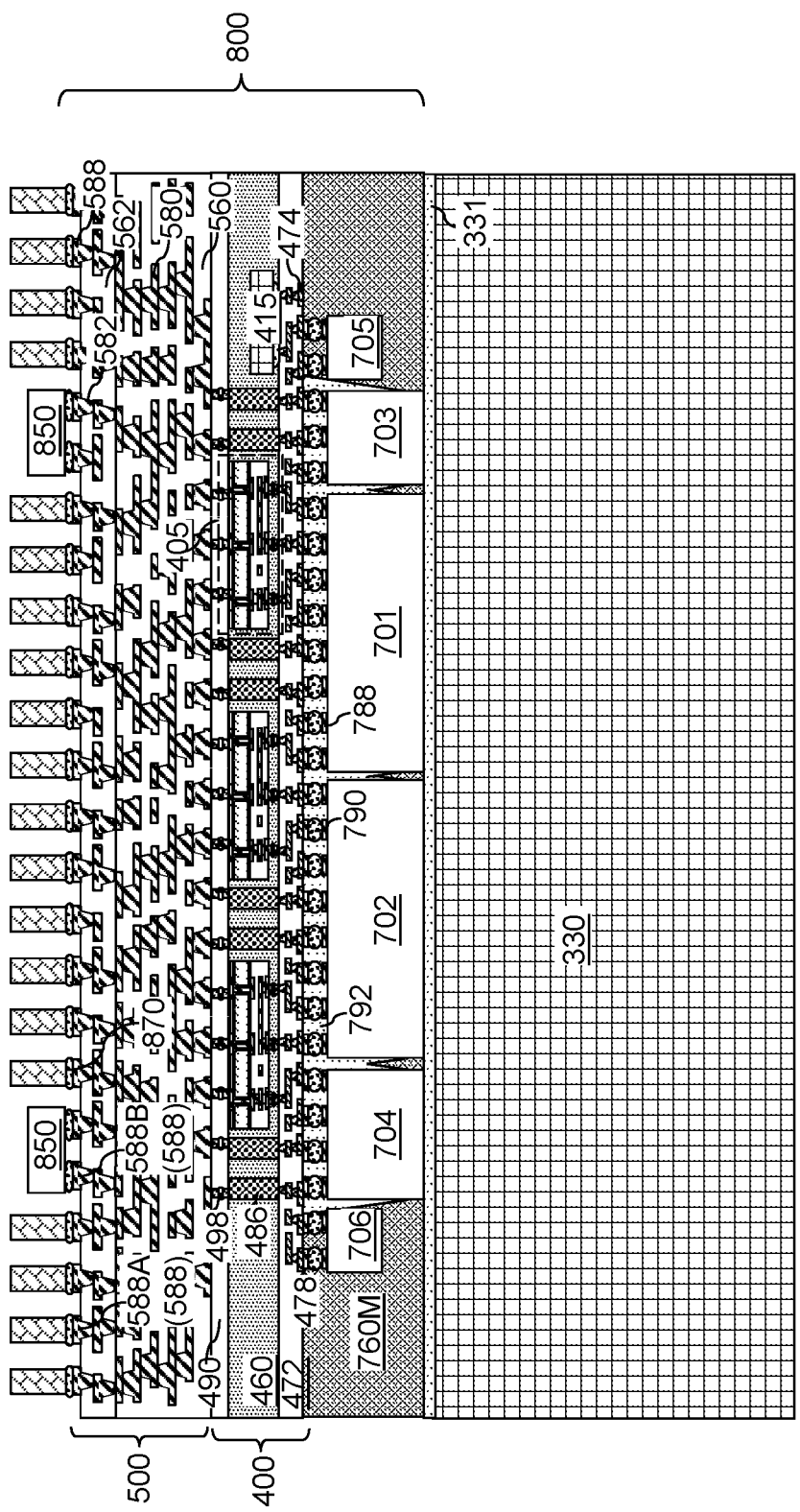
FIG. 17B is a vertical cross-sectional view of a magnified view of a unit area of the first exemplary structure of FIG. 17A.

Referring to FIGS. 17A and 17B, the transfer wafer 390 may be detached from the reconstituted wafer. In embodiments in which the transfer wafer 390 includes an optically transparent material and the adhesive layer 391 comprises a light-to-heat conversion material, irradiation through the transfer wafer 390 may be used to detach the transfer wafer 390. In embodiments in which the adhesive layer 391 comprises a thermally decomposable adhesive material, an anneal process or a laser irradiation may be used to detach the transfer wafer 390. A suitable clean process may be performed to remove residual portions of the adhesive layer 391. Planar end surfaces of the copper pillar structures 880 may be physically exposed. The physically exposed planar end surfaces of the copper pillar structures 880 are herein referred to as substrate-side planar surfaces.

Figure 18A:
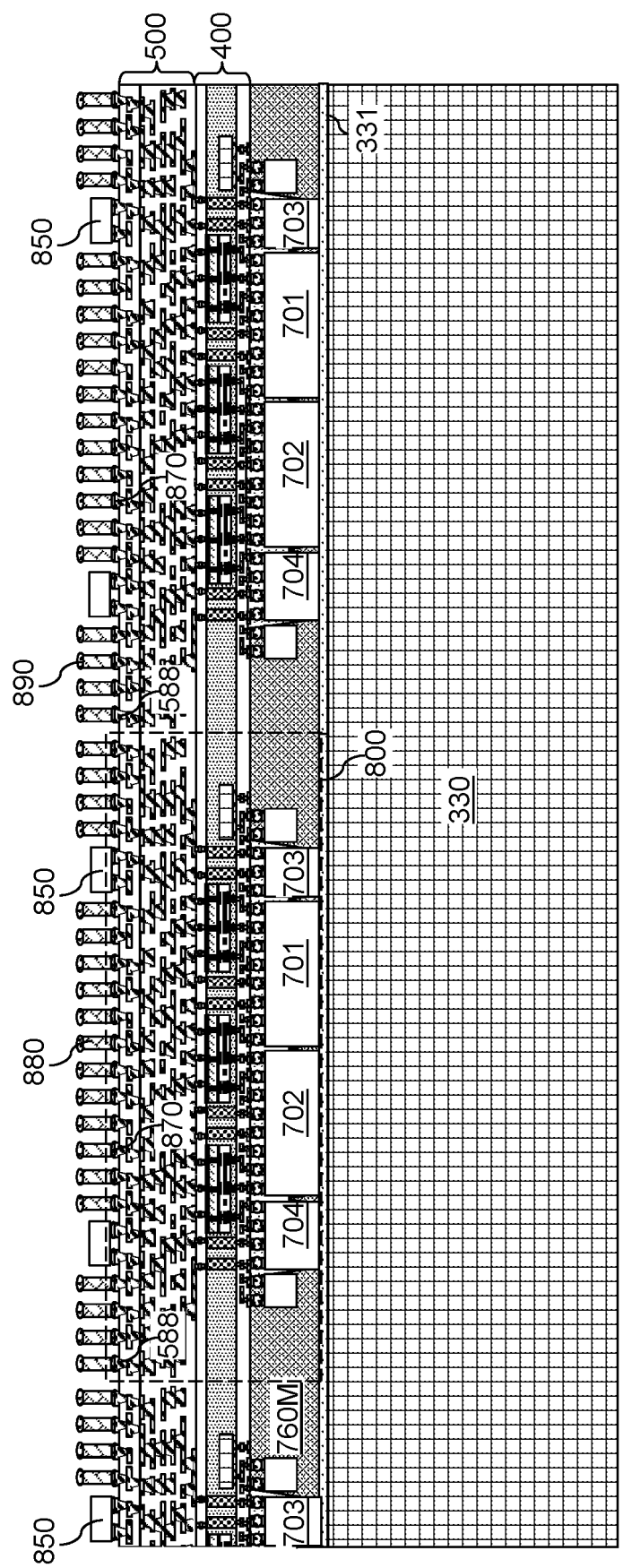
FIG. 18A is a vertical cross-sectional view of the first exemplary structure after attaching substrate-side solder material portions to the copper pillar structures according to the first embodiment of the present disclosure.
Figure 18B:
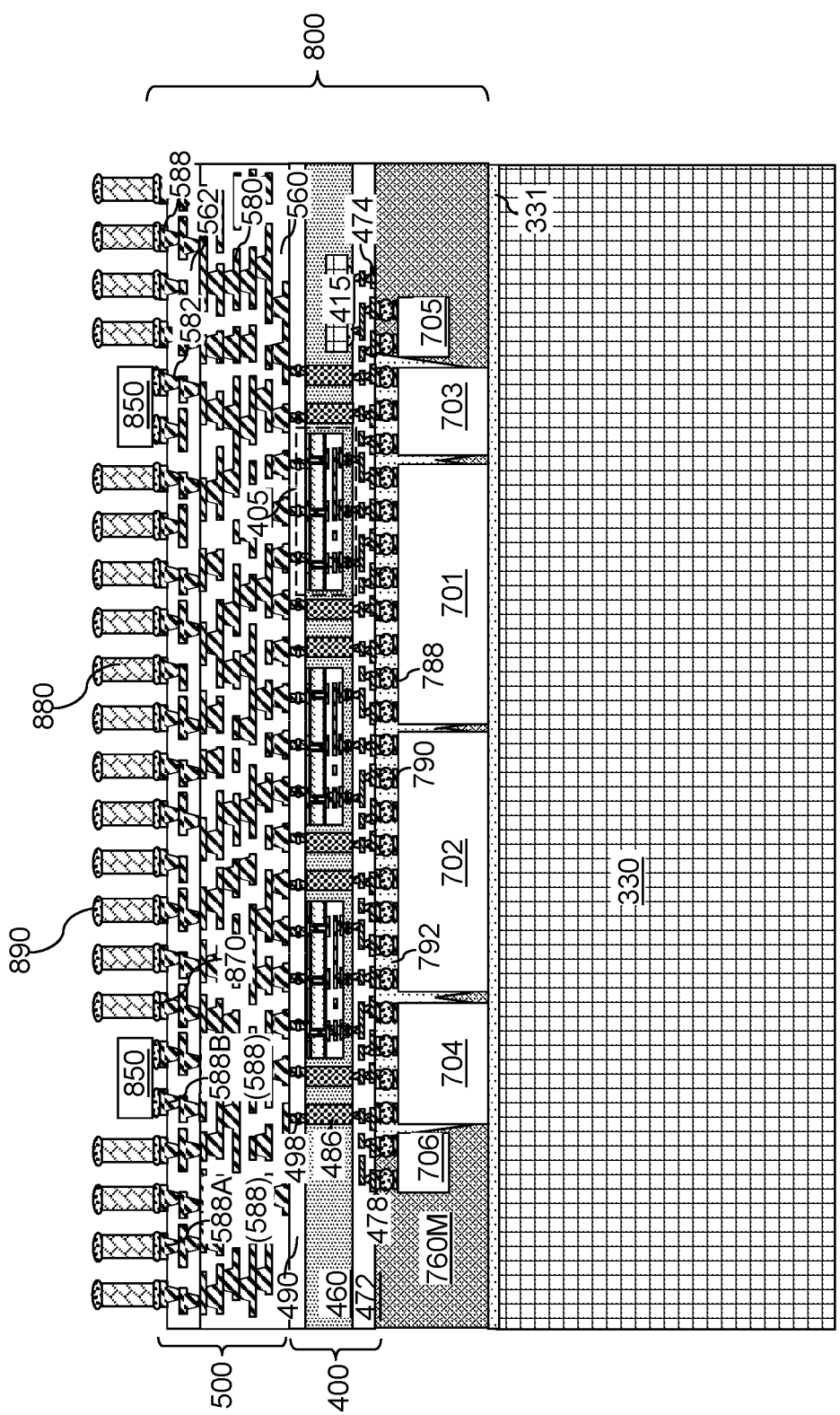
FIG. 18B is a vertical cross-sectional view of a magnified view of a unit area of the first exemplary structure of FIG. 18A.
Figure 18C:
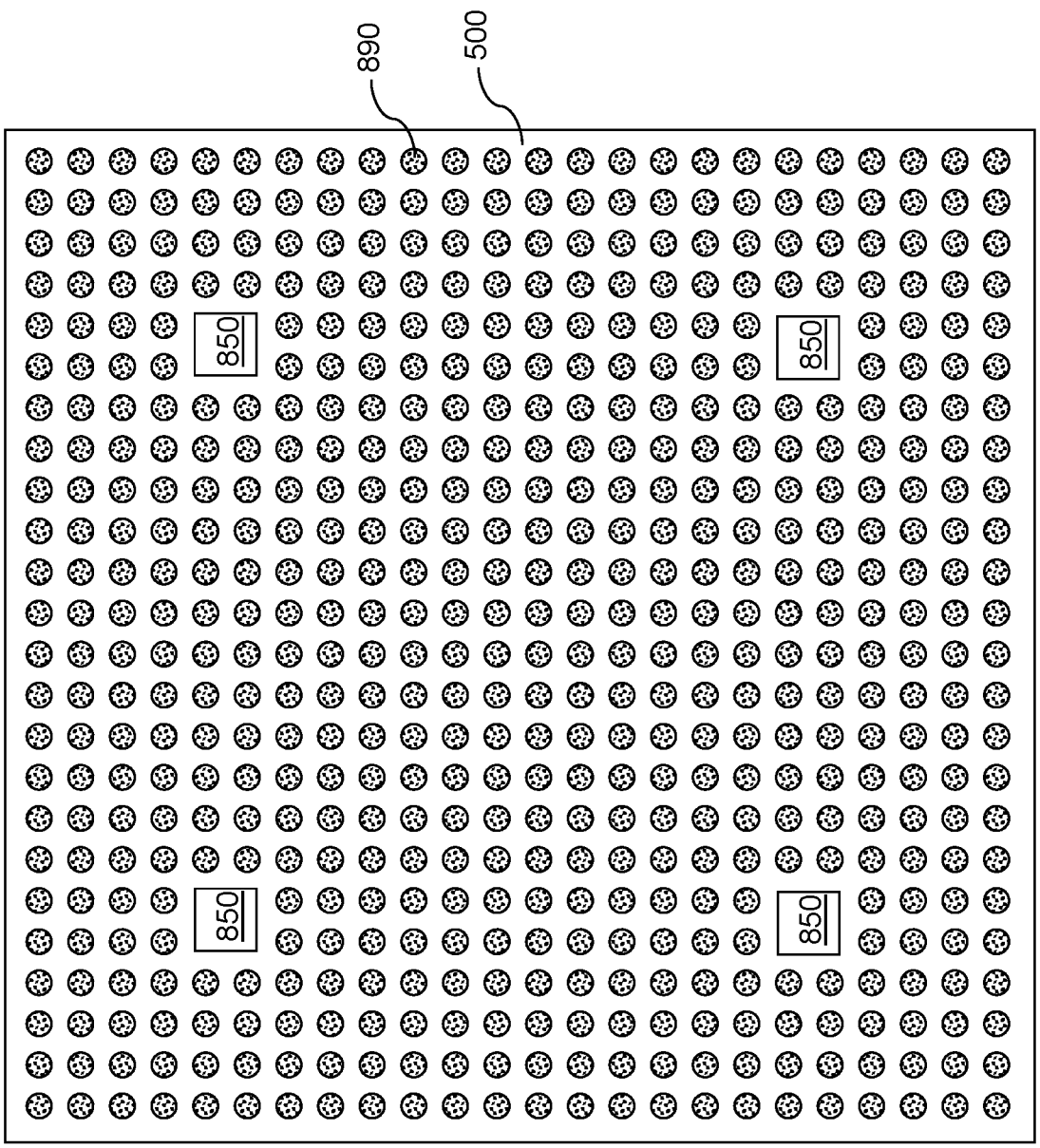
FIG. 18C is a top-down view of the unit area of the first exemplary structure of FIG. 18B.

Referring to FIGS. 18A-18C, substrate-side solder material portions 890 may be attached to the copper pillar structures 880. In an alternative process, the substrate-side solder material portions 890 may be applied to substrate bonding pads on packaging substrates to be subsequently bonded to a respective composite interposer (400, 500). In this embodiment, the processing steps of FIGS. 18A-18C may be omitted.

Figure 19:
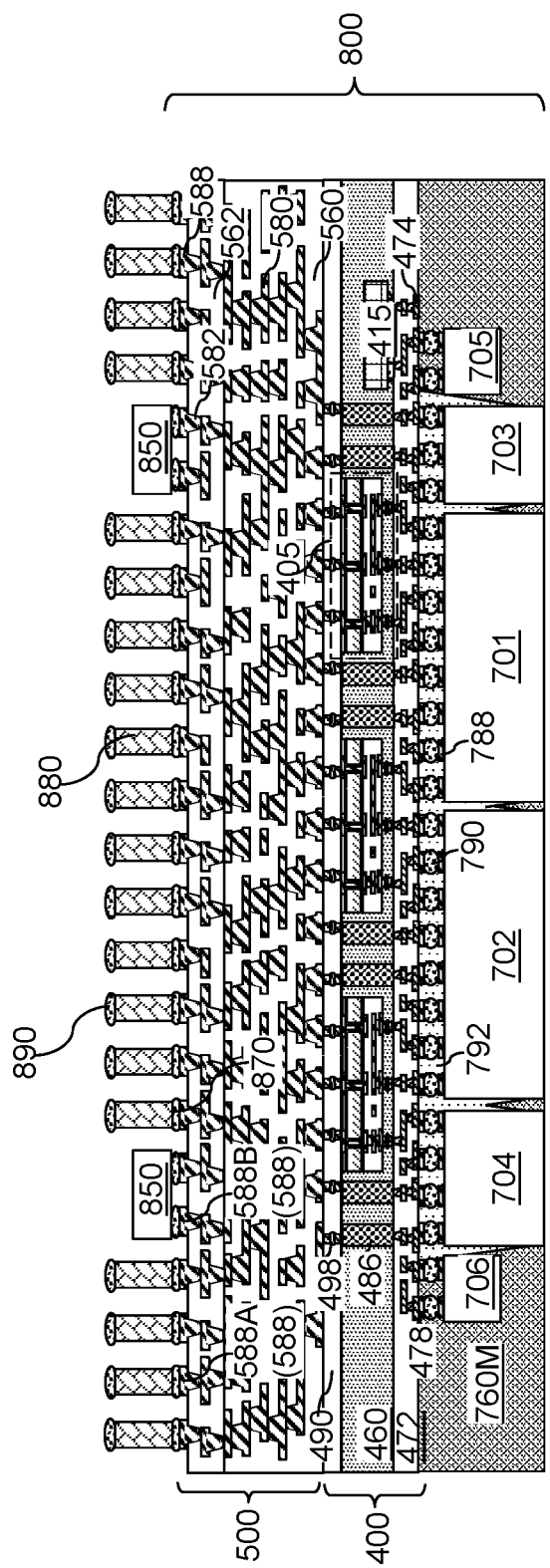
FIG. 19 is a vertical cross-sectional view of the first exemplary structure after formation of a fan-out package that is obtained by detaching the third carrier substrate and dicing the reconstituted wafer according to the first embodiment of the present disclosure.

Referring to FIG. 19, the third carrier wafer 330 may be detached from the reconstituted wafer. In embodiments in which the third carrier wafer 330 includes an optically transparent material and the third adhesive layer 331 comprises a light-to-heat conversion material, irradiation through the third carrier wafer 330 may be used to detach the third carrier wafer 330. In embodiments in which the third adhesive layer 331 comprises a thermally decomposable adhesive material, an anneal process or a laser irradiation may be used to detach the third carrier wafer 330. A suitable clean process may be performed to remove residual portions of the third adhesive layer 331. A horizontal surface of the die-level MC matrix 760M may be physically exposed.

The reconstituted wafer includes a two-dimensional array of composite interposers (400, 500), a two-dimensional array of sets of at least one semiconductor die (701, 702, 703, 704, 705, 706) that are bonded to a respective composite interposer (400, 500), and arrays of copper pillar structures 880 that are attached to a respective composite interposer (400, 500). The reconstituted wafer may be diced along dicing channels by performing a dicing process. The dicing channels correspond to the boundaries between neighboring pairs of unit areas. Each diced unit from the reconstituted wafer comprises a fan-out package 800 to which a respective array of copper pillar structures 880 and optional integrated passive devices 850 are attached. In other words, each diced portion of a two-dimensional array of fan-out packages 800 comprises a fan-out package 800. Each diced portion of the die-level MC matrix 760M constitutes a molding compound die frame 760, i.e., an MC die frame 760.

Generally, an array of copper pillar structures 880 may be attached to an assembly including an interposer (such as a composite interposer (400, 500)). The assembly may comprise a fan-out package 800. In one embodiment, the fan-out package 800 may comprise a molding compound die frame 760. In this embodiment, each sidewall of the molding compound die frame 760 is vertically coincident with a respective sidewall of the compound interposer (400, 500), i.e., overlies or underlies the respective sidewall of the compound interposer (400, 500) and is located within a same vertical plane that contains the respective sidewall of the compound interposer (400, 500).

Figure 20:
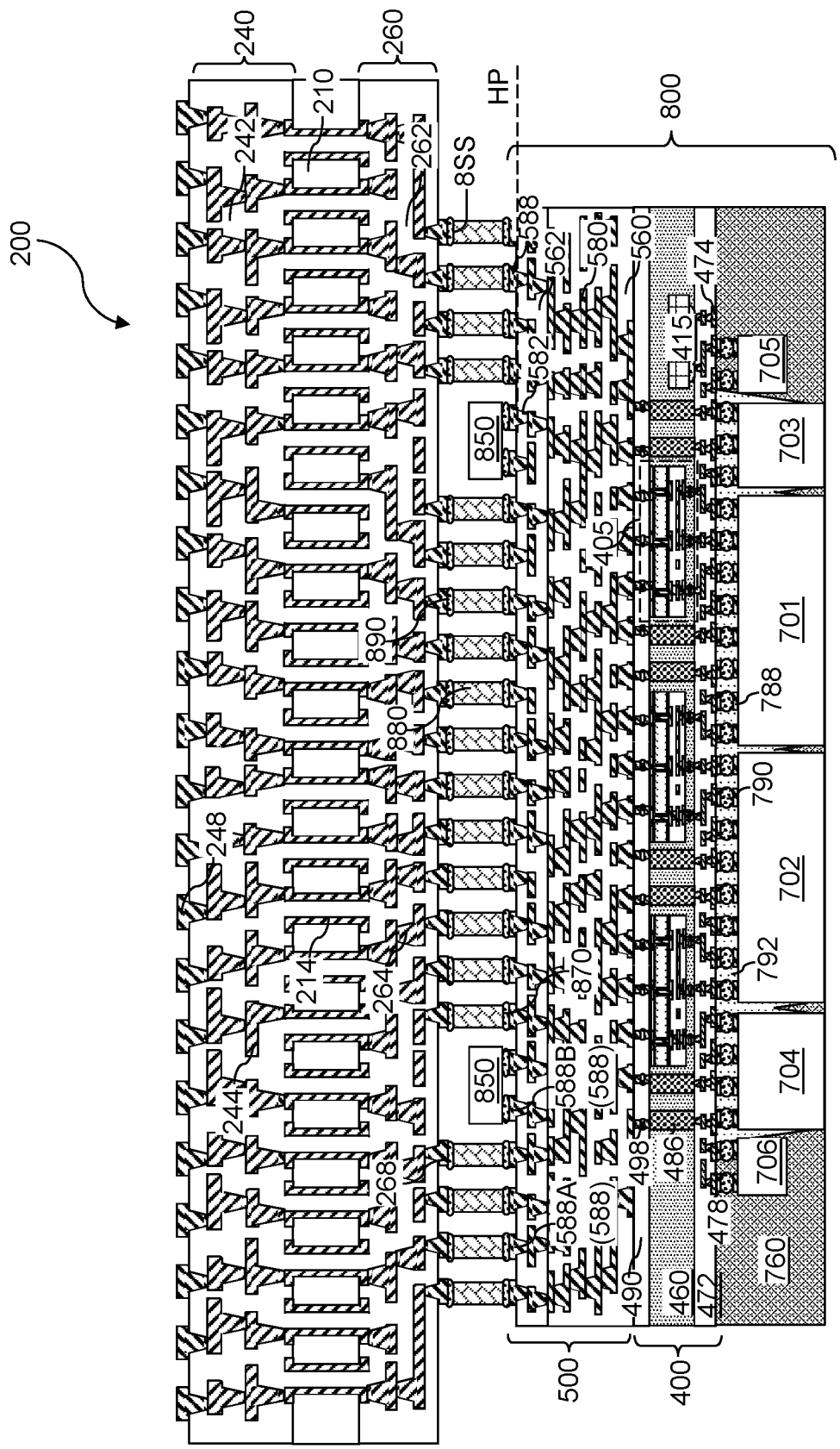
FIG. 20 is a vertical cross-sectional view of the first exemplary structure after attaching a packaging substrate to the fan-out package according to the first embodiment of the present disclosure.

Referring to FIG. 20, a packaging substrate 200 according to the first embodiment of the present disclosure may be provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layer, dielectric interlayers, and/or at least one embedded interposer (such as a silicon interposer). Such a system-integrated packaging substrate may include layer-to-layer interconnections using interposer-side solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, a SoIS may be used in lieu of a cored packaging substrate. In embodiments in which a SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

In one embodiment, the packaging substrate 200 comprises a first horizontal surface configured to face an assembly including a fan-out package 800. The first horizontal surface is the surface that faces the substrate-facing horizontal surface of the fan-out package 800 during a subsequent assembly process. The packaging substrate 200 further comprises a second horizontal surface located on an opposite side of the first horizontal surface. The substrate bonding pads 268 of the packaging substrate 200 may be located on the first horizontal surface of the packaging substrate 200, and may have a mirror image pattern of the pattern of the copper pillar structures 880. Thus, the substrate bonding pads 268 are not present within areas that overlap with the second interposer bonding pads 588A or with the integrated passive devices 850.

The assembly including the fan-out package 800 and the array of copper pillar structures 880 may be attached to the packaging substrate 200 using the substrate-side solder material portions 890. Specifically, each of the substrate-side solder material portions 890 may be bonded to a respective one of the substrate bonding pads 268 and to a respective one of the copper pillar structures 880. A reflow process may be performed to reflow the substrate-side solder material portions 890 such that each substrate-side solder material portion 890 is bonded to a respective one of the substrate bonding pads 268 and to a respective one of the copper pillar structures 880.

Generally, a packaging substrate 200 may be attached to the array of copper pillar structures 880 on an assembly including an interposer (such as a composite interposer (400, 500)) by bonding the array of copper pillar structures 880 to substrate bonding pads 268 located on the packaging substrate 200 using substrate-side solder material portions 890. In one embodiment, the substrate bonding pads 268 are located on a first horizontal surface of the packaging substrate 200 that faces the composite interposer (400, 500). In one embodiment, probability of accidental collision between the at least one surface mount die 850 and the packaging substrate 200 may be reduced by not forming substrate bonding pads 268 in areas of the surface mount dies 850. In one embodiment, each area of the first horizontal surface that has an areal overlap with the at least one surface mount die 850 is free of any bonding pad.

The array of copper pillar structures 880 may be disposed between the composite interposer (400, 500) and the packaging substrate 200. Each of the copper pillar structures 880 is bonded to a respective interposer bonding pad (such as a respective first interposer bonding pad 588A) on the composite interposer (400, 500) through a respective first interposer-side solder material portion 870A, and to a respective substrate bonding pad 268 located on the packaging substrate 200 through a respective substrate-side solder material portion 890.

In one embodiment, each of the copper pillar structures 880 has a respective interposer-side planar surface that faces the interposer (400, 500) and a respective substrate-side planar surface 8SS. Each of the interposer bonding pads 588 is located on a horizontal surface of the composite interposer (400, 500) that faces the packaging substrate 200 and is located in a horizontal plane HP. Each of the substrate-side planar surfaces 8SS of the copper pillar structures 880 may be more distal from the horizontal plane HP than a most distal surface of the at least one surface mount die 850 from the horizontal plane HP.

Figure 21A:
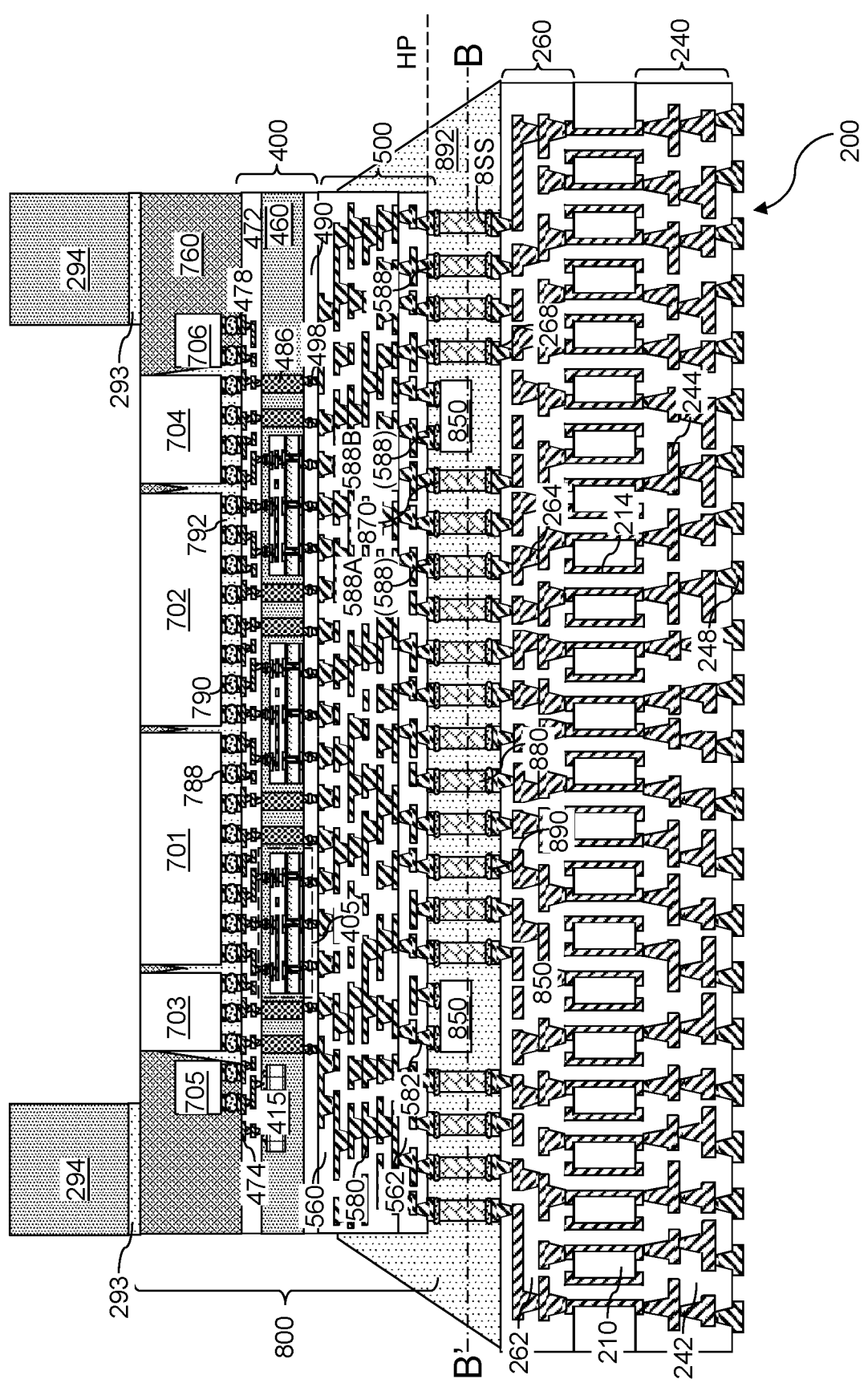
FIG. 21A is a vertical cross-sectional view of the first exemplary structure after formation of an interposer-package underfill material portion and attaching a stiffener ring according to the first embodiment of the present disclosure.
Figure 21B:
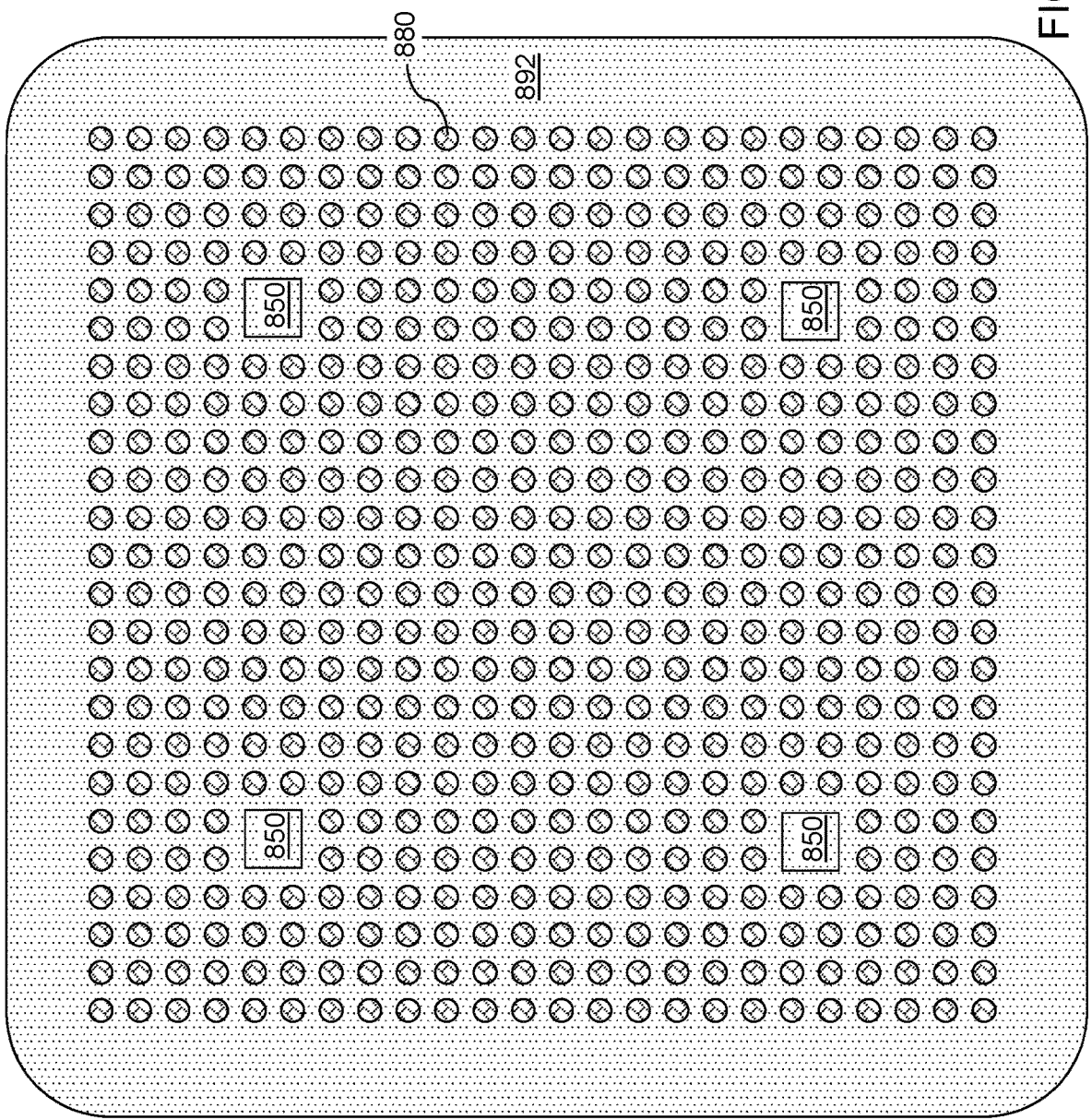
FIG. 21B is a horizontal cross-sectional of the exemplary structure along the horizontal plane B-B' of FIG. 21A.

Referring to FIGS. 21A and 21B, an underfill material may be applied into a gap between the composite interposer (400, 500) and the packaging substrate 200. The underfill material may comprise any underfill material known in the art. An underfill material portion may be formed around the array of copper pillar structures 880, the array of interposer-side solder material portions 870, and the array of substrate-side solder material portions 890 in the gap between the composite interposer (400, 500) and the packaging substrate 200. This underfill material portion is formed between the composite interposer (400, 500) and the packaging substrate 200, and thus, is herein referred to as an interposer-package underfill material portion 892, or as an IP underfill material portion 892. The IP underfill material portion 892 may laterally surround the array of copper pillar structures 880, and may contact a first horizontal surface of the packaging substrate 200 and a horizontal surface of the composite interposer (400, 500) that faces the packaging substrate 200. In one embodiment, each sidewall of the copper pillar structures 880 is in contact with the IP underfill material portion 892.

A stiffener ring 294 may be attached to the physically exposed surface of the molding compound die frame 760 (i.e., an MC die frame 760) using, for example, an adhesive layer 293.

Figure 22A:
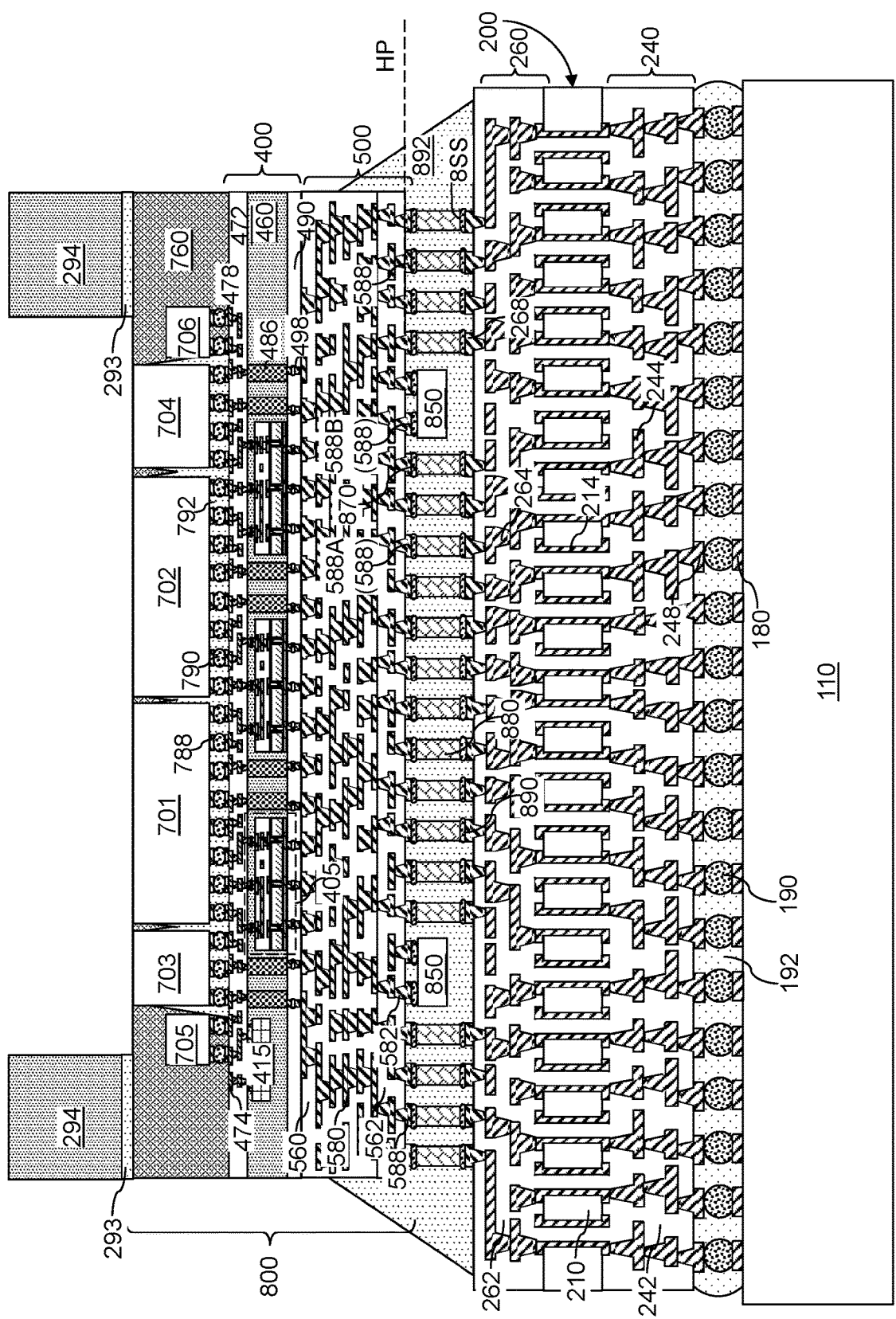
FIG. 22A is a vertical cross-sectional view of the first exemplary structure after attaching the packaging substrate to a printed circuit board according to the first embodiment of the present disclosure.

Referring to FIG. 22A, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Figure 22B:
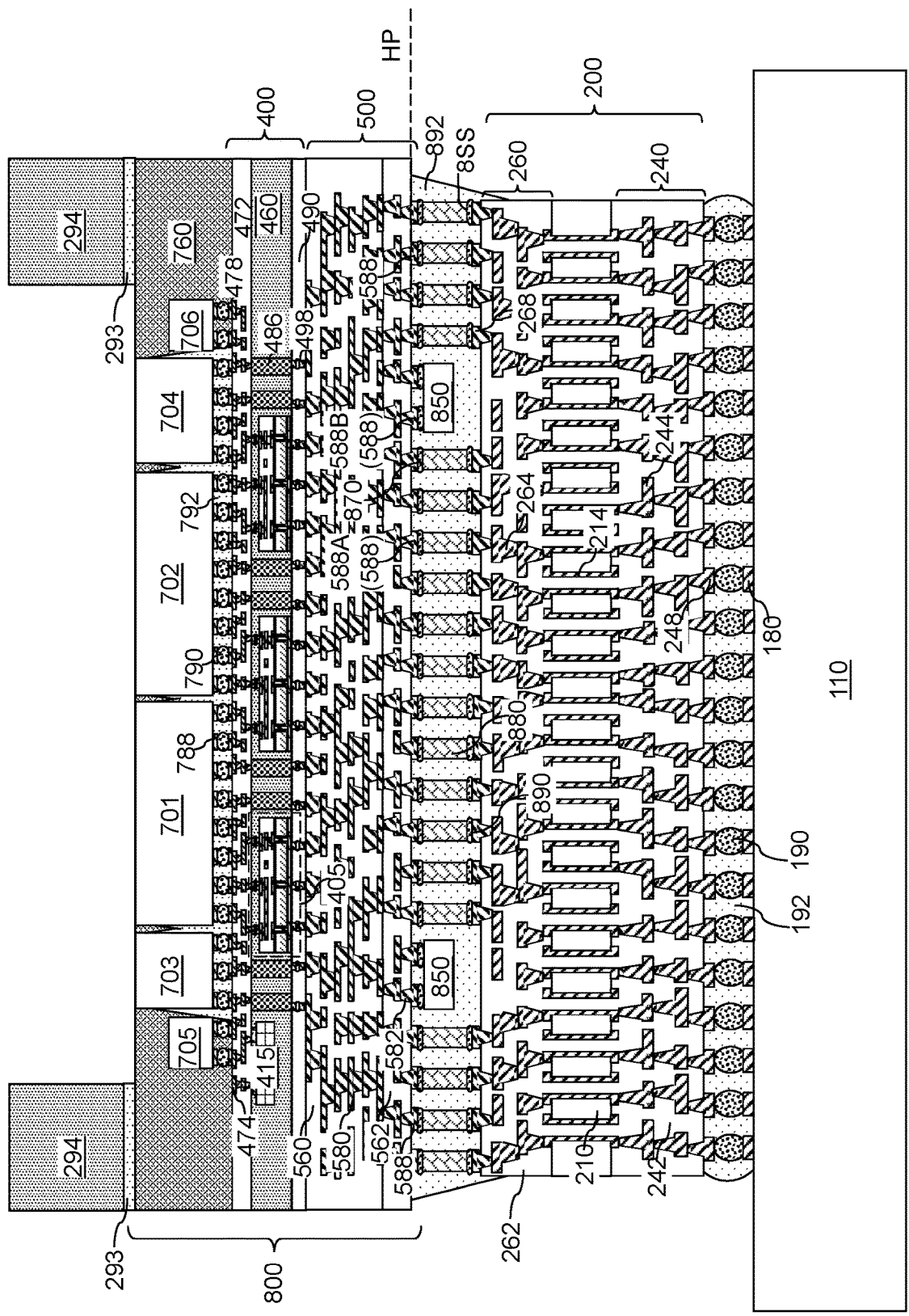
FIG. 22B is a vertical cross-sectional view of a first alternative configuration of the first exemplary structure after attaching the packaging substrate to a printed circuit board according to the first embodiment of the present disclosure.

Referring to FIG. 22B, a first alternative configuration of the first exemplary structure is illustrated. The first alternative configuration corresponds to an embodiment in which the packaging substrate 200 has a lesser lateral dimension than the composite interposer (400, 500). Generally, there is no limitation on the relative size of the composite interposer (400, 500) and the packaging substrate 200.

Figure 22C:
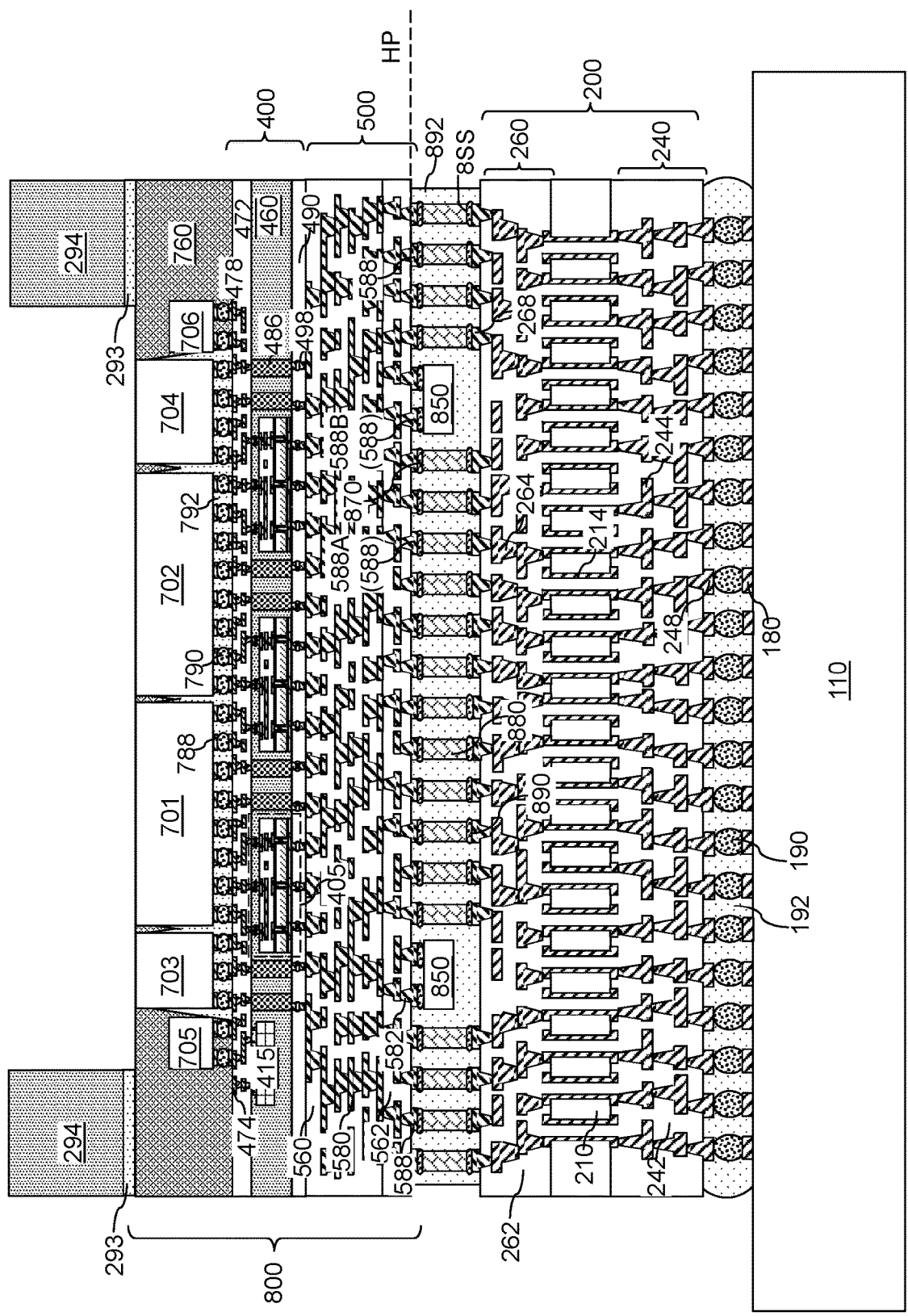
FIG. 22C is a vertical cross-sectional view of a second alternative configuration of the first exemplary structure after attaching the packaging substrate to a printed circuit board according to the first embodiment of the present disclosure.

Referring to FIG. 22C, a second alternative configuration of the first exemplary structure is illustrated. The second alternative configuration corresponds to an embodiment in which the packaging substrate 200 has a same set of lateral dimensions as the composite interposer (400, 500). In this embodiment, sidewalls of the composite interposer (400, 500) may be vertically coincident with sidewalls of the packaging substrate 200.

Generally, a printed circuit board 100 may be bonded to the packaging substrate 200 through an array of solder joints 190. An additional underfill material portion (such as the board-substrate underfill material portion 192) may be located between the printed circuit board 100 and the packaging substrate 200, and may laterally surround the solder joints 190.

Figure 23:
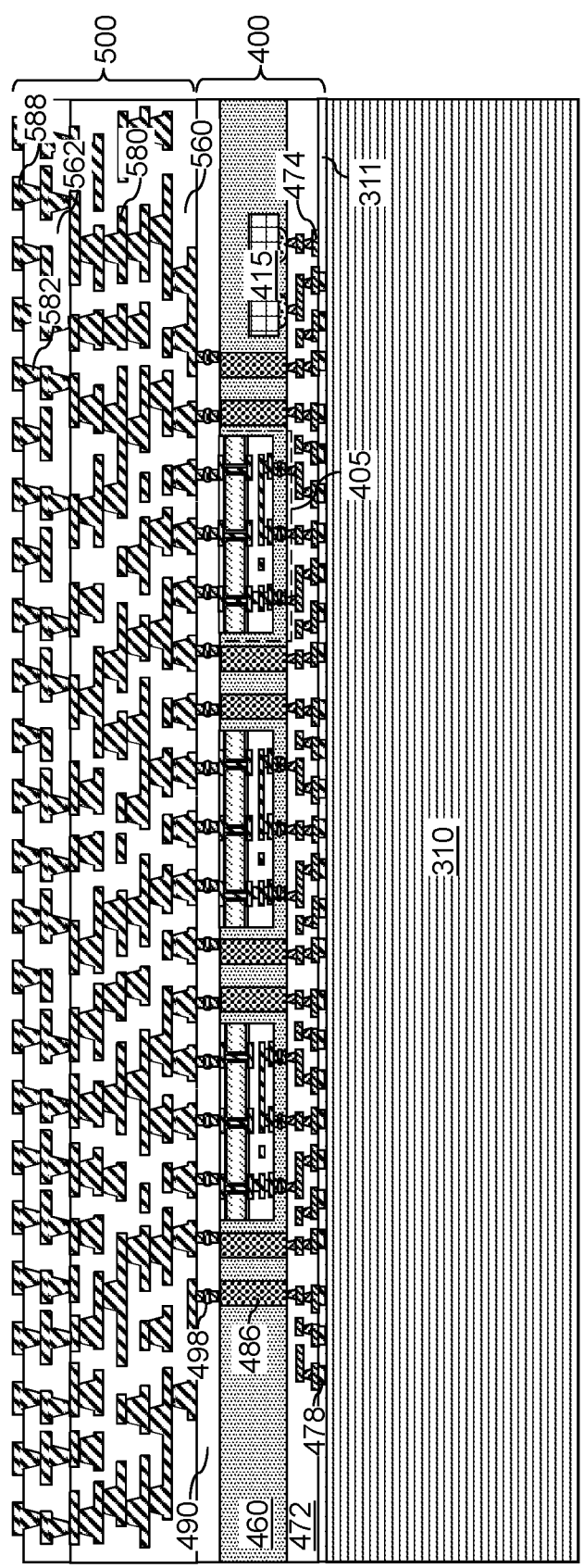
FIG. 23 is a vertical cross-sectional view of a second exemplary structure after formation of organic interposers on the reconstituted wafer according to a second embodiment of the present disclosure.

Referring to FIG. 23, a second exemplary structure according to a second embodiment of the present disclosure is illustrated, which may be the same as the first exemplary structure illustrated in FIG. 7. Each composite interposer (400, 500) constitutes an in-process structure including interposer bonding pads 588.

Figure 24:
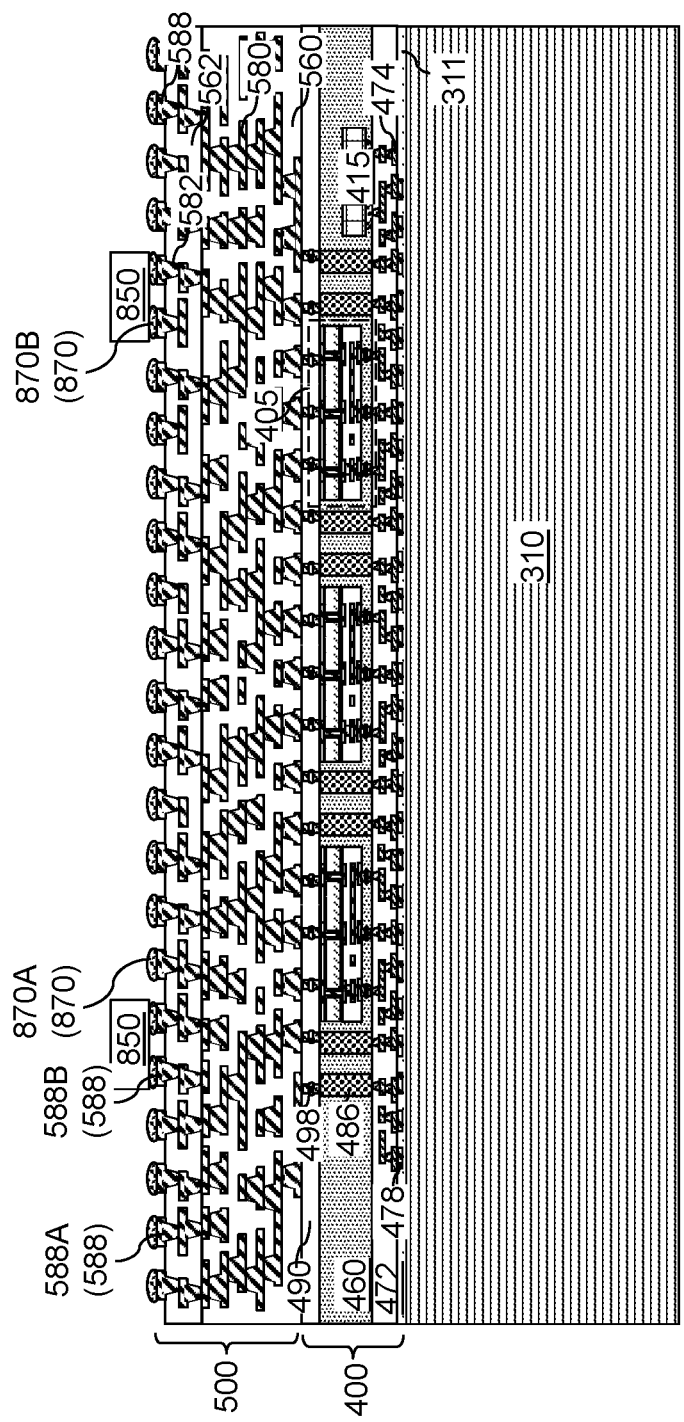
FIG. 24 is a vertical cross-sectional view of the second exemplary structure after attaching interposer-side solder material portions to interposer bonding pads and attaching surface mount dies to a subset of the interposer-side solder material portions according to an embodiment of the present disclosure.

Referring to FIG. 24, the processing steps of FIGS. 13A, 13B, 14A, and 14B may be performed while the reconstituted wafer is attached to the first carrier substrate 310 through the first adhesive layer 311. In one embodiment, the composite interposer (400, 500) includes first interposer bonding pads 588A and second interposer bonding pads 588B. At least one surface mount die 850 may be bonded to the second interposer bonding pads 588B through a respective array of second interposer-side solder material portions 870B as described above.

Figure 14A:
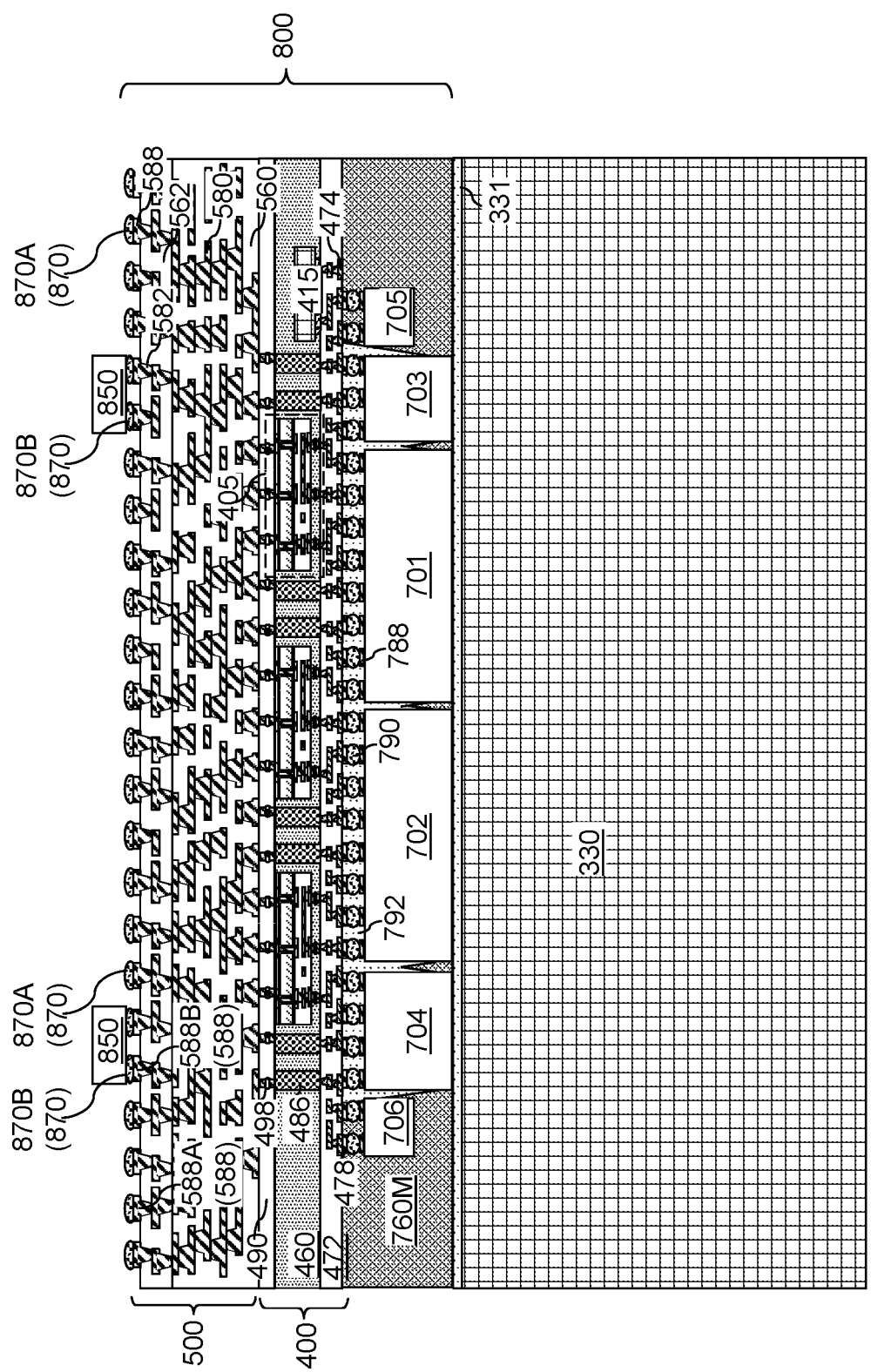
FIG. 14A is a magnified view of a unit area of the first exemplary structure of FIG. 14A.
Figure 25:
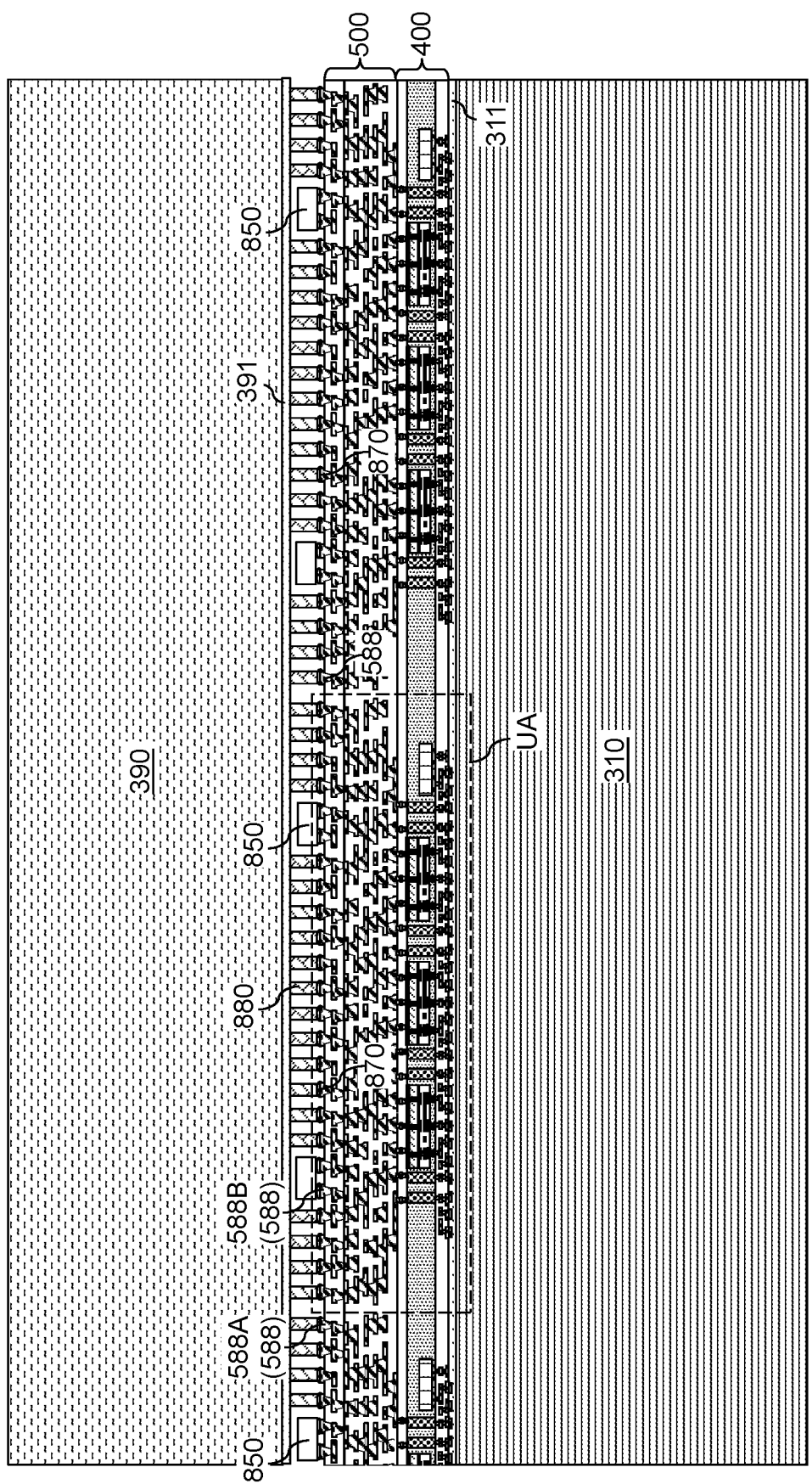
FIG. 25 is a vertical cross-sectional view of the second exemplary structure after bonding copper pillar structures on the transfer substrate to the reconstituted wafer according to the second embodiment of the present disclosure.

Referring to FIG. 25, copper pillar structures 880 may be formed on a transfer wafer 390 by performing the processing steps of FIGS. 15A-15D. Subsequently, the processing steps of FIG. 16 may be performed mutatis mutandis to bond the copper pillar structures 880 to the first interposer-side solder material portions 870A. Specifically, the reconstituted wafer on the first carrier wafer 310 as provided at the processing steps of FIG. 14 is used in the second embodiment in lieu of a reconstituted wafer provided at the processing steps of FIGS. 13A, 13B, 14A, and 14B. For example, an in-process structure comprising an array of composite interposers (400, 500) may be disposed over the assembly of the transfer wafer 390, the adhesive layer 391, and the copper pillar structures 880. The assembly may be aligned to the reconstituted wafer such that each copper pillar structure 880 faces a respective first interposer bonding pad 588A. The assembly and the reconstituted wafer may be brought into contact with each other. The copper pillar structures 880 contact the first interposer-side solder material portions 870A, or is positioned within a reflow distance of the first interposer-side solder material portions 870A. In one embodiment, each second interposer bonding pad 588B may be located within an area of a respective opening within a respective array of copper pillar structures 880.

A reflow process may be performed to reflow the first interposer-side solder material portions 870A. The copper pillar structures 880 are bonded to a respective one of the first interposer-side solder material portions 870A. Each of the copper pillar structures 880 may have an end surface that is bonded to a respective one of the first interposer-side solder material portions 870A.

Generally, each array of copper pillar structures 880 within a unit area UA may be bonded to a set of first interposer bonding pads 588A within a composite interposer (400, 500) using a respective set of first interposer-side solder material portions 870A. Each of the copper pillar structures 880 has a respective horizontal cross-sectional shape that is invariant under translation along a vertical direction that is perpendicular to a horizontal surface of the reconstituted wafer on which the interposer bonding pads 588 are located. Each of the copper pillar structures 880 may be bonded to a respective first interposer bonding pad 588A through a first respective interposer-side solder material portion 870A. Each of the copper pillar structures 880 may have a respective interposer-side planar surface that faces a respective composite interposer (400, 500). The interposer-side planar surfaces of the copper pillar structures 880 may be in direct contact with the first interposer solder material portions 870A. In one embodiment, each of the interposer bonding pads 588 may be located on a horizontal surface of the composite interposer (400, 500) that is located in a horizontal plane. In one embodiment, each copper pillar structure 880 within the array of copper pillar structures 880 may have a height that is greater than a maximum thickness of the at least one surface mount die 850.

Figure 26:
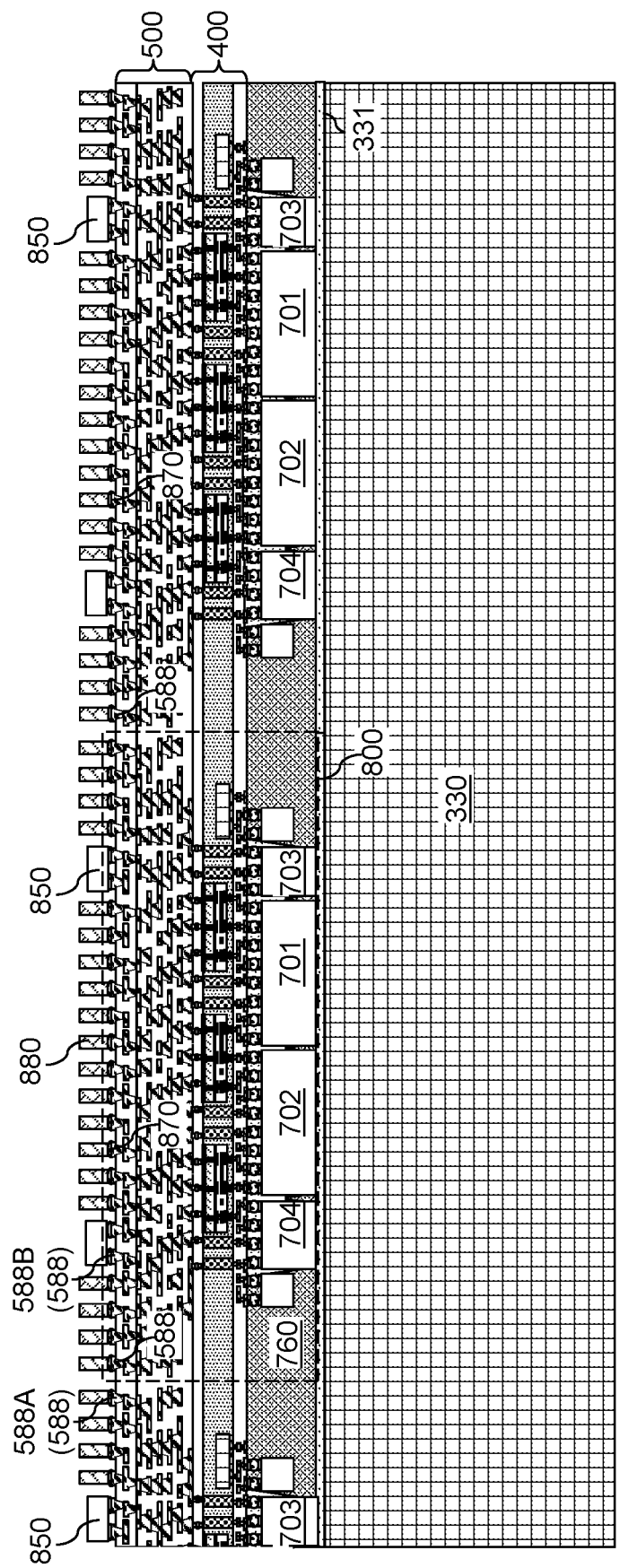
FIG. 26 is a vertical cross-sectional view of the second exemplary structure after removal of the transfer wafer according to the second embodiment of the present disclosure.
Figure 27:
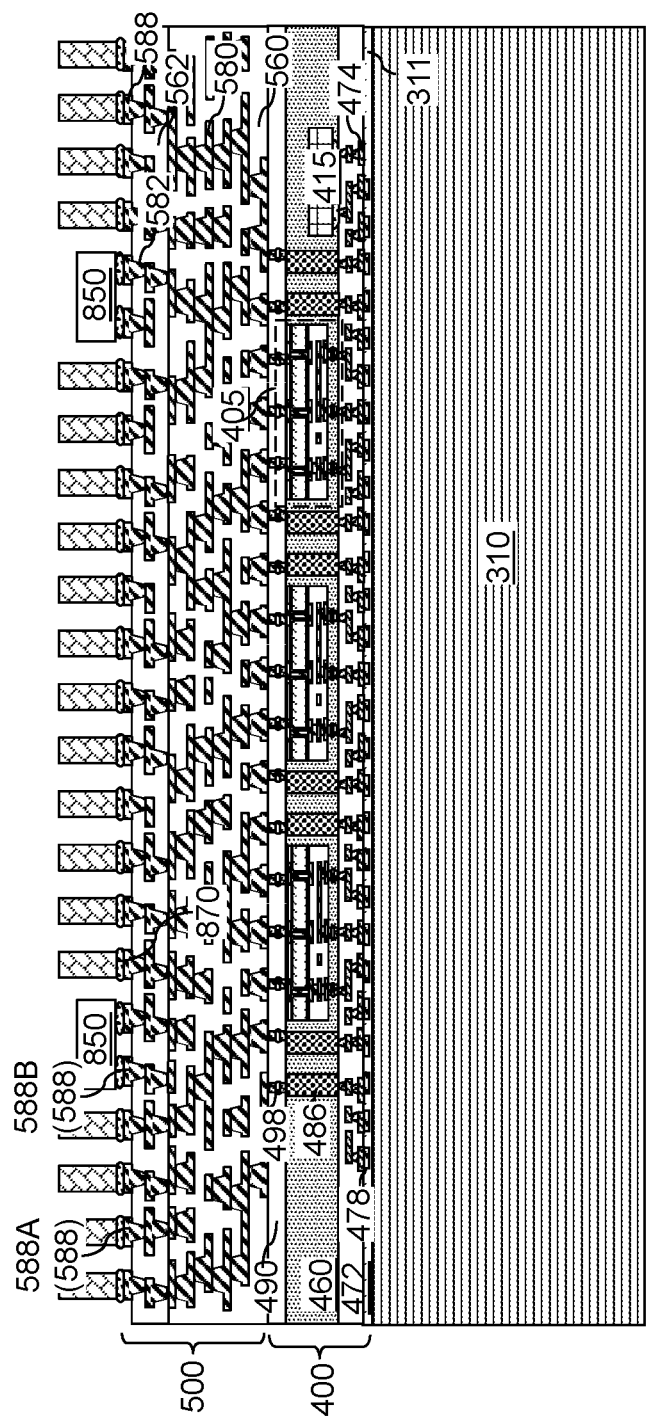
FIG. 27 is a vertical cross-sectional view of a magnified view of a unit area of the second exemplary structure of FIG. 26.

Referring to FIGS. 26 and 27, the processing steps of FIGS. 17A and 17B may be performed to detach the transfer wafer 390 from the reconstituted wafer of the second exemplary structure. The adhesive layer 391 may be removed, and a suitable clean process may be performed.

Figure 28:
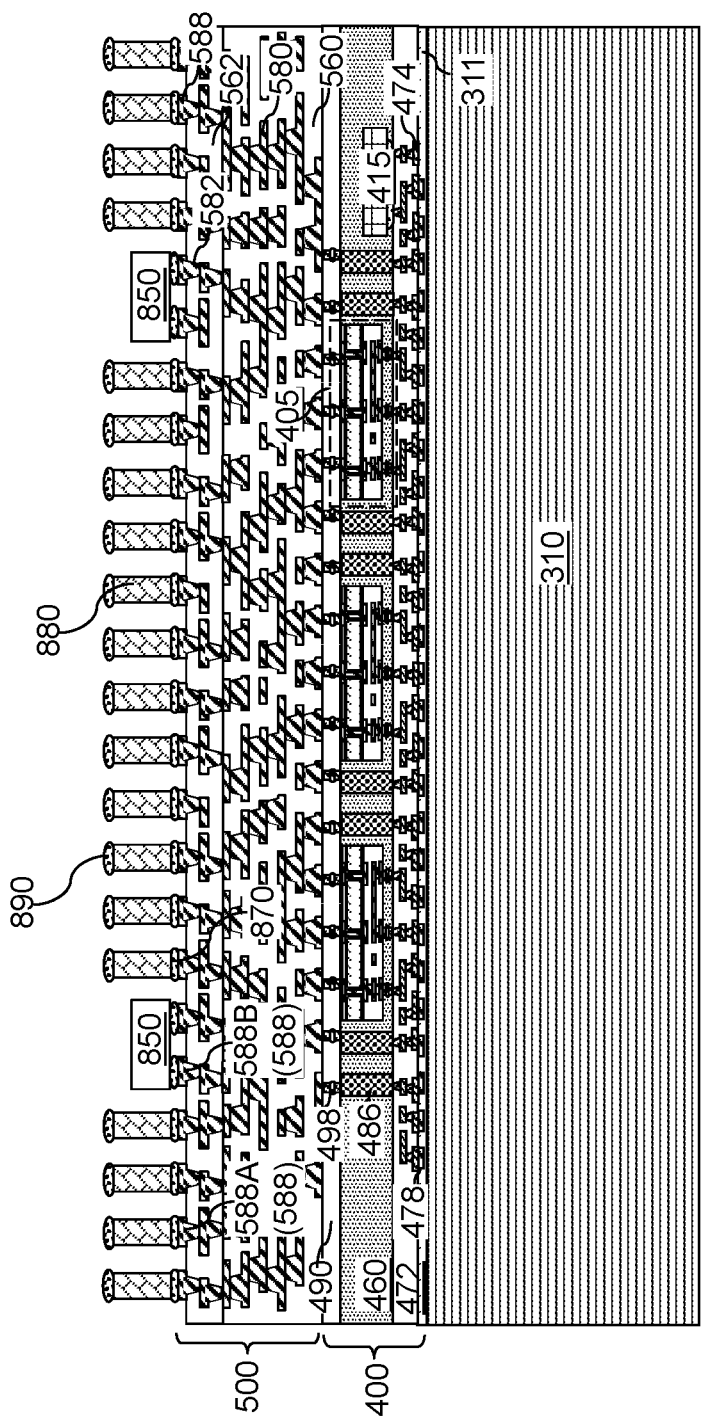
FIG. 28 is a vertical cross-sectional view of the second exemplary structure after attaching substrate-side solder material portions to the copper pillar structures according to the second embodiment of the present disclosure.

Referring to FIG. 28, substrate-side solder material portions 890 may be attached to the copper pillar structures 880. In an alternative process, the substrate-side solder material portions 890 may be applied to substrate bonding pads on packaging substrates to be subsequently bonded to a respective composite interposer (400, 500). In this embodiment, the processing steps of FIG. 28 may be omitted.

Figure 29:
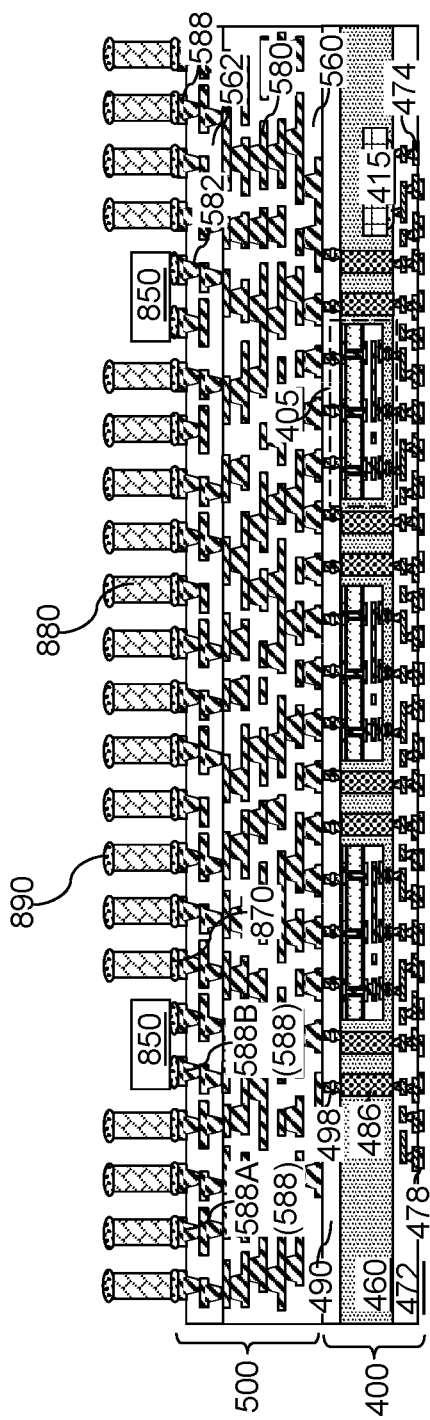
FIG. 29 is a vertical cross-sectional view of the second exemplary structure after formation of a composite interposer that is obtained by detaching the first carrier substrate and dicing the reconstituted wafer according to the second embodiment of the present disclosure.

Referring to FIG. 29, the first carrier wafer 310 may be detached from the reconstituted wafer. In embodiments in which the first carrier wafer 310 includes an optically transparent material and the first adhesive layer 311 comprises a light-to-heat conversion material, irradiation through the first carrier wafer 310 may be used to detach the third carrier wafer 330. In embodiments in which the first adhesive layer 311 comprises a thermally decomposable adhesive material, an anneal process or a laser irradiation may be used to detach the first carrier wafer 310. A suitable clean process may be performed to remove residual portions of the third adhesive layer 331. A horizontal surface of each LSI-containing interposer 400 may be physically exposed.

The reconstituted wafer includes a two-dimensional array of composite interposers (400, 500) and arrays of copper pillar structures 880 that are attached to a respective composite interposer (400, 500). The reconstituted wafer may be diced along dicing channels by performing a dicing process. The dicing channels correspond to the boundaries between neighboring pairs of unit areas. Each diced unit from the reconstituted wafer comprises a composite interposer (400, 500) to which a respective array of copper pillar structures 880 and optional integrated passive devices 850 are attached. In other words, each diced portion of a two-dimensional array of composite interposers (400, 500) comprises a composite interposer (400, 500). Generally, an array of copper pillar structures 880 may be attached to an assembly including an interposer (such as a composite interposer (400, 500)).

Figure 30:
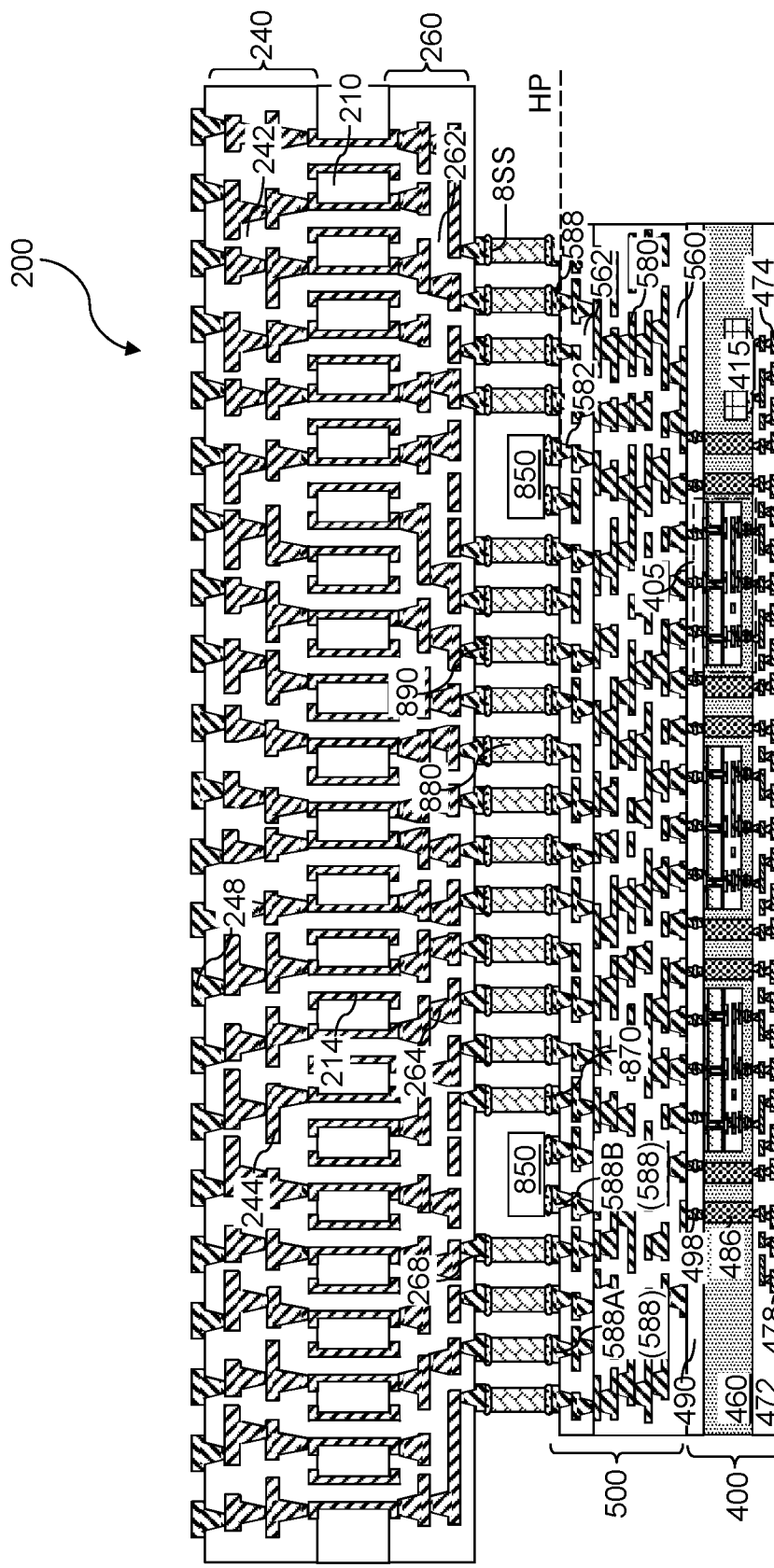
FIG. 30 is a vertical cross-sectional view of the second exemplary structure after attaching a packaging substrate to the fan-out package according to the second embodiment of the present disclosure.

Referring to FIG. 30, the processing steps of FIG. 20 may be performed mutatis mutandis to attach a packaging substrate 200 to the array of copper pillar structures 880. Thus, the array of copper pillar structures 880 may be attached to substrate bonding pads 268 located on the packaging substrate 200 using substrate-side solder material portions 890. In one embodiment, the substrate bonding pads 268 are located on a first horizontal surface of the packaging substrate 200 that faces the composite interposer (400, 500). In one embodiment, probability of accidental collision between the at least one surface mount die 850 and the packaging substrate 200 may be reduced by not forming substrate bonding pads 268 in areas of the surface mount dies 850. In one embodiment, each area of the first horizontal surface that has an areal overlap with the at least one surface mount die 850 is free of any bonding pad.

The array of copper pillar structures 880 is disposed between the composite interposer (400, 500) and the packaging substrate 200. Each of the copper pillar structures 880 is bonded to a respective interposer bonding pad (such as a respective first interposer bonding pad 588A) on the composite interposer (400, 500) through a respective first interposer-side solder material portion 870A, and to a respective substrate bonding pad 268 located on the packaging substrate 200 through a respective substrate-side solder material portion 890.

In one embodiment, each of the copper pillar structures 880 has a respective interposer-side planar surface that faces the interposer (400, 500) and a respective substrate-side planar surface 8SS. Each of the interposer bonding pads 588 is located on a horizontal surface of the composite interposer (400, 500) that faces the packaging substrate 200 and is located in a horizontal plane HP. Each of the substrate-side planar surfaces 8SS of the copper pillar structures 880 may be more distal from the horizontal plane HP than a most distal surface of the at least one surface mount die 850 from the horizontal plane HP.

Figure 31:
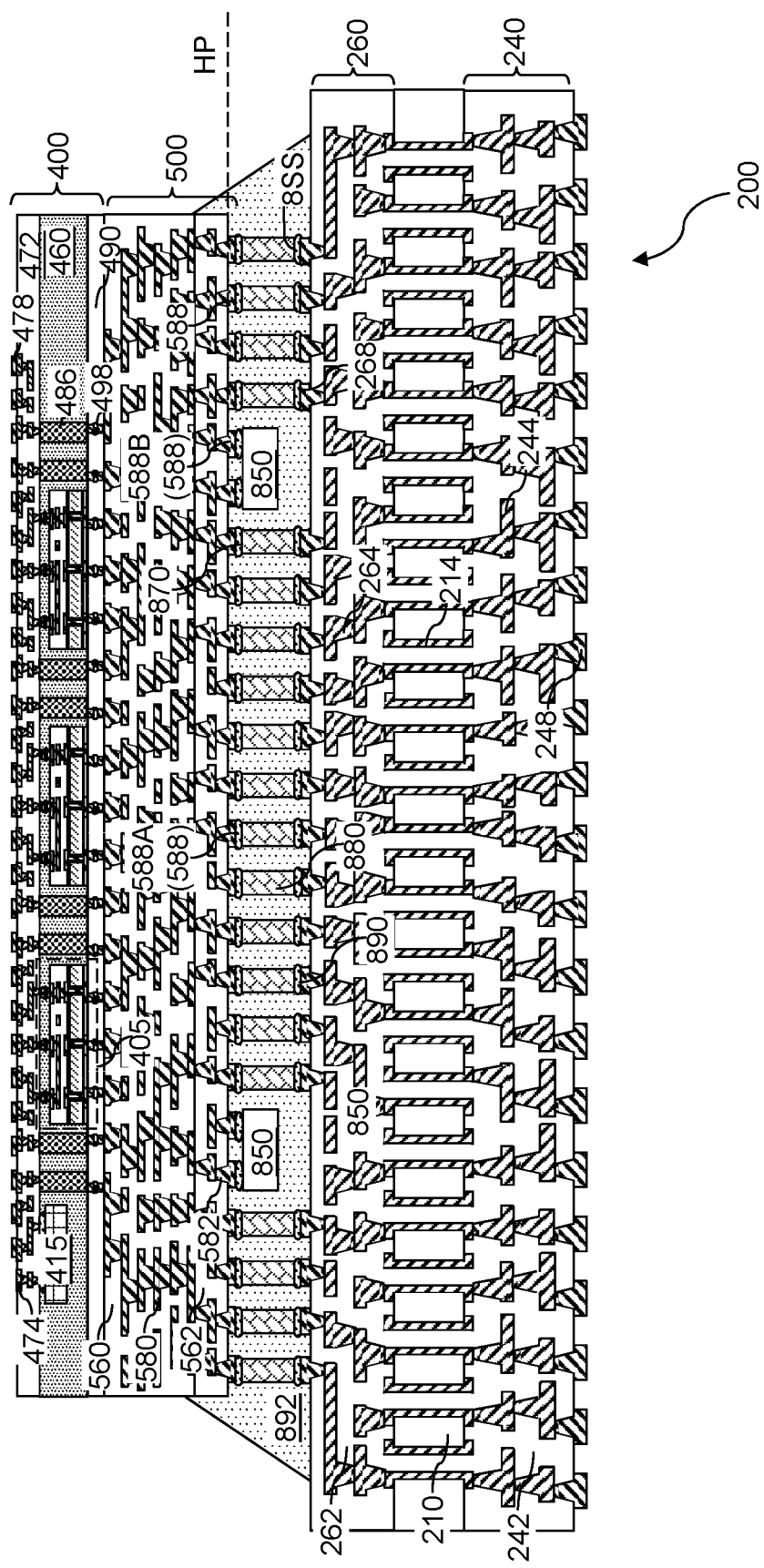
FIG. 31 is a vertical cross-sectional view of the second exemplary structure after formation of an interposer-package underfill material portion and attaching a stiffener ring according to the second embodiment of the present disclosure.

Referring to FIG. 31, the processing steps of FIGS. 21A and 21B may be performed mutatis mutandis to form an interposer-package underfill material portion 892 (which is also referred to as an IP underfill material portion 892). The IP underfill material portion 892 laterally surrounds the array of copper pillar structures 880, and contacts a first horizontal surface of the packaging substrate 200 and a horizontal surface of the composite interposer (400, 500) that faces the packaging substrate 200. In one embodiment, each sidewall of the copper pillar structures 880 is in contact with the IP underfill material portion 892.

A stiffener ring 294 may be attached to the physically exposed surface of the molding compound die frame 760 (i.e., an MC die frame 760) using, for example, an adhesive layer 293.

Figure 32:
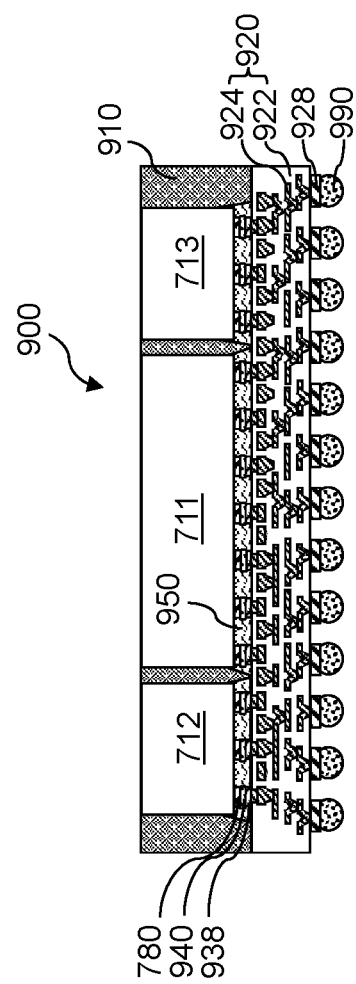
FIG. 32 is a vertical cross-sectional view of a fan-out package to be subsequently attached to the composite interposer of the second exemplary structure according to the second embodiment of the present disclosure.

Referring to FIG. 32, a fan-out package 900 is illustrated, which may be subsequently attached to the composite interposer (400, 500) of the second exemplary structure. The fan-out package 900 may be formed, for example, by forming a two-dimensional array of redistribution structures 920 on a carrier wafer, which is herein referred to as a first redistribution carrier wafer (not shown). Each redistribution structure 920 may be formed within a respective unit area, which is the area of a unit of repetition for the two-dimensional array of redistribution structures 920. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Each redistribution dielectric layer 922 may be formed by spin coating and drying of the respective dielectric polymer material. The redistribution dielectric layers 922 may be patterned by a combination of lithographic methods and etch processes. Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The total number of levels of wiring in each redistribution structure 920 (i.e., the levels of the redistribution wiring interconnects 924) may be in a range from 1 to 10. A periodic two-dimensional array (such as a rectangular array) of redistribution structures 920 may be formed over the first redistribution carrier wafer.

A set of at least one semiconductor die (711, 712, 713) may be bonded to each redistribution structure 920. In one embodiment, the redistribution structures 920 may be arranged as a two-dimensional periodic array, and multiple sets of at least one semiconductor die (711, 712, 713) may be bonded to the redistribution structures 920 as a two-dimensional periodic rectangular array of sets of the at least one semiconductor die (711, 712, 713). Each set of at least one semiconductor die (711, 712, 713) includes at least one semiconductor die. Each set of at least one semiconductor die (711, 712, 713) may include any set of at least one semiconductor die known in the art. In one embodiment, each set of at least one semiconductor die (711, 712, 713) may comprise a plurality of semiconductor dies (711, 712, 713). For example, each set of at least one semiconductor die (711, 712, 713) may include at least one system-on-chip (SoC) die 701 and/or at least one memory die (712, 713). Each SoC die 711 may comprise an application processor die, a central processing unit die, or a graphic processing unit die. In one embodiment, the at least one memory die (712, 713) may comprise a high bandwidth memory (HBM) die that includes a vertical stack of static random access memory dies. In one embodiment, the at least one semiconductor die (711, 712, 713) may include at least one system-on-chip (SoC) die 711 and a high bandwidth memory (HBM) die including a vertical stack of static random access memory (SRAM) dies that are interconnected to one another through microbumps and are laterally surrounded by an epoxy molding material enclosure frame.

An array of on-interposer bump structures 938 may be formed on each redistribution structure 920. Solder material portions may be applied to the on-interposer bump structures 938. The solder material portions are used to provide bonding between semiconductor dies (711, 712, 713) and redistribution structures 920 (which function as interposers that are referred to as "fan-out interposers)), and are herein referred to die-interposer-bonding solder material portions 940, or DIB solder material portions 940. Each semiconductor die (711, 712, 713) may comprise a respective array of on-die bump structures 780. Each of the semiconductor dies (711, 712, 713) may be positioned in a face-down position such that on-die bump structures 780 face the DIB solder material portions 940. Each set of at least one semiconductor die (711, 712, 713) may be placed on a respective set of DIB solder material portions 940. Placement of the semiconductor dies (711, 712, 713) may be performed using a pick and place apparatus so that each of the on-die bump structures 780 is placed on a top surface of a respective one of the first solder material portions 940. A reflow process is performed to attach the semiconductor dies (711, 712, 713) to the redistribution structures 920, which function as interposers (of a different type than the composite interposers (400, 500) described above) and are hereafter referred to as fan-out interposers 920. An underfill material portion 950 may be formed between each fan-out interposer 920 and a respective attached set of at least one semiconductor die (711, 712, 713). Each underfill material portion 950 is formed between a respective set of at least one semiconductor die (711, 712, 713) and a respective fan-out interposer 920, and is herein referred to as a die-interposer underfill material portion 950 or a DI underfill material portion 950.

An epoxy molding compound (EMC) may be applied to the gaps between neighboring sets of at least one semiconductor die (711, 712, 713). The epoxy molding compound may be cured to form an epoxy molding compound matrix. A second redistribution carrier wafer (not shown) is attached to the physically exposed horizontal surface of the epoxy molding compound matrix, and the first redistribution carrier wafer may be detached from a reconstituted wafer including a two-dimensional array of fan-out interposers 920, a two-dimensional array of sets of at least one semiconductor die (711, 712, 713), and the epoxy molding compound matrix. Fan-out bump structures 928 may be formed on the physically exposed surfaces of the redistribution wiring interconnects 924, and additional solder material portions may be formed on the fan-out bump structures 928. The additional solder material portions are subsequently used to bond the fan-out interposers 920 to a respective composite interposer (400, 500), and are herein referred to as interposer-interposer-bonding solder material portions 990, or IIB solder material portions 990. The second redistribution carrier wafer may be detached from the reconstituted wafer. Subsequently, the reconstituted wafer may be diced along dicing channels to provide the fan-out packages 900. Each diced portion of the epoxy molding compound matrix constitutes a molding compound die frame 910, or an MC die frame 910.

Figure 33:
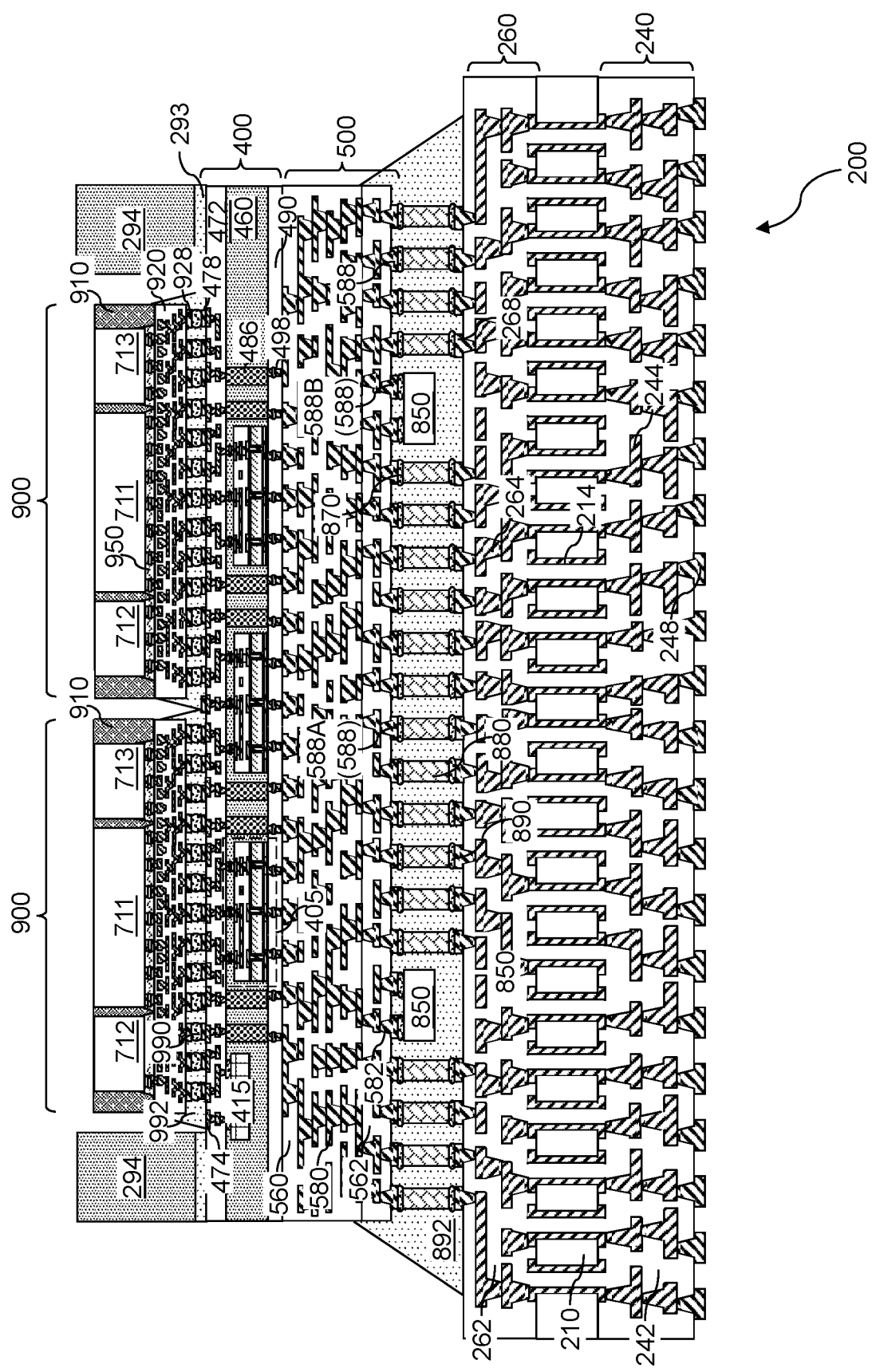
FIG. 33 is a vertical cross-sectional view of the second exemplary structure after attaching fan-out packages and a stiffener ring to the composite interposer according to the second embodiment of the present disclosure.

Referring to FIG. 33, at least one fan-out packages 900 may be attached to an assembly of a composite interposer (400, 500), a packaging substrate 200, and an array of copper pillar structures 800 that is bonded to the composite interposer (400, 500) and the packaging substrate 200. For example, the interposer-interposer-bonding (IIB) solder material portions 990 may be aligned to the on-interposer bump structures 478, and a reflow process may be performed to bond the interposer-interposer solder material portions 990 to the on-interposer bump structures 478. Each interposer-interposer solder material portion may be bonded to a respective one of the fan-out bump structures 928 and to a respective one of the on-interposer bump structures 478. In one embodiment, a plurality of fan-out packages 900 may be attached to the composite interposer (400, 500). An underfill material portion may be formed around each array of IIB solder material portions. Each such underfill material portion is formed between a fan-out interposer 900 and a composite interposer (400, 500), and is herein referred to as an interposer-interposer underfill material portion 992 or as an II underfill material portion 992.

A stiffener ring 294 may be attached to a periphery of a top surface of the composite interposer (400, 500) around the at least one fan-out package 900 using, for example, an adhesive layer 293.

In one embodiment, each of the at least one fan-out package 900 comprises a respective set of one or more semiconductor dies (711, 712, 713) laterally surrounded by a respective molding compound die frame 910, and comprises a respective fan-out interposer 920 that is attached to the respective set of one or more semiconductor dies (711, 712, 713).

In one embodiment, two or more fan-out packages 900 may be bonded to the composite interposer (400, 500). In one embodiment, each of the two or more fan-out packages 900 comprises a respective set of one or more semiconductor dies (711, 712, 713) and a respective fan-out interposer 920. In one embodiment, each of the fan-out packages 900 is bonded to the composite interposer (400, 500). In one embodiment, the composite interposer (400, 500) has a greater area than a sum of all areas of the fan-out packages 900.

Figure 34A:
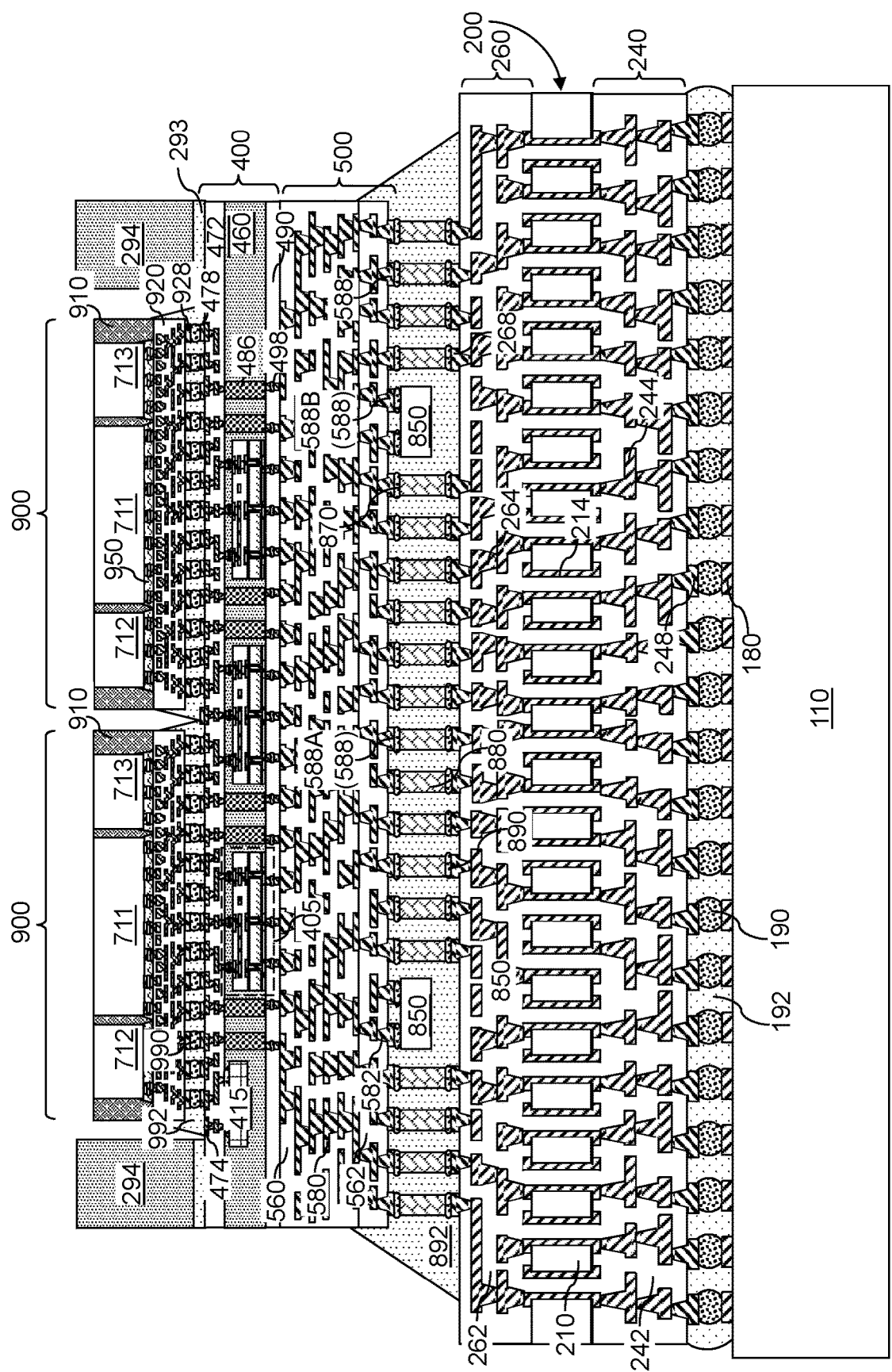
FIG. 34A is vertical cross-sectional view of the second exemplary structure after attaching the packaging substrate to a printed circuit board according to the second embodiment of the present disclosure.

Referring to FIG. 34A, the processing steps of FIG. 22 may be performed mutatis mutandis to attach a printed circuit board 100 to the assembly of the composite interposer (400, 500), the packaging substrate 200, an array of copper pillar structures 880, and at least one fan-out package 900. The packaging substrate 200 may have a greater lateral dimension than the composite interposer (400, 500).

Figure 34B:
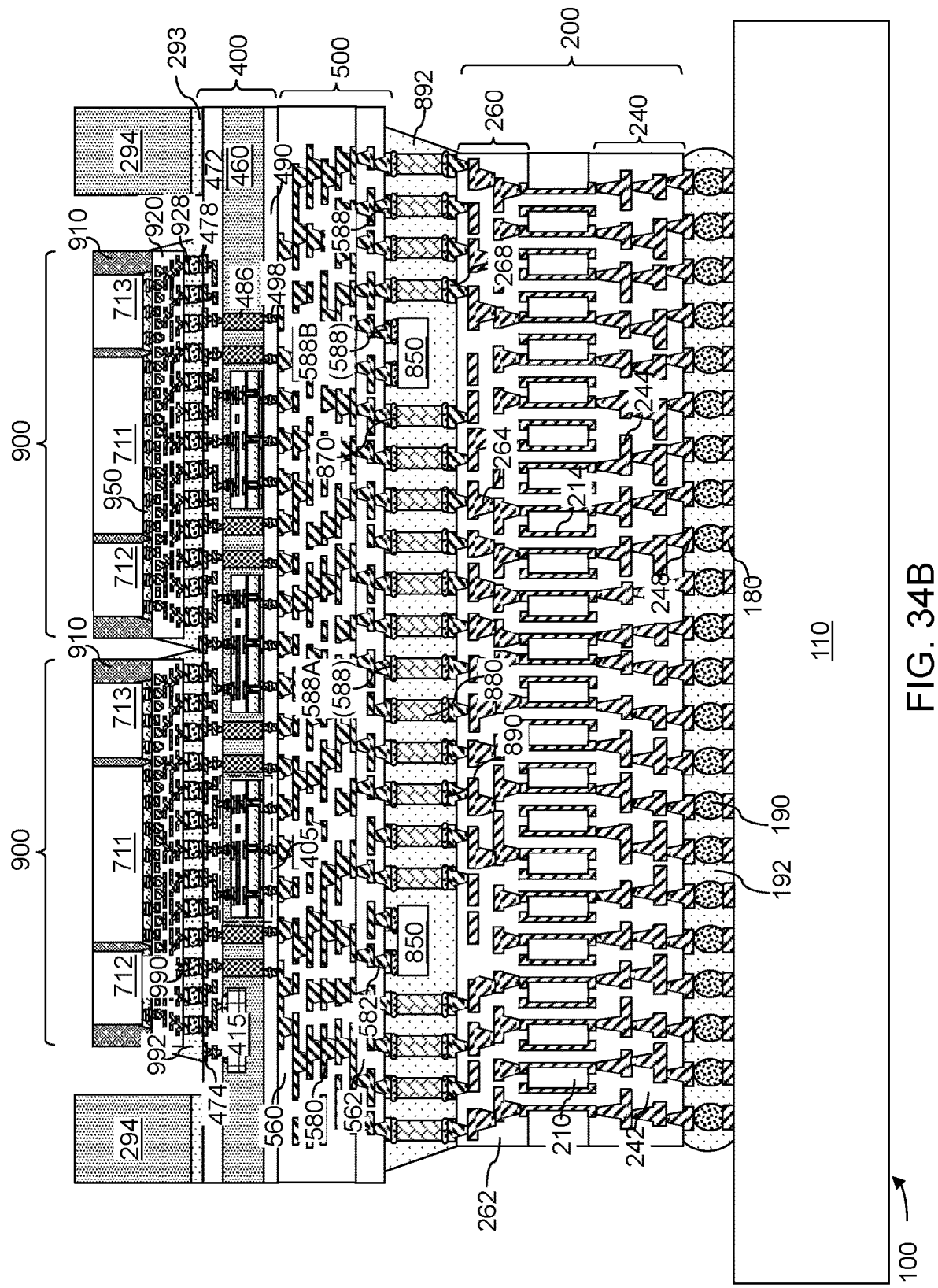
FIG. 34B is a vertical cross-sectional view of a first alternative configuration of the second exemplary structure after attaching the packaging substrate to a printed circuit board according to the second embodiment of the present disclosure.

Referring to FIG. 34B, a first alternative configuration of the second exemplary structure is illustrated. The first alternative configuration corresponds to an embodiment in which the packaging substrate 200 has a lesser lateral dimension than the composite interposer (400, 500). Generally, there is no limitation on the relative size of the composite interposer (400, 500) and the packaging substrate 200.

Figure 34C:
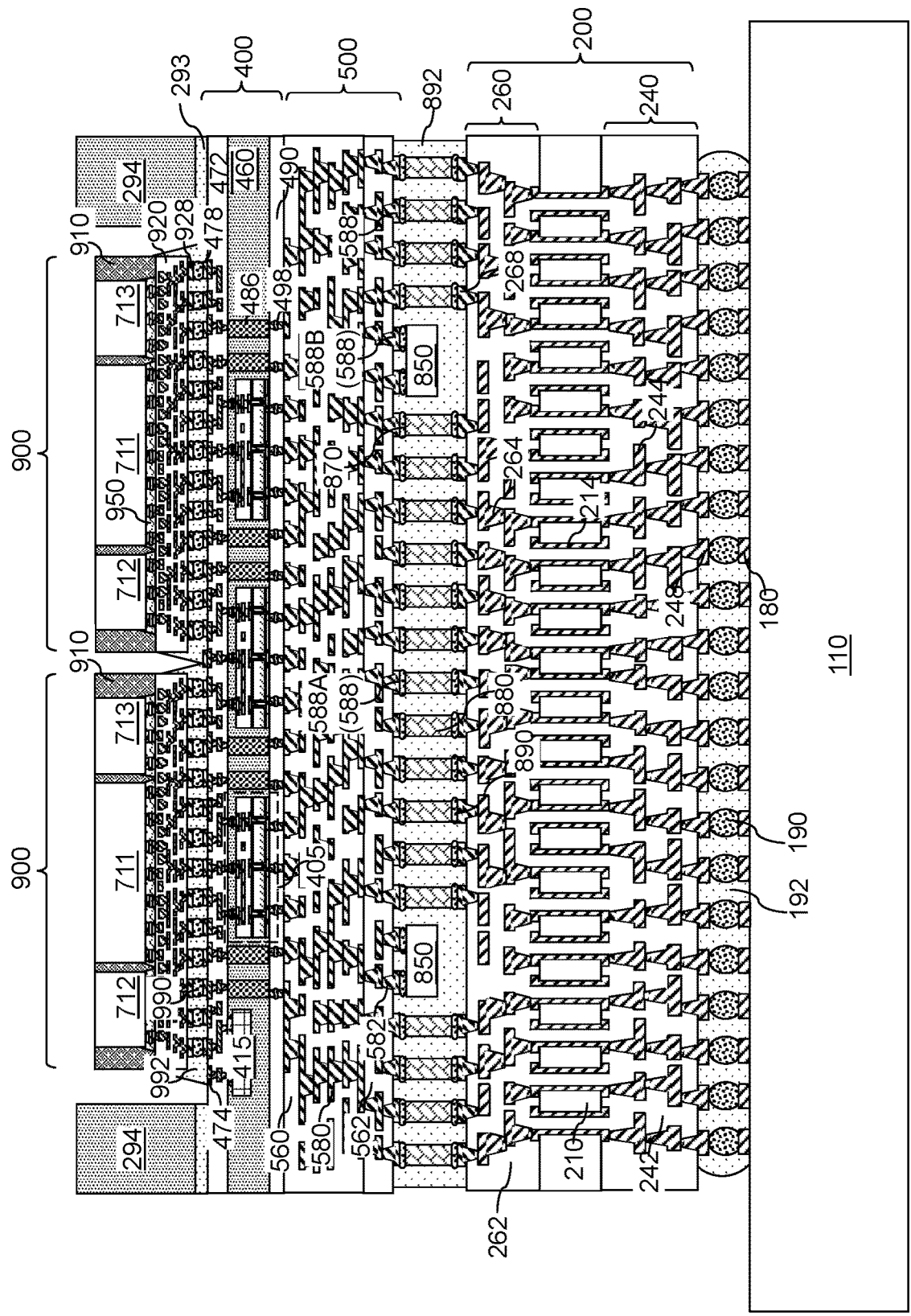
FIG. 34C is a vertical cross-sectional view of a second alternative configuration of the second exemplary structure after attaching the packaging substrate to a printed circuit board according to the second embodiment of the present disclosure.

Referring to FIG. 34C, a second alternative configuration of the second exemplary structure is illustrated. The second alternative configuration corresponds to an embodiment in which the packaging substrate 200 has a same set of lateral dimensions as the composite interposer (400, 500). In this embodiment, sidewalls of the composite interposer (400, 500) may be vertically coincident with sidewalls of the packaging substrate 200.

Generally, the second exemplary structure includes a semiconductor structure that comprises: an assembly including at least one semiconductor die (711, 712, 713) and a composite interposer (400, 500) including interposer bonding pads 588 comprising first interposer bonding pads 588A and second interposer bonding pads 588B; a packaging substrate 200 comprising substrate bonding pads 268; an array of copper pillar structures 880 disposed between the composite interposer (400, 500) and the packaging substrate 200; an array of interposer-side solder material portions 870 bonded to a respective one of the copper pillar structures 880 and to a respective one of the first interposer bonding pads 588A; and an array of substrate-side solder material portions 890 bonded to a respective one of the copper pillar structures 880 and to a respective one of the substrate bonding pads 268.

Figure 35:
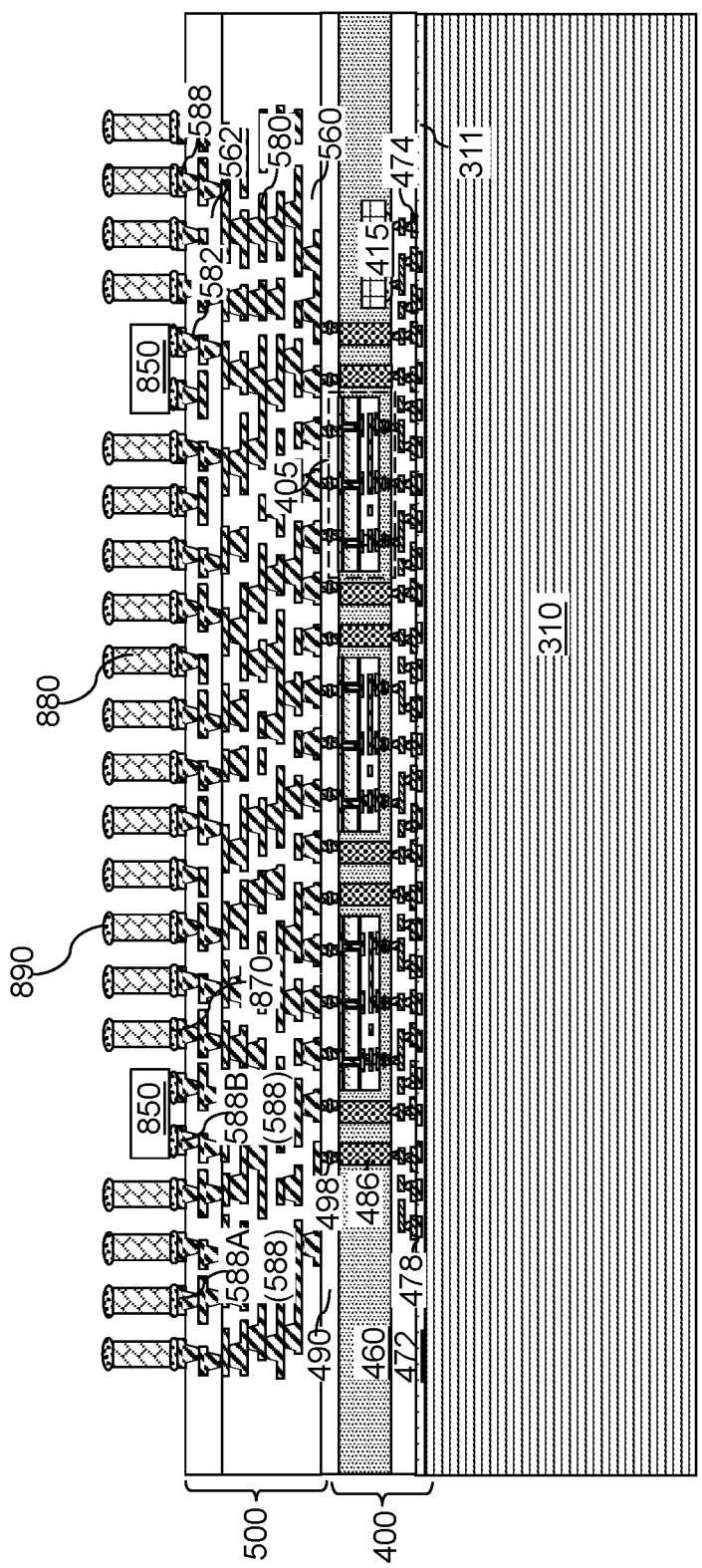
FIG. 35 is a vertical cross-sectional view of a third exemplary structure after attaching substrate-side solder material portions to the copper pillar structures according to the third embodiment of the present disclosure.

Referring to FIG. 35, a third exemplary structure according to the third embodiment of the present disclosure is illustrated, which may be the same as the second exemplary structure illustrated in FIG. 28. Generally, an in-process structure including at least one interposer, such as a two-dimensional array of composite interposers (400, 500) located on a carrier wafer, may be provided. In one embodiment, the in-process structure comprises a plurality of composite interposers (400, 500) that are interconnected to one another within a reconstituted wafer. Each of the at least one interposer comprises first interposer bonding pads 588A, and may optionally comprise second interposer bonding pads 588B. In embodiments in which the second interposer bonding pads 588B are provided, at least one surface mount die 850 may be attached to the second interposer bonding pads 588B. An array of copper pillar structures 880 is attached to the first interposer bonding pads 588A within each composite interposer (400, 500) using interposer-side solder material portions 870.

Figure 36:
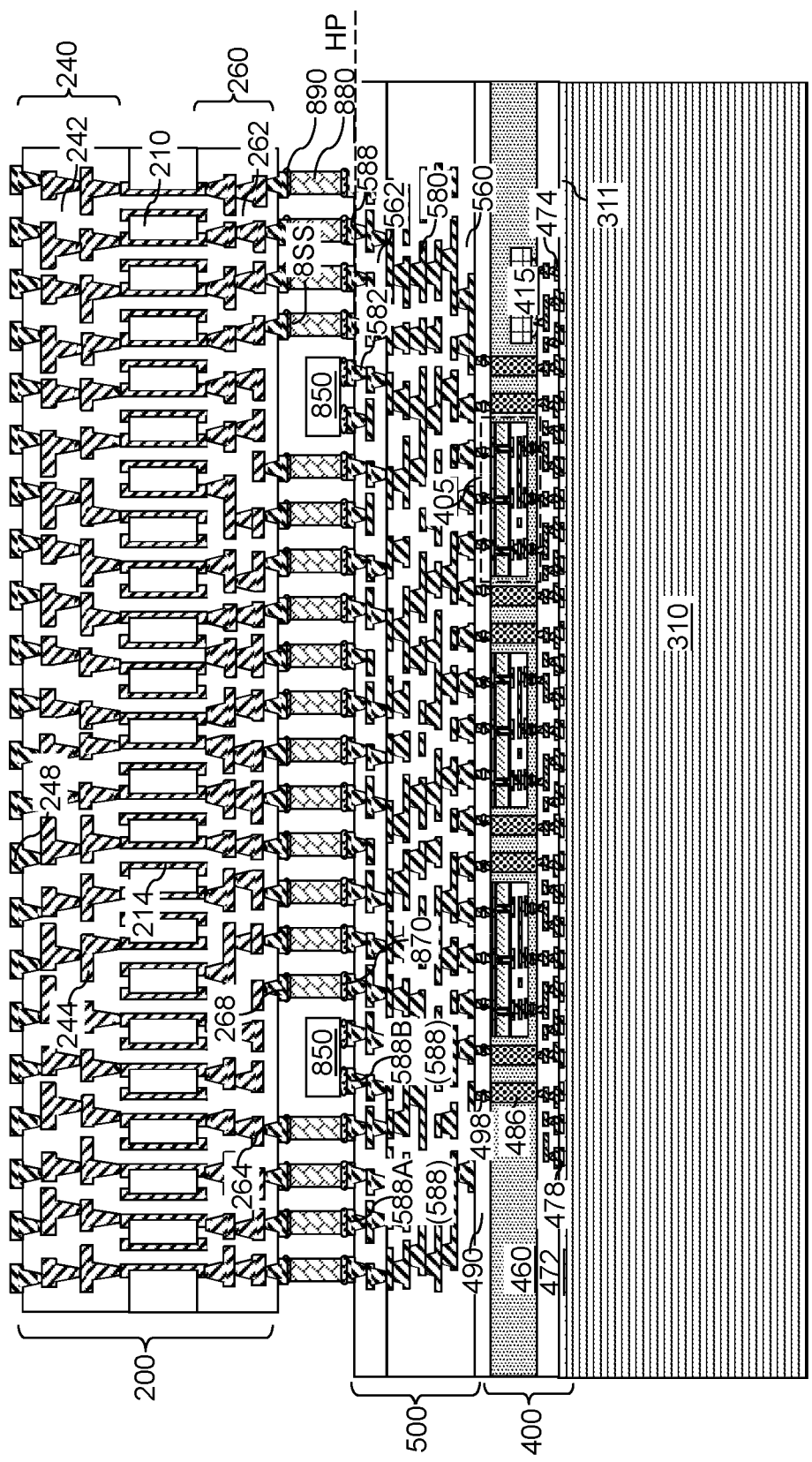
FIG. 36 is a vertical cross-sectional view of the third exemplary structure after attaching a packaging substrate to each composite interposer in a respective unit area of the reconstituted wafer according to the third embodiment of the present disclosure.
Figure 37:
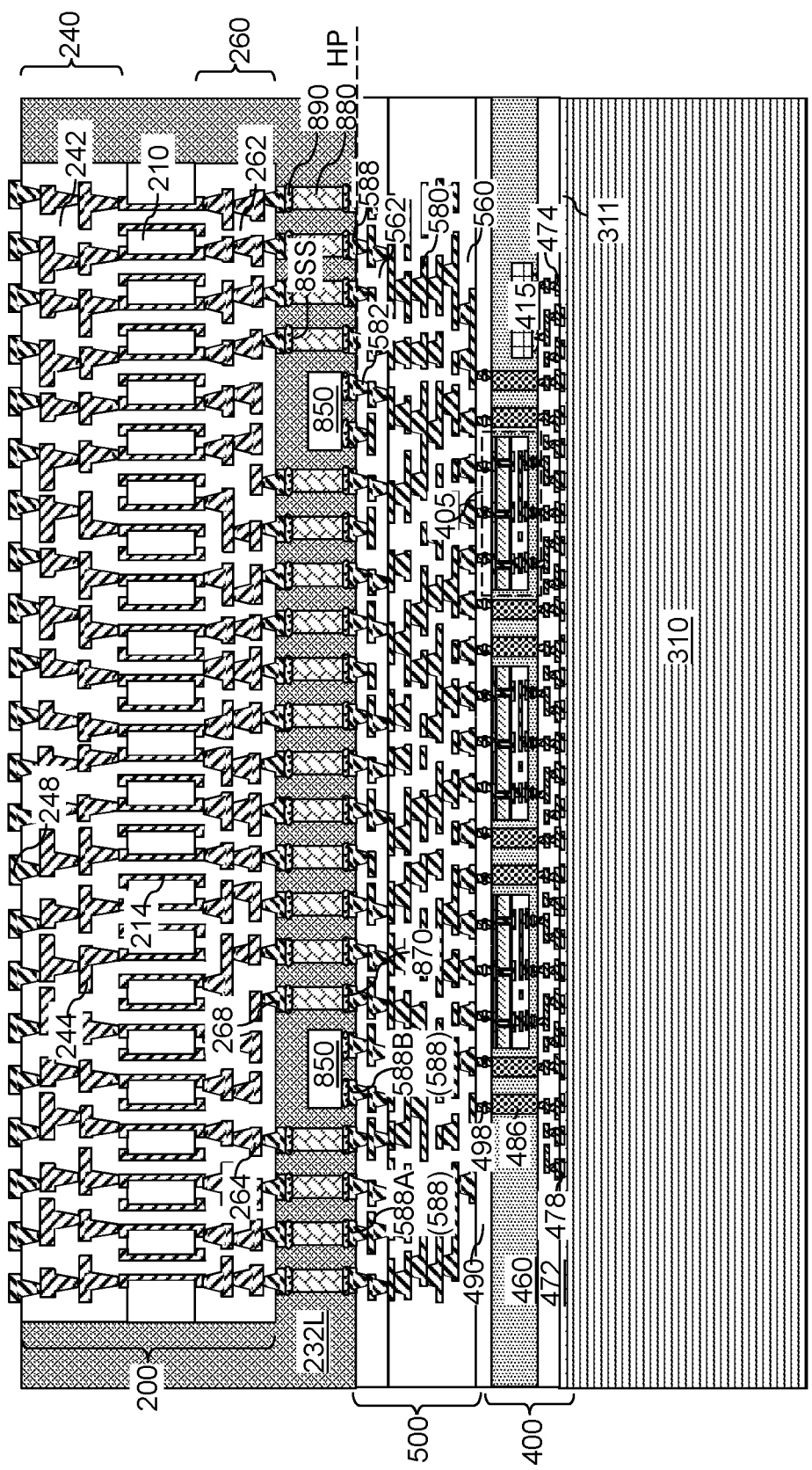
FIG. 37 is a vertical cross-sectional view of the third exemplary structure after formation of a molding compound layer around the packaging substrates according to the third embodiment of the present disclosure.

Referring to FIG. 36, packaging substrates 200 may be attached to the reconstituted wafer through the arrays of copper pillar structures 880. Each packaging substrate 200 may be attached to a respective composite interposer (400, 500) within the two-dimensional array of composite interposers (400, 500) in the reconstituted wafer. The packaging substrates 200 may be substantially the same as the previously described packaging substrates 200 except that the packaging substrates 200 used in the third exemplary structure have a smaller area than each composite interposer (400, 500). In other words, the area of each packaging substrate 200 in a plan view is located entirely within the area of a mating composite interposer (400, 500). Thus, the entire periphery of each packaging substrate 200 is laterally offset inward from the periphery of the composite substrate (400, 500) to which the packaging substrate 200 is attached.

Generally, the metal wiring in the packaging substrates 200 used in the third exemplary structure may be formed with smaller dimensions relative to the metal wiring in the packaging substrates 200 used in the first and second exemplary structures.

Each array of copper pillar structures 880 within a unit area of the reconstituted wafer may be attached to substrate bonding pads 268 on a respective packaging substrate 200 using a respective set of substrate-side solder material portions 890. For each assembly of a composite interposer (400, 500) and a packaging substrate 200, the substrate bonding pads 268 are located on a first horizontal surface of the packaging substrate 200 that faces the composite interposer (400, 500). In one embodiment, probability of accidental collision between the at least one surface mount die 850 and the packaging substrate 200 may be reduced by not forming substrate bonding pads 268 in areas of the surface mount dies 850. In one embodiment, each area of the first horizontal surface that has an areal overlap with the at least one surface mount die 850 is free of any bonding pad.

Each array of copper pillar structures 880 is disposed between a respective composite interposer (400, 500) and a respective packaging substrate 200. Each of the copper pillar structures 880 is bonded to a respective interposer bonding pad (such as a respective first interposer bonding pad 588A) on the composite interposer (400, 500) through a respective first interposer-side solder material portion 870A, and to a respective substrate bonding pad 268 located on the packaging substrate 200 through a respective substrate-side solder material portion 890.

In one embodiment, each of the copper pillar structures 880 has a respective interposer-side planar surface that faces the interposer (400, 500) and a respective substrate-side planar surface 8SS. Each of the interposer bonding pads 588 is located on a horizontal surface of the composite interposer (400, 500) that faces the packaging substrate 200 and is located in a horizontal plane HP. Each of the substrate-side planar surfaces 8SS of the copper pillar structures 880 may be more distal from the horizontal plane HP than a most distal surface of the at least one surface mount die 850 from the horizontal plane HP.

Referring to FIG. 36 and according to an aspect of the present disclosure, a molding compound (such as an epoxy molding compound) may be applied to the gaps between mating pairs of a respective composite interposer (400, 500) and a respective packaging substrate 200, and to the gaps between neighboring pairs of packaging substrates 200. The molding compound may laterally surround, and contact, the copper pillar structures 880, the interposer-side solder material portions 870, the substrate-side solder material portions 890, a horizontal surface of each composite interposer (400, 500) on which the interposer bonding pads 588 are located, and a first horizontal surface of a packaging substrate 200 on which the substrate bonding pads 268 are located.

The molding compound may be hardened (i.e., cured) to provide a dielectric material portion having sufficient stiffness and mechanical strength. The molding compound may include epoxy resin, hardener, silica (as a filler material), and other additives. The molding compound applied at this processing step may use any molding compound material that may be used for the molding compound interposer frame 460 which was discussed above. The molding compound may be cured at a curing temperature to form a molding compound (MC) packaging matrix 232 that laterally surrounds and embeds each of the packaging substrates 200 that are bonded to the two-dimensional array of composite interposers (400, 500). The molding compound (MC) packaging matrix 232 includes a two-dimensional array of molding compound frames. The molding compound frames laterally surround, and embed, a respective packaging substrate 200 and are laterally adjoined to one another. The molding compound frames are herein referred to as molding compound packaging frames. Each molding compound packaging frame is a portion of the molding compound packaging matrix 232L that is located within a respective unit area.

Portions of the molding compound packaging matrix 232L that overlies the horizontal plane including the top surfaces of the board-side bonding pads 248 may be removed by a planarization process. For example, the portions of the molding compound packaging matrix 232L that overlies the horizontal plane may be removed using a chemical mechanical planarization. Optionally, a recess etch may be performed to recess surface portions of the molding compound packaging matrix 232L so that the backside horizontal surface, i.e., the second horizontal surface, of each packaging substrate 200 is physically exposed.

Figure 38:
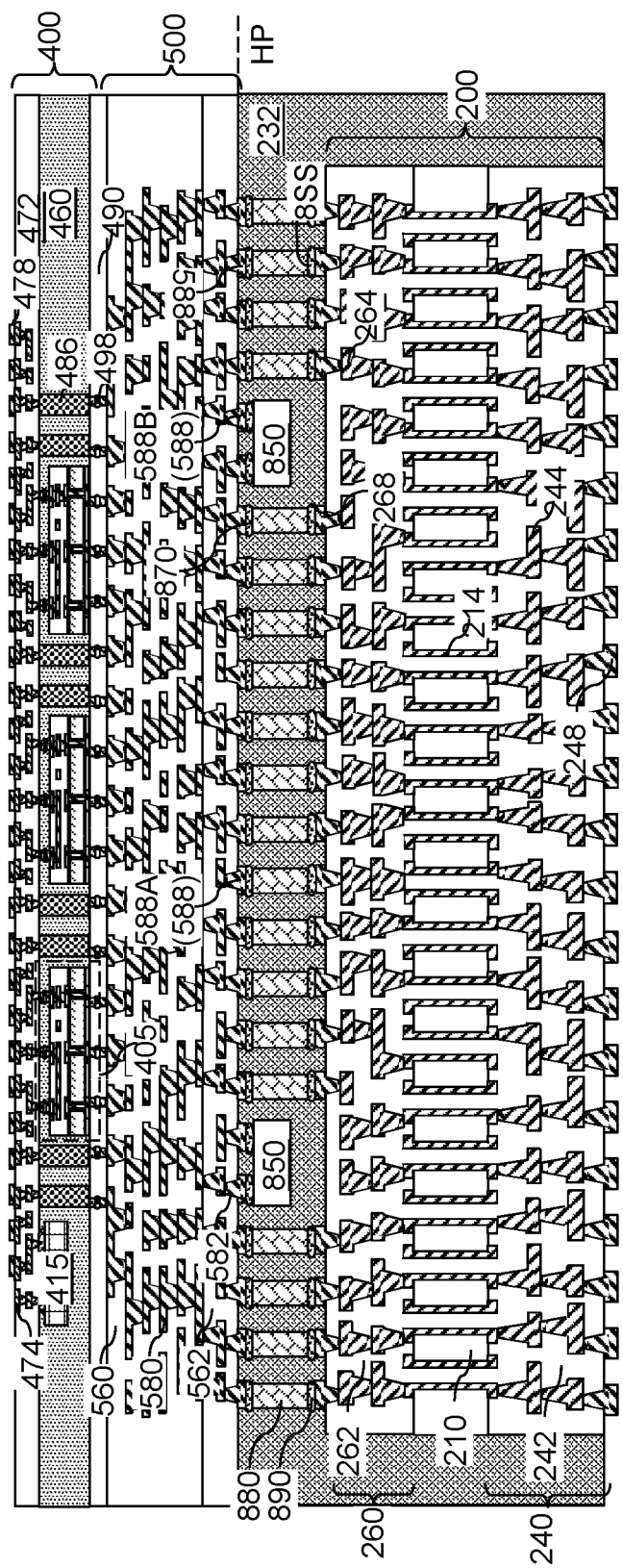
FIG. 38 is a vertical cross-sectional view of the third exemplary structure after formation of an interposer-substrate assembly that is obtained by detaching the first carrier substrate and dicing the reconstituted wafer according to the third embodiment of the present disclosure.

Referring to FIG. 38, the first carrier wafer 310 may be detached from the reconstituted wafer. In embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311. The on-interposer bump structures 478 of the composite interposers (400, 500) may be physically exposed. The detached reconstituted wafer comprises a two-dimensional array of composite interposers (400, 500), a molding compound packaging matrix 232L that includes a two-dimensional array of molding compound packaging frames, and a two-dimensional array of sets of copper pillar structures 800 providing electrical connection between a respective pair of a composite interposer (400, 500) and a packaging substrate 200. Each set of copper pillar structures 800 may be arranged as an array of copper pillar structures 800.

The reconstituted wafer (now including the molding compound packaging matrix 232L after being detached from the first carrier substrate 310) may be diced along dicing channels by performing a dicing process. The dicing channels correspond to the boundaries between neighboring pairs of unit areas. Each diced unit from the reconstituted wafer comprises an assembly of a composite interposer (400, 500), a packaging substrate 200, a molding compound packaging frame 232, and an array of copper pillar structures 800 vertically extending through, and contacting, the molding compound packaging frame 232 (which is a molding compound frame that laterally surrounds, and embeds, the packaging substrate 200). Within each assembly, the packaging substrate 200 is laterally surrounded by a molding compound packaging frame 232, and has a lesser area than the composite interposer (400, 500). The molding compound packaging frame 232 and the composite interposer (400, 500) may have the same area within each assembly. Each sidewall of the molding compound packaging frame 232 may be vertically coincident with a respective sidewall of the composite interposer (400, 500).

Figure 39:
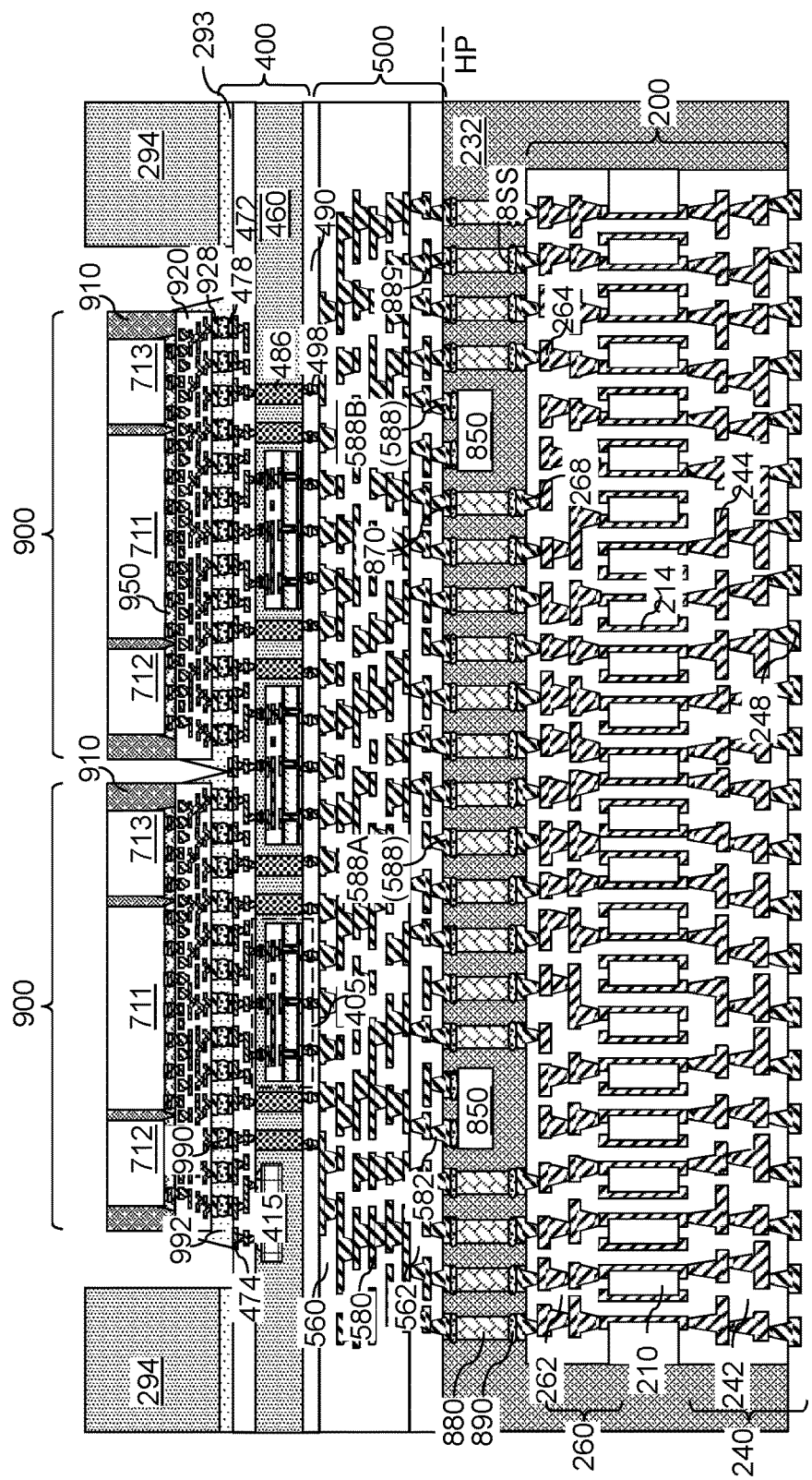
FIG. 39 is a vertical cross-sectional view of the third exemplary structure after attaching fan-out packages and a stiffener ring to the composite interposer according to the third embodiment of the present disclosure.

Referring to FIG. 39, the processing steps FIG. 33 may be performed mutatis mutandis to attach at least one fan-out packages 900 to an assembly of a composite interposer (400, 500), a packaging substrate 200, a molding compound packaging frame 232, and an array of copper pillar structures 800 that is bonded to the composite interposer (400, 500) and the packaging substrate 200. For example, the interposer-interposer-bonding (IIB) solder material portions 990 on each fan-out package 900 may be aligned to the on-interposer bump structures 478 of the composite interposer (400, 500), and a reflow process may be performed to bond the interposer-interposer solder material portions 990 to the on-interposer bump structures 478. Each interposer-interposer solder material portion may be bonded to respective one of the fan-out bump structures 928 and to a respective one of the on-interposer bump structures 478. In one embodiment, a plurality of fan-out packages 900 may be attached to the composite interposer (400, 500). An underfill material portion may be formed around each array of IIB solder material portions. Each such underfill material portion is formed between a fan-out interposer 900 and a composite interposer (400, 500), and is herein referred to as an interposer-interposer underfill material portion 992 or as an II underfill material portion 992.

A stiffener ring 294 may be attached to a periphery of a top surface of the composite interposer (400, 500) around the at least one fan-out package 900 using, for example, an adhesive layer 293.

In one embodiment, each of the at least one fan-out package 900 comprises a respective set of one or more semiconductor dies (711, 712, 713) laterally surrounded by a respective molding compound die frame 910, and comprises a respective fan-out interposer 920 that is attached to the respective set of one or more semiconductor dies (711, 712, 713).

In one embodiment, two or more fan-out packages 900 may be bonded to the composite interposer (400, 500). In one embodiment, each of the two or more fan-out packages 900 comprises a respective set of one or more semiconductor dies (711, 712, 713) and a respective fan-out interposer 920. In one embodiment, each of the fan-out packages 900 is bonded to the composite interposer (400, 500). In one embodiment, the composite interposer (400, 500) has a greater area than a sum of all areas of the fan-out packages 900.

Figure 40:
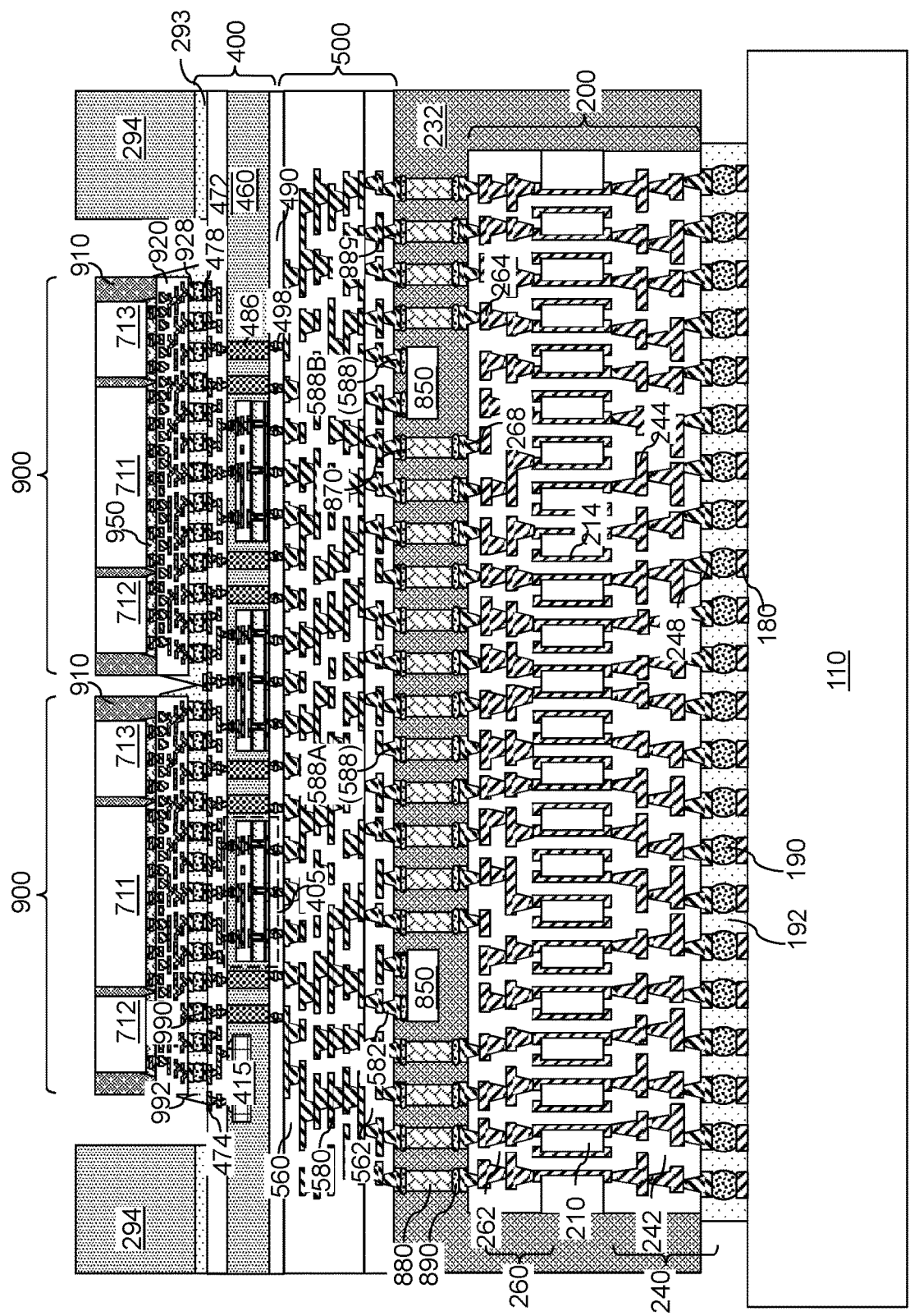
FIG. 40 is vertical cross-sectional view of the third exemplary structure after attaching the packaging substrate to a printed circuit board according to the third embodiment of the present disclosure.

Referring to FIG. 40, the processing steps of FIG. 34 may be performed mutatis mutandis to attach a printed circuit board 100 to the assembly of the composite interposer (400, 500), the packaging substrate 200, a molding compound packaging frame 232, an array of copper pillar structures 880, and at least one fan-out package 900.

The third exemplary structure includes a semiconductor structure that comprises: an assembly including at least one semiconductor die (711, 712, 713) and a composite interposer (400, 500) including interposer bonding pads 588 comprising first interposer bonding pads 588A and second interposer bonding pads 588B; a packaging substrate 200 comprising substrate bonding pads 268; an array of copper pillar structures 880 disposed between the composite interposer (400, 500) and the packaging substrate 200; an array of interposer-side solder material portions 870 bonded to a respective one of the copper pillar structures 880 and to a respective one of the first interposer bonding pads 588A; and an array of substrate-side solder material portions 890 bonded to a respective one of the copper pillar structures 880 and to a respective one of the substrate bonding pads 268.

Figure 41:
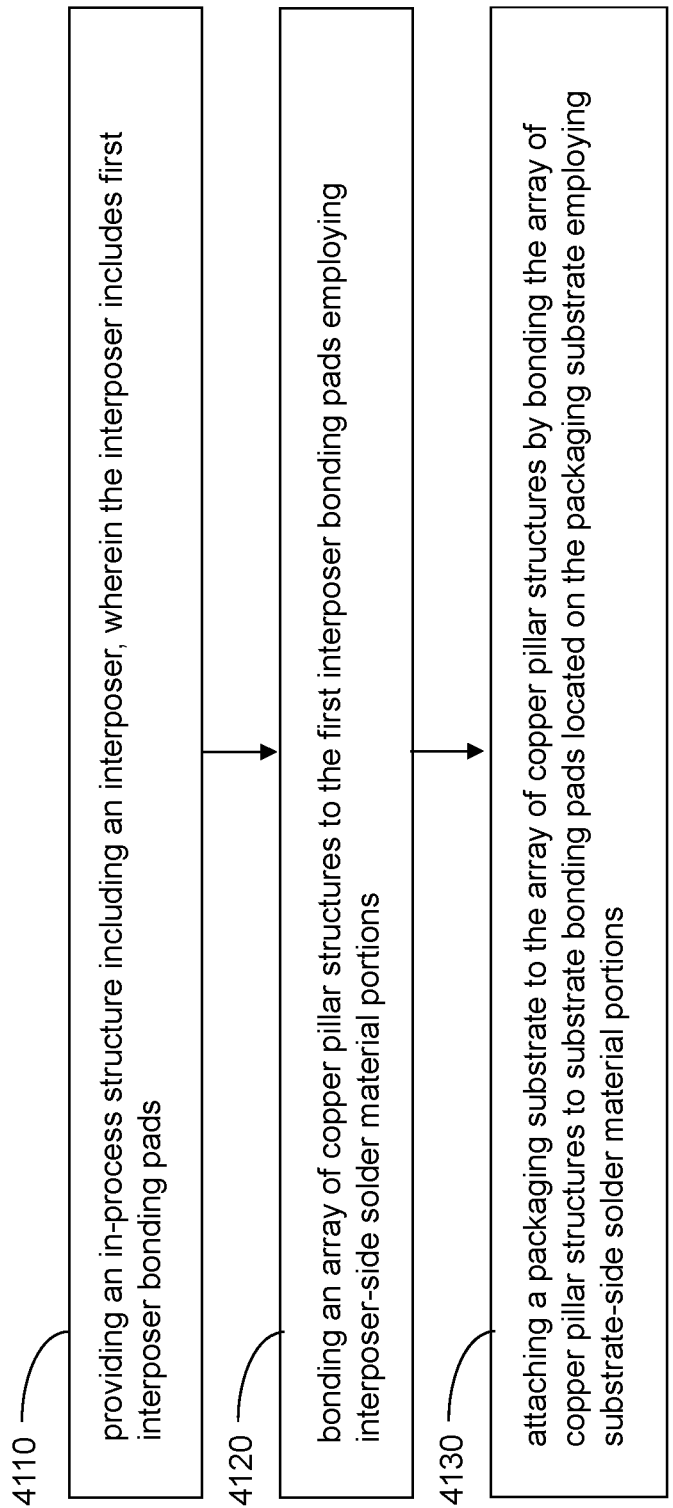
FIG. 41 is a flowchart illustrating steps for forming an exemplary structure according to an embodiment of the present disclosure.

Referring to FIG. 41, a flowchart illustrates steps for forming a semiconductor structure according to an embodiment of the present disclosure.

Referring to step 4110 and FIGS. 1A-14B, 23, 24, and 35, an in-process structure including an interposer, such as a composite interposer (400, 500), is provided. The interposer, such as the composite interposer (400, 500), includes first interposer bonding pads 588A.

Referring to step 4120 and FIGS. 15A-16, 25, and 35, an array of copper pillar structures 880 is bonded to the first interposer bonding pads 588A using interposer-side solder material portions 870.

Referring to step 4130 and FIGS. 17A-22, 26-34, and 36-40, a packaging substrate 200 is attached to the array of copper pillar structures 880 by bonding the array of copper pillar structures 880 to substrate bonding pads 268 located on the packaging substrate 200 using substrate-side solder material portions 890.

Referring to all drawings and according to various embodiments of the present disclosure, a semiconductor structure is provided, which comprises: an assembly including at least one semiconductor die {(701, 702, 703, 704, 705, 706) or (711, 712, 713)} and an interposer (400, 500) including interposer bonding pads 588; a packaging substrate 200 comprising substrate bonding pads 268; and an array of copper pillar structures 880 disposed between the interposer (400, 500) and the packaging substrate 200, wherein each of the copper pillar structures 880 is bonded to a respective interposer bonding pad 588 on the interposer (400, 500) and to a respective substrate bonding pad 268 located on the packaging substrate 200.

According to another aspect of the present disclosure, a semiconductor structure is provided, which comprises: an assembly including at least one semiconductor die {(701, 702, 703, 704, 705, 706) or (711, 712, 713)} and an interposer (400, 500) including interposer bonding pads 588 comprising first interposer bonding pads 588A and second interposer bonding pads 588B; a packaging substrate 200 comprising substrate bonding pads 268; an array of copper pillar structures 880 disposed between the interposer (400, 500) and the packaging substrate 200; an array of interposer-side solder material portions 870 bonded to a respective one of the copper pillar structures 880 and to a respective one of the first interposer bonding pads 588A; and an array of substrate-side solder material portions 890 bonded to a respective one of the copper pillar structures 880 and to a respective one of the substrate bonding pads 268.

The various embodiments of the present disclosure may be used to provide an array of copper pillar structures 880 between an interposer (which may be any interposer and may, or may not, be a composite interposer (400, 500)) and a packaging substrate 200. The array of copper pillar structures 800 increases the vertical spacing between the interposer and the packaging substrate 200, while functioning as electrically conductive paths that electrically connect the interposer and the packaging substrate 200. The increased vertical spacing between the interposer and the packaging substrate 200 may be advantageously used to attach at least one surface mount die 850 to the backside (i.e., the side that faces the packaging substrate 200) of the interposer. Further, the increased vertical spacing facilitates injection of an underfill material or a molding compound material to facilitate manufacture of compact packaging structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an assembly including at least one semiconductor die and an interposer including interposer bonding pads;
a packaging substrate comprising substrate bonding pads; and
an array of copper pillar structures disposed between the interposer and the packaging substrate, wherein each of the copper pillar structures is bonded to a respective interposer bonding pad on the interposer and to a respective substrate bonding pad located on the packaging substrate,
wherein:
each of the copper pillar structures is bonded to the respective substrate bonding pad through a respective substrate-side solder material portion and is bonded to the respective interposer bonding pad through a respective interposer-side solder material portion;
the assembly comprises a fan-out package containing a plurality of semiconductor dies encapsulated by a molding compound die frame and attached to the interposer through a respective array of microbumps; and
each sidewall of the molding compound die frame is vertically coincident with a respective sidewall of the interposer.

2. The semiconductor structure of claim 1, wherein each of the copper pillar structures has a respective horizontal cross-sectional shape that is invariant under translation along a vertical direction that is perpendicular to a horizontal surface of the packaging substrate on which the substrate bonding pads are located.

3. The semiconductor structure of claim 1, further comprising at least one surface mount die that is bonded to the interposer, and is located between the interposer and the packaging substrate.

4. The semiconductor structure of claim 3, wherein each of at least one surface mount die is bonded to a respective set of additional interposer bonding pads located on the interposer through a respective array of interposer-side solder material portions.

5. The semiconductor structure of claim 3, wherein each copper pillar structure within the array of copper pillar structures has a height that is greater than a maximum thickness of the at least one surface mount die.

6. The semiconductor structure of claim 3, wherein:
each of the copper pillar structures has a respective interposer-side planar surface that faces the interposer and a respective substrate-side planar surface;
each of the interposer bonding pads is located on a horizontal surface of the interposer that faces the packaging substrate and is located in a horizontal plane; and
each of the substrate-side planar surfaces is more distal from the horizontal plane than a most distal surface of the at least one surface mount die from the horizontal plane.

7. The semiconductor structure of claim 3, wherein:
the substrate bonding pads are located on a first horizontal surface of the packaging substrate that faces the interposer; and
each area of the first horizontal surface that has an areal overlap with the at least one surface mount die is free of any bonding pad.

8. The semiconductor structure of claim 1, further comprising an underfill material portion laterally surrounding the array of copper pillar structures, contacting a first horizontal surface of the packaging substrate, and contacting a horizontal surface of the interposer that faces the packaging substrate, wherein each sidewall of the copper pillar structures is in contact with the underfill material portion.

9. A semiconductor structure comprising:
an assembly including at least one semiconductor die and an interposer including interposer bonding pads comprising first interposer bonding pads and second interposer bonding pads;
a packaging substrate comprising substrate bonding pads;
an array of copper pillar structures disposed between the interposer and the packaging substrate;
an array of interposer-side solder material portions bonded to a respective one of the copper pillar structures and to a respective one of the first interposer bonding pads; and
an array of substrate-side solder material portions bonded to a respective one of the copper pillar structures and to a respective one of the substrate bonding pads,
wherein:
the assembly comprises a fan-out package containing a plurality of semiconductor dies encapsulated by a molding compound die frame and attached to the interposer through a respective array of microbumps; and
each sidewall of the molding compound die frame is vertically coincident with a respective sidewall of the interposer.

10. The semiconductor structure of claim 9, further comprising:
additional interposer bonding pads located within an area of an opening within the array of copper pillar structures; and
a surface mount die located between the interposer and the packaging substrate and bonded to the second interposer bonding pads through additional interposer-side solder material portions.

11. The semiconductor structure of claim 9, wherein:
the assembly comprises at least one additional fan-out package that is bonded to the interposer;
each of the at least one additional fan-out package comprises a respective set of one or more semiconductor dies and a respective fan-out interposer;
each of the at least one additional fan-out package is bonded to the interposer; and
the interposer has a greater area than a sum of all areas of the at least one additional fan-out package.

12. The semiconductor structure of claim 9, wherein:
the packaging substrate is laterally surrounded by a molding compound die frame and has a lesser area than the interposer; and
each sidewall of the molding compound die frame is vertically coincident with a respective sidewall of the interposer.

13. A semiconductor structure comprising:
an assembly including at least one semiconductor die and an interposer including interposer bonding pads comprising first interposer bonding pads and second interposer bonding pads;
a packaging substrate comprising substrate bonding pads;
an array of copper pillar structures disposed between the interposer and the packaging substrate;
an array of interposer-side solder material portions bonded to a respective one of the copper pillar structures and to a respective one of the first interposer bonding pads; and
an array of substrate-side solder material portions bonded to a respective one of the copper pillar structures and to a respective one of the substrate bonding pads,
wherein:
the assembly comprises two or more fan-out packages that are bonded to the interposer;
each of the two or more fan-out packages comprises a respective set of one or more semiconductor dies and a respective fan-out interposer;
each of the two or more fan-out packages is bonded to the interposer; and
the interposer has a greater area than a sum of all areas of the two or more fan-out packages.

14. The semiconductor structure of claim 13, wherein each of the copper pillar structures has a respective horizontal cross-sectional shape that is invariant under translation along a vertical direction that is perpendicular to a horizontal surface of the packaging substrate on which the substrate bonding pads are located.

15. The semiconductor structure of claim 13, wherein each of the copper pillar structures is bonded to a respective interposer bonding pad on the interposer and to a respective substrate bonding pad located on the packaging substrate.

16. The semiconductor structure of claim 13, wherein each of the copper pillar structures is bonded to the respective interposer bonding pad through a respective interposer-side solder material portion.

17. The semiconductor structure of claim 13, wherein each of the copper pillar structures is bonded to the respective substrate bonding pad through a respective substrate-side solder material portion.

18. The semiconductor structure of claim 1, wherein:
the assembly comprises two or more fan-out packages that are bonded to the interposer;
each of the two or more fan-out packages comprises a respective set of one or more semiconductor dies and a respective fan-out interposer;
each of the two or more fan-out packages is bonded to the interposer; and
the interposer has a greater area than a sum of all areas of the two or more fan-out packages.

19. The semiconductor structure of claim 1, wherein:
the packaging substrate is laterally surrounded by a molding compound die frame and has a lesser area than the interposer; and
each sidewall of the molding compound die frame is vertically coincident with a respective sidewall of the interposer.

20. The semiconductor structure of claim 1, wherein the at least one semiconductor die comprises a plurality of semiconductor dies.

* * * * *